(12) United States Patent (10) Patent No.: US 9,154,708 B1
Rivard et al. (45) Date of Patent: *Oct. 6, 2015

(54) IMAGE SENSOR APPARATUS AND METHOD FOR SIMULTANEOUSLY CAPTURING FLASH AND AMBIENT ILLUMINATED IMAGES

(71) Applicant: Duelight LLC, Sunnyvale, CA (US)

(72) Inventors: William Rivard, Menlo Park, CA (US); Adam Feder, Mountain View, CA (US); Brian Kindle, Sunnyvale, CA (US)

(73) Assignee: Duelight LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/535,274

(22) Filed: Nov. 6, 2014

(51) Int. Cl.
*H04N 5/235* (2006.01)
*H04N 5/243* (2006.01)
*H04N 5/3745* (2011.01)

(52) U.S. Cl.
CPC ........... *H04N 5/2355* (2013.01); *H04N 5/2352* (2013.01); *H04N 5/243* (2013.01); *H04N 5/37452* (2013.01)

(58) Field of Classification Search
CPC ... H04N 5/2355; H04N 5/243; H04N 5/2354; H04N 5/355; H04N 5/35536; H04N 5/3745; H04N 5/37452; H04N 5/2352
See application file for complete search history.

(56) References Cited

U.S. PATENT DOCUMENTS

| | | |
|---|---|---|
| 5,818,977 A | 10/1998 | Tansley |
| 6,243,430 B1 | 6/2001 | Mathe |
| 6,498,926 B1 | 12/2002 | Ciccarelli et al. |
| 7,256,381 B2 | 8/2007 | Asaba |
| 7,760,246 B2 | 7/2010 | Dalton et al. |
| 8,761,245 B2 | 6/2014 | Puri et al. |
| 8,976,264 B2 | 3/2015 | Rivard et al. |
| 2003/0015645 A1* | 1/2003 | Brickell et al. ............ 250/208.1 |
| 2003/0142745 A1* | 7/2003 | Osawa ..................... 375/240.03 |
| 2006/0050165 A1* | 3/2006 | Amano ......................... 348/320 |
| 2006/0245014 A1 | 11/2006 | Haneda |
| 2007/0025714 A1 | 2/2007 | Shiraki |
| 2007/0030357 A1 | 2/2007 | Levien et al. |
| 2007/0242900 A1 | 10/2007 | Chen et al. |
| 2008/0030592 A1 | 2/2008 | Border et al. |
| 2008/0158398 A1 | 7/2008 | Yaffe et al. |
| 2008/0192064 A1 | 8/2008 | Hong et al. |
| 2009/0066782 A1 | 3/2009 | Choi et al. |
| 2009/0153245 A1 | 6/2009 | Lee |
| 2009/0295941 A1 | 12/2009 | Nakajima et al. |
| 2010/0118204 A1 | 5/2010 | Proca et al. |
| 2010/0194851 A1 | 8/2010 | Pasupaleti et al. |

(Continued)

OTHER PUBLICATIONS

Non-Final Office Action from U.S. Appl. No. 13/573,252, dated Jul. 10, 2014.

(Continued)

*Primary Examiner* — Paul Berardesca
(74) *Attorney, Agent, or Firm* — Zilk-Kotab, PC

(57) ABSTRACT

A system, method, and computer program product are provided for simultaneously capturing flash and ambient illuminated images. In use, an ambient sample is stored based on an electrical signal from a photodiode of an image sensor. Also, a flash sample is stored based on the electrical signal from the photodiode of the image sensor. Further, a first value is output based on the ambient sample, and a second value is output based on the flash sample, for generating at least one image. Finally, at least one of the first value and the second value is amplified utilizing two or more gains.

14 Claims, 20 Drawing Sheets

(56) References Cited

U.S. PATENT DOCUMENTS

| | | |
|---|---|---|
| 2010/0208099 A1 | 8/2010 | Nomura |
| 2010/0302407 A1 | 12/2010 | Ayers et al. |
| 2011/0019051 A1 | 1/2011 | Yin et al. |
| 2011/0090385 A1* | 4/2011 | Aoyama et al. ............... 348/308 |
| 2011/0115971 A1 | 5/2011 | Furuya et al. |
| 2011/0134267 A1* | 6/2011 | Ohya ......................... 348/222.1 |
| 2011/0194618 A1 | 8/2011 | Gish et al. |
| 2011/0242334 A1* | 10/2011 | Wilburn et al. ............ 348/207.1 |
| 2011/0280541 A1 | 11/2011 | Lee |
| 2012/0002089 A1* | 1/2012 | Wang et al. .................... 348/297 |
| 2012/0033118 A1 | 2/2012 | Lee et al. |
| 2012/0069213 A1 | 3/2012 | Jannard et al. |
| 2012/0162465 A1 | 6/2012 | Culbert et al. |
| 2012/0262600 A1 | 10/2012 | Velarde et al. |
| 2012/0314100 A1 | 12/2012 | Frank |
| 2013/0107062 A1 | 5/2013 | Okazaki |
| 2013/0114894 A1 | 5/2013 | Yadav et al. |
| 2013/0147979 A1 | 6/2013 | McMahon et al. |
| 2013/0176458 A1 | 7/2013 | Van Dalen et al. |
| 2013/0223530 A1 | 8/2013 | Demos |
| 2013/0271631 A1 | 10/2013 | Tatsuzawa et al. |
| 2013/0279584 A1 | 10/2013 | Demos |
| 2013/0301729 A1 | 11/2013 | Demos |
| 2013/0335596 A1 | 12/2013 | Demandolx et al. |
| 2014/0098248 A1 | 4/2014 | Okazaki |
| 2014/0176757 A1 | 6/2014 | Rivard et al. |
| 2014/0211852 A1 | 7/2014 | Demos |
| 2014/0244858 A1 | 8/2014 | Okazaki |
| 2014/0247979 A1 | 9/2014 | Roffet et al. |
| 2014/0300795 A1 | 10/2014 | Bilcu et al. |
| 2015/0005637 A1 | 1/2015 | Stegman et al. |
| 2015/0092852 A1 | 4/2015 | Demos |
| 2015/0098651 A1 | 4/2015 | Rivard et al. |

OTHER PUBLICATIONS

Notice of Allowance from U.S. Appl. No. 13/573,252, dated Oct. 22, 2014.
Feder et al., U.S. Appl. No. 13/999,678, filed Mar. 14, 214.
Rivard, W. et al., U.S. Appl. No. 14/568,045, filed Dec. 11, 2014.
Restriction Requirement from U.S. Appl. No. 14/568,045, dated Jan. 15, 2015.
Rivard, W. et al., U.S. Appl. No. 14/534,068, filed Nov. 5, 2014.
Non-Final Office Action from U.S. Appl. No. 14/534,068, dated Feb. 17, 2015.
Rivard, W. et al., U.S. Appl. No. 14/534,079, filed Nov. 5, 2014.
Non-Final Office Action from U.S. Appl. No. 14/534,079, dated Jan. 29, 2015.
Rivard, W. et al., U.S. Appl. No. 14/534,089, filed Nov. 5, 2014.
Non-Final Office Action from U.S. Appl. No. 14/534,089, dated Feb. 25, 2015.
Rivard, W. et al., U.S. Appl. No. 14/535,279, filed Nov. 6, 2014.
Non-Final Office Action from U.S. Appl. No. 14/535,279, dated Feb. 5, 2015.
Rivard, W. et al., U.S. Appl. No. 14/535,282, filed Nov. 6, 2014.
Non-Final Office Action from U.S. Appl. No. 14/535,282, dated Jan. 30, 2015.
Non-Final Office Action from U.S. Appl. No. 14/536,524, dated Mar. 3, 2015.
Rivard, W. et al., U.S. Appl. No. 14/536,524, Nov. 7, 2014.
Notice of Allowance from U.S. Appl. No. 13/753,252, dated Oct. 22, 2014.
Non-Final Office Action from U.S. Appl. No. 14/568,045, dated Mar. 24, 2015.
Rivard, W. et al., U.S. Appl. No. 14/702,549, filed May 1, 2015.
Notice of Allowance from U.S. Appl. No. 14/534,079, dated May 11, 2015.
Notice of Allowance from U.S. Appl. No. 14/534,089, dated Jun. 23, 2015.
Notice of Allowance from U.S. Appl. No. 14/535,282, dated Jun. 23, 2015.
Notice of Allowance from U.S. Appl. No. 14/536,524, dated Jun. 29, 2015.
Notice of Allowance from U.S. Appl. No. 14/534,068, dated Jul. 29, 2015.

* cited by examiner

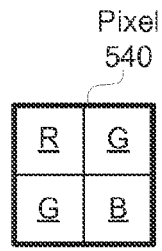
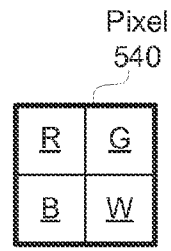
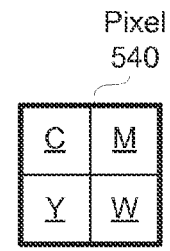
Figure 5B
Figure 5C
Figure 5D
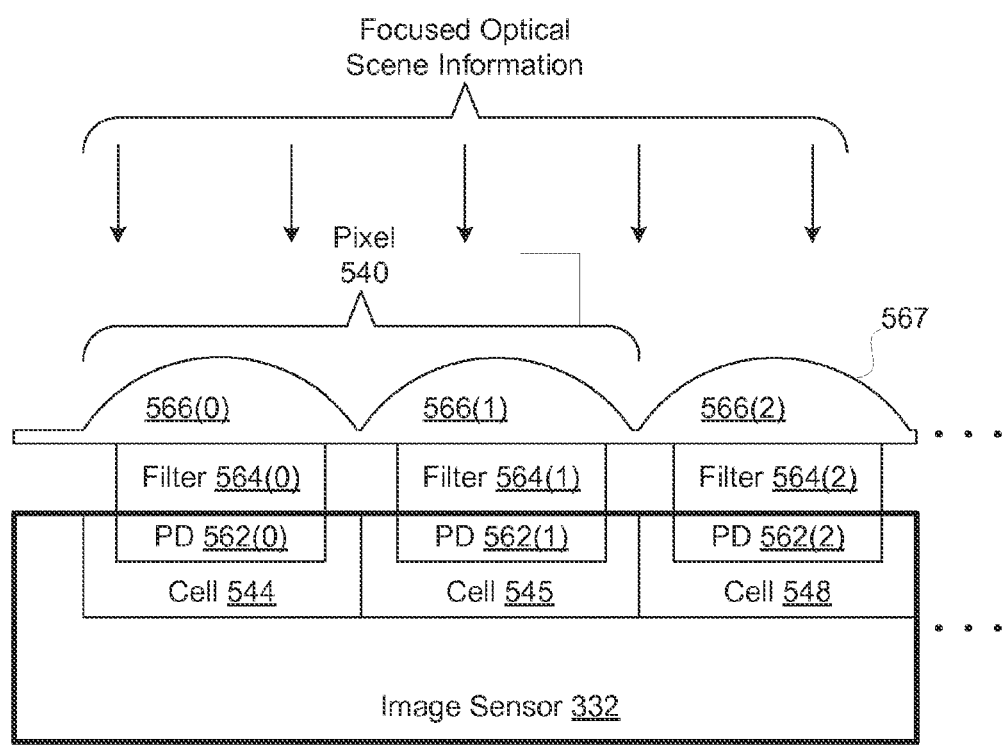
Figure 5E

IMAGE SENSOR APPARATUS AND METHOD FOR SIMULTANEOUSLY CAPTURING FLASH AND AMBIENT ILLUMINATED IMAGES

RELATED APPLICATIONS

This application is related to the following U.S. Patent Application, the entire disclosures being incorporated by reference herein: application Ser. No. 13/999,678, filed Mar. 14, 2014, entitled "SYSTEMS AND METHODS FOR DIGITAL IMAGE SENSOR"; application Ser. No. 14/534,068, filed Nov. 5, 2014, entitled "SYSTEMS AND METHODS FOR HIGH-DYNAMIC RANGE IMAGES"; application Ser. No. 14/534,079, filed Nov. 5, 2014, entitled "IMAGE SENSOR APPARATUS AND METHOD FOR OBTAINING MULTIPLE EXPOSURES WITH ZERO INTERFRAME TIME"; application Ser. No. 14/534,089, filed Nov. 5, 2014, entitled "IMAGE SENSOR APPARATUS AND METHOD FOR SIMULTANEOUSLY CAPTURING MULTIPLE IMAGES"; application Ser. No. 14/535,279, filed Nov. 6, 2014, entitled "IMAGE SENSOR APPARATUS AND METHOD FOR OBTAINING LOW-NOISE, HIGH-SPEED CAPTURES OF A PHOTOGRAPHIC SCENE"; and application Ser. No. 14/536,524, filed Nov. 7, 2014, entitled "SYSTEMS AND METHODS FOR GENERATING A HIGH-DYNAMIC RANGE (HDR) PIXEL STREAM."

FIELD OF THE INVENTION

The present invention relates to photographic systems, and more particularly to an image sensor apparatus and method for simultaneously capturing multiple images.

BACKGROUND

Traditional digital photography systems are inherently limited by the dynamic range of a capturing image sensor. One solution to such limitation is the use of high dynamic-range (HDR) photography. HDR photography involves capturing multiple exposures of a same scene, where each of the exposures is metered differently, and then merging the multiple captures to create an image with a larger dynamic range.

SUMMARY

A system, method, and computer program product are provided for simultaneously capturing flash and ambient illuminated images. In use, an ambient sample is stored based on an electrical signal from a photodiode of an image sensor. Also, a flash sample is stored based on the electrical signal from the photodiode of the image sensor. Further, a first value is output based on the ambient sample, and a second value is output based on the flash sample, for generating at least one image. Finally, at least one of the first value and the second value is amplified utilizing two or more gains. Additional systems, methods, and computer program products are also presented.

BRIEF DESCRIPTION OF THE DRAWINGS

FIGS. 5A-5E illustrate systems for converting optical scene information to an electronic representation of a photographic scene, in accordance with other embodiments.

DETAILED DESCRIPTION

Figure 1:
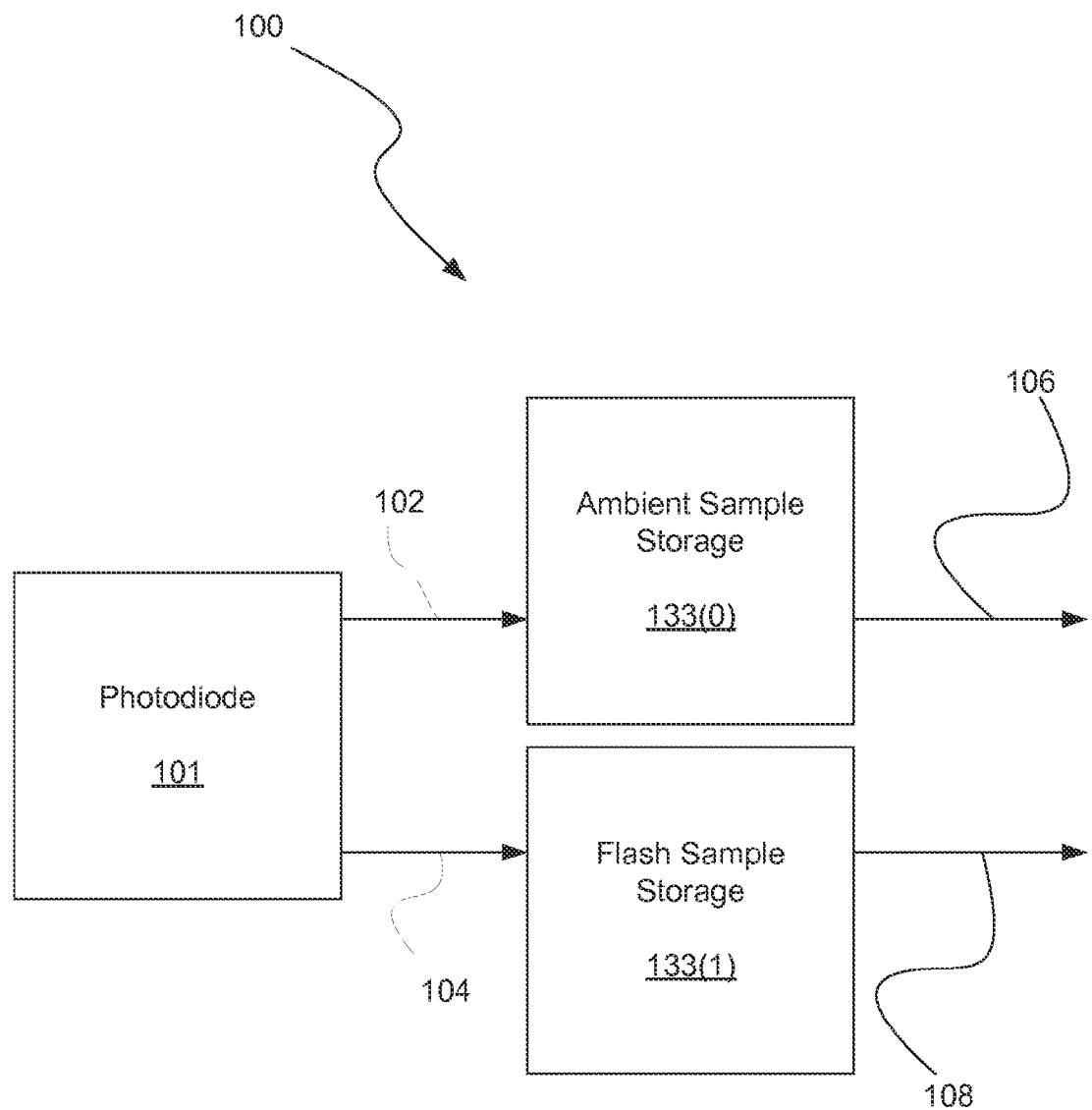
FIG. 1 illustrates an exemplary system for simultaneously capturing flash and ambient illuminated images, in accordance with an embodiment.

FIG. 1 illustrates a system 100 for capturing flash and ambient illuminated images, in accordance with one possible embodiment. As an option, the system 100 may be implemented in the context of any of the Figures disclosed herein. Of course, however, the system 100 may be implemented in any desired environment. Further, the aforementioned definitions may equally apply to the description below.

As shown in FIG. 1, the system 100 includes a first input 102 that is provided to an ambient sample storage node 133(0) based on a photodiode 101, and a second input 104 provided to a flash sample storage node 133(1) based on the photodiode 101. Based on the input 102 to the ambient sample storage node 133(0) and the input 104 to the flash sample storage node 133(1), an ambient sample is stored to the ambient sample storage node 133(0) sequentially, at least in part, with storage of a flash sample to the flash sample storage node 133(1). In one embodiment, simultaneous storage of the ambient sample and the flash sample includes storing the ambient sample and the second sample at least partially sequentially.

In one embodiment, the input 104 may be provided to the flash sample storage node 133(1) after the input 102 is provided to the ambient sample storage node 133(0). In such an embodiment, the process of storing the flash sample may occur after the process of storing the ambient sample. In other words, storing the ambient sample may occur during a first time duration, and storing the flash sample may occur during a second time duration that begins after the first time duration. The second time duration may begin nearly simultaneously with the conclusion of the first time duration.

While the following discussion describes an image sensor apparatus and method for simultaneously capturing multiple images using one or more photodiodes of an image sensor, any photo-sensing electrical element or photosensor may be used or implemented.

In one embodiment, the photodiode 101 may comprise any semiconductor diode that generates a potential difference, current, or changes its electrical resistance, in response to photon absorption. Accordingly, the photodiode 101 may be used to detect or measure a light intensity. Further, the input 102 and the input 104 received at sample storage nodes 133(0) and 133(1), respectively, may be based on the light intensity detected or measured by the photodiode 101. In such an embodiment, the ambient sample stored at the ambient sample storage node 133(0) may be based on a first exposure time to light at the photodiode 101, and the second sample stored at the flash sample storage node 133(1) may be based on a second exposure time to the light at the photodiode 101. The second exposure time may begin concurrently, or near concurrently, with the conclusion of the conclusion of the first exposure time.

In one embodiment, a rapid rise in scene illumination may occur after completion of the first exposure time, and during the second exposure time while input 104 is being received at the flash sample storage node 133(1). The rapid rise in scene illumination may be due to activation of a flash or strobe, or any other near instantaneous illumination. As a result of the rapid rise in scene illumination after the first exposure time, the light intensity detected or measured by the photodiode 101 during the second exposure time may be greater than the light intensity detected or measured by the photodiode 101 during the first exposure time. Accordingly, the second exposure time may be configured or selected based on an anticipated light intensity.

In one embodiment, the first input 102 may include an electrical signal from the photodiode 101 that is received at the ambient sample storage node 133(0), and the second input 104 may include an electrical signal from the photodiode 101 that is received at the flash sample storage node 133(1). For example, the first input 102 may include a current that is received at the ambient sample storage node 133(0), and the second input 104 may include a current that is received at the flash sample storage node 133(1). In another embodiment, the first input 102 and the second input 104 may be transmitted, at least partially, on a shared electrical interconnect. In other embodiments, the first input 102 and the second input 104 may be transmitted on different electrical interconnects. In some embodiments, the input 102 may include a first current, and the input 104 may include a second current that is different than the first current. The first current and the second current may each be a function of incident light intensity measured or detected by the photodiode 101. In yet other embodiments, the first input 102 may include any input from which the ambient sample storage node 133(0) may be operative to store an ambient sample, and the second input 104 may include any input from which the flash sample storage node 133(1) may be operative to store a flash sample.

In one embodiment, the first input 102 and the second input 104 may include an electronic representation of a portion of an optical image that has been focused on an image sensor that includes the photodiode 101. In such an embodiment, the optical image may be focused on the image sensor by a lens. The electronic representation of the optical image may comprise spatial color intensity information, which may include different color intensity samples (e.g. red, green, and blue light, etc.). In other embodiments, the spatial color intensity information may also include samples for white light. In one embodiment, the optical image may be an optical image of a photographic scene. In some embodiments, the photodiode 101 may be a single photodiode of an array of photodiodes of an image sensor. Such an image sensor may comprise a complementary metal oxide semiconductor (CMOS) image sensor, or charge-coupled device (CCD) image sensor, or any other technically feasible form of image sensor. In other embodiments, photodiode 101 may include two or more photodiodes.

In one embodiment, each sample storage node 133 includes a charge storing device for storing a sample, and the stored sample may be a function of a light intensity detected at the photodiode 101. For example, each sample storage node 133 may include a capacitor for storing a charge as a sample. In such an embodiment, each capacitor stores a charge that corresponds to an accumulated exposure during an exposure time or sample time. For example, current received at each capacitor from an associated photodiode may cause the capacitor, which has been previously charged, to discharge at a rate that is proportional to an incident light intensity detected at the photodiode. The remaining charge of each capacitor may be subsequently output from the capacitor as a value. For example, the remaining charge of each capacitor may be output as an analog value that is a function of the remaining charge on the capacitor.

To this end, an analog value received from a capacitor may be a function of an accumulated intensity of light detected at an associated photodiode. In some embodiments, each sample storage node 133 may include circuitry operable for receiving input based on a photodiode. For example, such circuitry may include one or more transistors. The one or more transistors may be configured for rendering the sample storage node 133 responsive to various control signals, such as sample, reset, and row select signals received from one or more controlling devices or components. In other embodiments, each sample storage node 133 may include any device for storing any sample or value that is a function of a light intensity detected at the photodiode 101.

Further, as shown in FIG. 1, the ambient sample storage node 133(0) outputs first value 106, and the flash sample storage node 133(1) outputs second value 108. In one embodiment, the ambient sample storage node 133(0) outputs the first value 106 based on the ambient sample stored at the ambient sample storage node 133(0), and the flash sample storage node 133(1) outputs the second value 108 based on the flash sample stored at the flash sample storage node 133(1). An ambient sample may include any value stored at an ambient sample storage node 133(0) due to input 102 from the photodiode 101 during an exposure time in which the photodiode 101 measures or detects ambient light. A flash sample may include any value stored at a flash storage node 133(1) due to input 104 from the photodiode 101 during an exposure time in which the photodiode 101 measures or detects flash or strobe illumination.

In some embodiments, the ambient sample storage node 133(0) outputs the first value 106 based on a charge stored at the ambient sample storage node 133(0), and the flash sample storage node 133(1) outputs the second value 108 based on a second charge stored at the flash sample storage node 133(1). The first value 106 may be output serially with the second value 108, such that one value is output prior to the other value; or the first value 106 may be output in parallel with the output of the second value 108. In various embodiments, the first value 106 may include a first analog value, and the second value 108 may include a second analog value. Each of these values may include a current, which may be output for inclusion in an analog signal that includes at least one analog value associated with each photodiode of a photodiode array. In such embodiments, the first analog value 106 may be included in an ambient analog signal, and the second analog value 108 may be included in a flash analog signal that is different than the ambient analog signal. In other words, an ambient analog signal may be generated to include an analog value associated with each photodiode of a photodiode array, and a flash analog signal may also be generated to include a different analog value associated with each of the photodiodes of the photodiode array. In such an embodiment, the analog values of the ambient analog signal would be sampled during a first exposure time in which the associated photodiodes were exposed to ambient light, and the analog values of the flash analog signal would be sampled during a second exposure time in which the associated photodiode were exposed to strobe or flash illumination.

To this end, a single photodiode array may be utilized to generate a plurality of analog signals. The plurality of analog signals may be generated concurrently or in parallel. Further, the plurality of analog signals may each be amplified utilizing two or more gains, and each amplified analog signal may converted to one or more digital signals such that two or more digital signals may be generated, where each digital signal may include a digital image. Accordingly, due to the contemporaneous storage of the ambient sample and the flash sample, a single photodiode array may be utilized to concurrently generate multiple digital signals or digital images, where at least one of the digital signals is associated with an ambient exposure photographic scene, and at least one of the digital signals is associated with a flash or strobe illuminated exposure of the same photographic scene. In such an embodiment, multiple digital signals having different exposure characteristics may be substantially simultaneously generated for a single photographic scene captured at ambient illumination. Such a collection of digital signals or digital images may be referred to as an ambient image stack. Further, multiple digital signals having different exposure characteristics may be substantially simultaneously generated for the single photographic scene captured with strobe or flash illumination. Such a collection of digital signals or digital images may be referred to as a flash image stack.

In certain embodiments, an analog signal comprises a plurality of distinct analog signals, and a signal amplifier comprises a corresponding set of distinct signal amplifier circuits. For example, each pixel within a row of pixels of an image sensor may have an associated distinct analog signal within an analog signal, and each distinct analog signal may have a corresponding distinct signal amplifier circuit. Further, two or more amplified analog signals may each include gain-adjusted analog pixel data representative of a common analog value from at least one pixel of an image sensor. For example, for a given pixel of an image sensor, a given analog value may be output in an analog signal, and then, after signal amplification operations, the given analog value is represented by a first amplified value in a first amplified analog signal, and by a second amplified value in a second amplified analog signal. Analog pixel data may be analog signal values associated with one or more given pixels.

In various embodiments, the digital images of the ambient image stack and the flash image stack may be combined or blended to generate one or more new blended images having a greater dynamic range than any of the individual images. Further, the digital images of the ambient image stack and the flash image stack may be combined or blended for controlling a flash contribution in the one or more new blended images.

Figure 2:
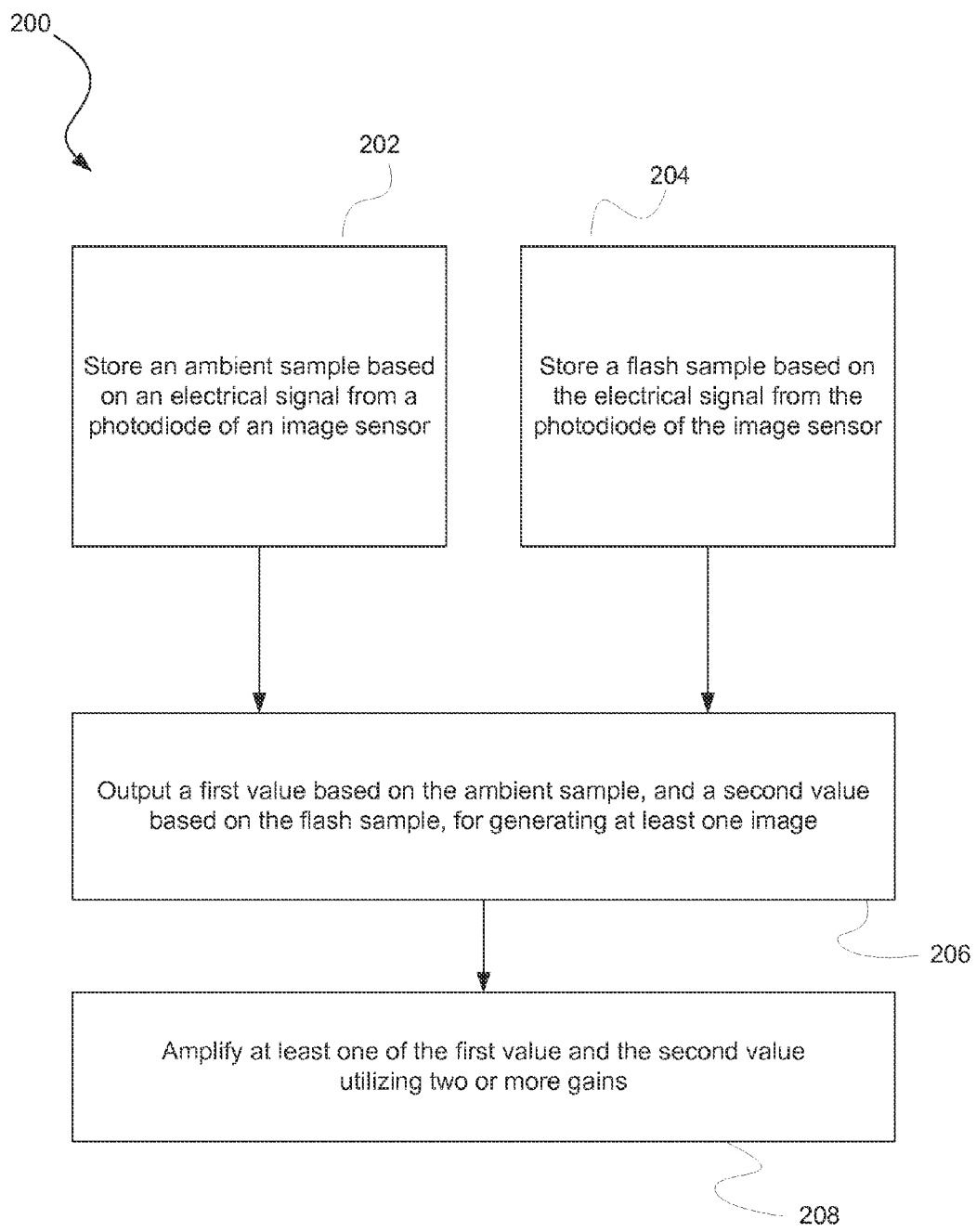
FIG. 2 illustrates an exemplary method carried out for simultaneously capturing flash and ambient illuminated images, in accordance with an embodiment.

FIG. 2 illustrates a method 200 for capturing flash and ambient illuminated images, in accordance with one embodiment. As an option, the method 200 may be carried out in the context of any of the Figures disclosed herein. Of course, however, the method 200 may be carried out in any desired environment. Further, the aforementioned definitions may equally apply to the description below.

As shown in operation 202, an ambient sample is stored based on an electrical signal from a photodiode of an image sensor. Further, sequentially, at least in part, with the storage of the ambient sample, a flash sample is stored based on the electrical signal from the photodiode of the image sensor at operation 204. As noted above, the photodiode of the image sensor may comprise any semiconductor diode that generates a potential difference, or changes its electrical resistance, in response to photon absorption. Accordingly, the photodiode may be used to detect or measure light intensity, and the electrical signal from the photodiode may include a photodiode current that varies as a function of the light intensity.

In some embodiments, each sample may include an electronic representation of a portion of an optical image that has been focused on an image sensor that includes the photodiode. In such an embodiment, the optical image may be focused on the image sensor by a lens. The electronic representation of the optical image may comprise spatial color intensity information, which may include different color intensity samples (e.g. red, green, and blue light, etc.). In other embodiments, the spatial color intensity information may also include samples for white light. In one embodiment, the optical image may be an optical image of a photographic scene. The photodiode may be a single photodiode of an array of photodiodes of the image sensor. Such an image sensor may comprise a complementary metal oxide semiconductor (CMOS) image sensor, or charge-coupled device (CCD) image sensor, or any other technically feasible form of image sensor In the context of one embodiment, each of the samples may be stored by storing energy. For example, each of the samples may include a charged stored on a capacitor. In such an embodiment, the ambient sample may include a first charge stored at a first capacitor, and the flash sample may include a second charge stored at a second capacitor. In one embodiment, the ambient sample may be different than the flash sample. For example, the ambient sample may include a first charge stored at a first capacitor, and the flash sample may include a second charge stored at a second capacitor that is different than the first charge.

In one embodiment, the ambient sample may be different than the flash sample due to being sampled at different sample times. For example, the ambient sample may be stored by charging or discharging a first capacitor during a first sample time, and the flash sample may be stored by charging or discharging a second capacitor during a second sample time, where the first capacitor and the second capacitor may be substantially identical and charged or discharged at a substantially identical rate for a given photodiode current. The second sample time may be contemporaneously, or near contemporaneously, with a conclusion of the first sample time, such that the second capacitor may be charged or discharged after the charging or discharging of the first capacitor has completed.

In another embodiment, the ambient sample may be different than the flash sample due to, at least partially, different storage characteristics. For example, the ambient sample may be stored by charging or discharging a first capacitor for a period of time, and the flash sample may be stored by charging or discharging a second capacitor for the same period of time, where the first capacitor and the second capacitor may have different storage characteristics and/or be charged or discharged at different rates. More specifically, the first capacitor may have a different capacitance than the second capacitor.

In another embodiment, the ambient sample may be different than the flash sample due to a flash or strobe illumination that occurs during the second exposure time, and that provides different illumination characteristics than the ambient illumination of the first exposure time. For example, the ambient sample may be stored by charging or discharging a first capacitor for a period of time of ambient illumination, and the flash sample may be stored by charging or discharging a second capacitor for a period of time of flash illumination. Due to the differences in illumination between the first exposure time and the second exposure time, the second capacitor may be charged or discharged faster than the first capacitor due to the increased light intensity associated with the flash illumination of the second exposure time.

Additionally, as shown at operation 206, after storage of the ambient sample and the flash sample, a first value is output based on the ambient sample, and a second value is output based on the flash sample, for generating at least one image. In the context of one embodiment, the first value and the second value are transmitted or output in sequence. For example, the first value may be transmitted prior to the second value. In another embodiment, the first value and the second value may be transmitted in parallel.

In one embodiment, each output value may comprise an analog value. For example, each output value may include a current representative of the associated stored sample, such as an ambient sample or a flash sample. More specifically, the first value may include a current value representative of the stored ambient sample, and the second value may include a current value representative of the stored flash sample. In one embodiment, the first value is output for inclusion in an ambient analog signal, and the second value is output for inclusion in a flash analog signal different than the ambient analog signal. Further, each value may be output in a manner such that it is combined with other values output based on other stored samples, where the other stored samples are stored responsive to other electrical signals received from other photodiodes of an image sensor. For example, the first value may be combined in an ambient analog signal with values output based on other ambient samples, where the other ambient samples were stored based on electrical signals received from photodiodes that neighbor the photodiode from which the electrical signal utilized for storing the ambient sample was received. Similarly, the second value may be combined in a flash analog signal with values output based on other flash samples, where the other flash samples were stored based on electrical signals received from the same photodiodes that neighbor the photodiode from which the electrical signal utilized for storing the flash sample was received.

Finally, at operation 208, at least one of the first value and the second value are amplified utilizing two or more gains. In one embodiment, where each output value comprises an analog value, amplifying at least one of the first value and the second value may result in at least two amplified analog values. In another embodiment, where the first value is output for inclusion in an ambient analog signal, and the second value is output for inclusion in a flash analog signal different than the ambient analog signal, one of the ambient analog signal or the flash analog signal may be amplified utilizing two or more gains each. For example, an ambient analog signal that includes the first value may be amplified with a first gain and a second gain, such that the first value is amplified with the first gain and the second gain. Amplifying the ambient analog signal with the first gain may result in a first amplified ambient analog signal, and amplifying the ambient analog signal with the second gain may result in a second amplified ambient analog signal. Of course, more than two analog signals may be amplified using two or more gains. In one embodiment, each amplified analog signal may be converted to a digital signal comprising a digital image.

To this end, an array of photodiodes may be utilized to generate an ambient analog signal based on a set of ambient samples captured at a first exposure time or sample time and illuminated with ambient light, and a flash analog signal based on a set of flash samples captured at a second exposure time or sample time and illuminated with flash or strobe illumination, where the set of ambient samples and the set of flash samples may be two different sets of samples of the same photographic scene. Further, each analog signal may include an analog value generated based on each photodiode of each pixel of an image sensor. Each analog value may be representative of a light intensity measured at the photodiode associated with the analog value. Accordingly, an analog signal may be a set of spatially discrete intensity samples, each represented by continuous analog values, and analog pixel data may be analog signal values associated with one or more given pixels. Still further, each analog signal may undergo subsequent processing, such as amplification, which may facilitate conversion of the analog signal into one or more digital signals, each including digital pixel data, which may each comprise a digital image.

The embodiments disclosed herein may advantageously enable a camera module to sample images comprising an image stack with lower (e.g. at or near zero, etc.) inter-sample time (e.g. interframe, etc.) than conventional techniques. In certain embodiments, images comprising an analog image stack or a flash image stack are effectively sampled or captured simultaneously, or near simultaneously, which may reduce inter-sample time to zero. In other embodiments, the camera module may sample images in coordination with the strobe unit to reduce inter-sample time between an image sampled without strobe illumination and an image sampled with strobe illumination.

More illustrative information will now be set forth regarding various optional architectures and uses in which the foregoing method may or may not be implemented, per the desires of the user. It should be strongly noted that the following information is set forth for illustrative purposes and should not be construed as limiting in any manner. Any of the following features may be optionally incorporated with or without the exclusion of other features described.

Figure 3A:
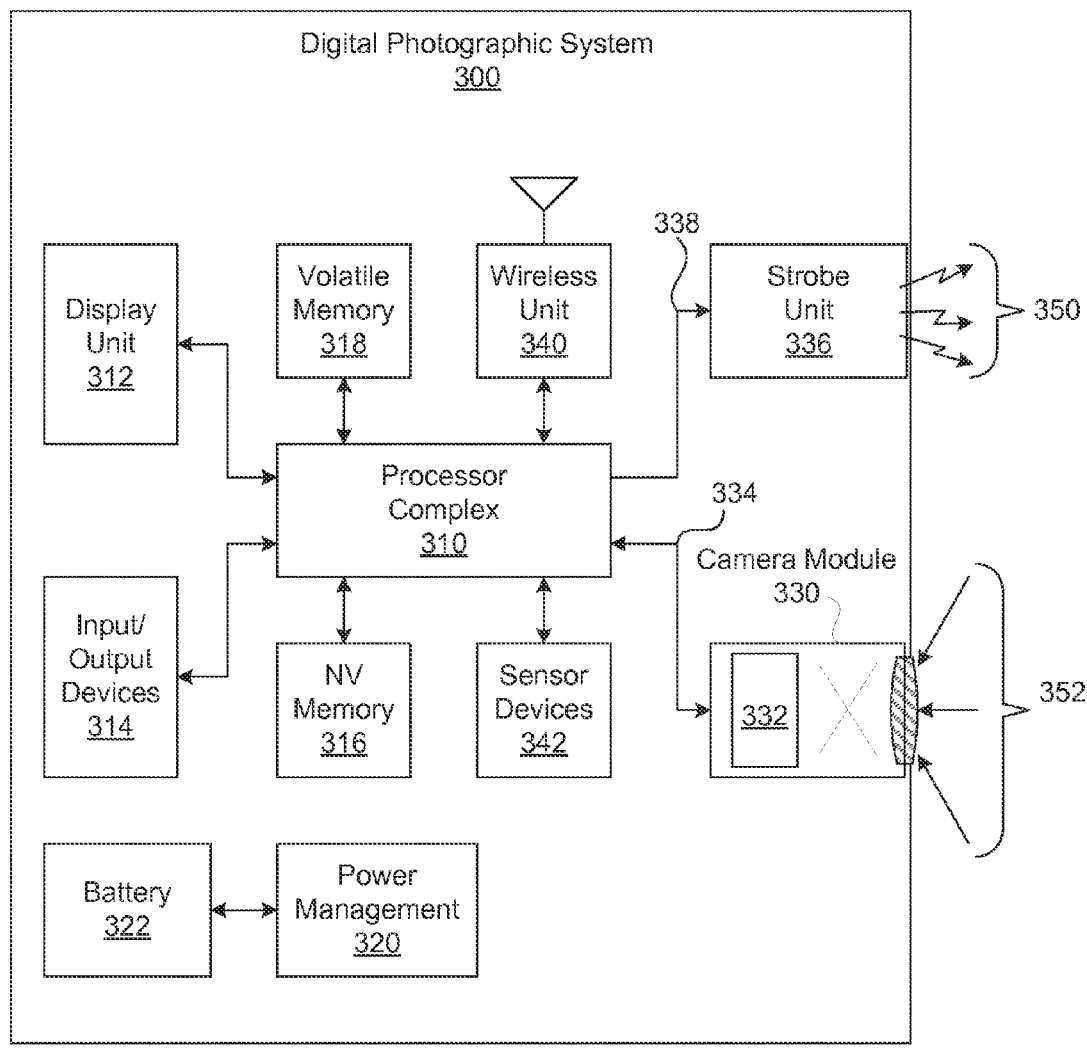
FIG. 3A illustrates a digital photographic system configured to simultaneously capture flash and ambient illuminated images, in accordance with an embodiment.

FIG. 3A illustrates a digital photographic system 300, in accordance with one embodiment. As an option, the digital photographic system 300 may be implemented in the context of the details of any of the Figures disclosed herein. Of course, however, the digital photographic system 300 may be implemented in any desired environment. Further, the aforementioned definitions may equally apply to the description below.

As shown, the digital photographic system 300 may include a processor complex 310 coupled to a camera module 330 via an interconnect 334. In one embodiment, the processor complex 310 is coupled to a strobe unit 336. The digital photographic system 300 may also include, without limitation, a display unit 312, a set of input/output devices 314, non-volatile memory 316, volatile memory 318, a wireless unit 340, and sensor devices 342, each coupled to the processor complex 310. In one embodiment, a power management subsystem 320 is configured to generate appropriate power supply voltages for each electrical load element within the digital photographic system 300. A battery 322 may be configured to supply electrical energy to the power management subsystem 320. The battery 322 may implement any technically feasible energy storage system, including primary or rechargeable battery technologies. Of course, in other embodiments, additional or fewer features, units, devices, sensors, or subsystems may be included in the system.

In one embodiment, a strobe unit 336 may be integrated into the digital photographic system 300 and configured to provide strobe illumination 350 during an image sample event performed by the digital photographic system 300. In another embodiment, a strobe unit 336 may be implemented as an independent device from the digital photographic system 300 and configured to provide strobe illumination 350 during an image sample event performed by the digital photographic system 300. The strobe unit 336 may comprise one or more LED devices, a gas-discharge illuminator (e.g. a Xenon strobe device, a Xenon flash lamp, etc.), or any other technically feasible illumination device. In certain embodiments, two or more strobe units are configured to synchronously generate strobe illumination in conjunction with sampling an image. In one embodiment, the strobe unit 336 is controlled through a strobe control signal 338 to either emit the strobe illumination 350 or not emit the strobe illumination 350. The strobe control signal 338 may be implemented using any technically feasible signal transmission protocol. The strobe control signal 338 may indicate a strobe parameter (e.g. strobe intensity, strobe color, strobe time, etc.), for directing the strobe unit 336 to generate a specified intensity and/or color of the strobe illumination 350. The strobe control signal 338 may be generated by the processor complex 310, the camera module 330, or by any other technically feasible combination thereof. In one embodiment, the strobe control signal 338 is generated by a camera interface unit within the processor complex 310 and transmitted to both the strobe unit 336 and the camera module 330 via the interconnect 334. In another embodiment, the strobe control signal 338 is generated by the camera module 330 and transmitted to the strobe unit 336 via the interconnect 334.

Optical scene information 352, which may include at least a portion of the strobe illumination 350 reflected from objects in the photographic scene, is focused as an optical image onto an image sensor 332 within the camera module 330. The image sensor 332 generates an electronic representation of the optical image. The electronic representation comprises spatial color intensity information, which may include different color intensity samples (e.g. red, green, and blue light, etc.). In other embodiments, the spatial color intensity information may also include samples for white light. The electronic representation is transmitted to the processor complex 310 via the interconnect 334, which may implement any technically feasible signal transmission protocol.

In one embodiment, input/output devices 314 may include, without limitation, a capacitive touch input surface, a resistive tablet input surface, one or more buttons, one or more knobs, light-emitting devices, light detecting devices, sound emitting devices, sound detecting devices, or any other technically feasible device for receiving user input and converting the input to electrical signals, or converting electrical signals into a physical signal. In one embodiment, the input/output devices 314 include a capacitive touch input surface coupled to a display unit 312. A touch entry display system may include the display unit 312 and a capacitive touch input surface, also coupled to processor complex 310.

Additionally, in other embodiments, non-volatile (NV) memory 316 is configured to store data when power is interrupted. In one embodiment, the NV memory 316 comprises one or more flash memory devices (e.g. ROM, PCM, FeRAM, FRAM, PRAM, MRAM, NRAM, etc.). The NV memory 316 comprises a non-transitory computer-readable medium, which may be configured to include programming instructions for execution by one or more processing units within the processor complex 310. The programming instructions may implement, without limitation, an operating system (OS), UI software modules, image processing and storage software modules, one or more input/output devices 314 connected to the processor complex 310, one or more software modules for sampling an image stack through camera module 330, one or more software modules for presenting the image stack or one or more synthetic images generated from the image stack through the display unit 312. As an example, in one embodiment, the programming instructions may also implement one or more software modules for merging images or portions of images within the image stack, aligning at least portions of each image within the image stack, or a combination thereof. In another embodiment, the processor complex 310 may be configured to execute the programming instructions, which may implement one or more software modules operable to create a high dynamic range (HDR) image.

Still yet, in one embodiment, one or more memory devices comprising the NV memory 316 may be packaged as a module configured to be installed or removed by a user. In one embodiment, volatile memory 318 comprises dynamic random access memory (DRAM) configured to temporarily store programming instructions, image data such as data associated with an image stack, and the like, accessed during the course of normal operation of the digital photographic system 300. Of course, the volatile memory may be used in any manner and in association with any other input/output device 314 or sensor device 342 attached to the process complex 310.

In one embodiment, sensor devices 342 may include, without limitation, one or more of an accelerometer to detect motion and/or orientation, an electronic gyroscope to detect motion and/or orientation, a magnetic flux detector to detect orientation, a global positioning system (GPS) module to detect geographic position, or any combination thereof. Of course, other sensors, including but not limited to a motion detection sensor, a proximity sensor, an RGB light sensor, a gesture sensor, a 3-D input image sensor, a pressure sensor, and an indoor position sensor, may be integrated as sensor devices. In one embodiment, the sensor devices may be one example of input/output devices 314.

Wireless unit 340 may include one or more digital radios configured to send and receive digital data. In particular, the wireless unit 340 may implement wireless standards (e.g. WiFi, Bluetooth, NFC, etc.), and may implement digital cellular telephony standards for data communication (e.g.

CDMA, 3G, 4G, LTE, LTE-Advanced, etc.). Of course, any wireless standard or digital cellular telephony standards may be used.

In one embodiment, the digital photographic system 300 is configured to transmit one or more digital photographs to a network-based (online) or "cloud-based" photographic media service via the wireless unit 340. The one or more digital photographs may reside within either the NV memory 316 or the volatile memory 318, or any other memory device associated with the processor complex 310. In one embodiment, a user may possess credentials to access an online photographic media service and to transmit one or more digital photographs for storage to, retrieval from, and presentation by the online photographic media service. The credentials may be stored or generated within the digital photographic system 300 prior to transmission of the digital photographs. The online photographic media service may comprise a social networking service, photograph sharing service, or any other network-based service that provides storage of digital photographs, processing of digital photographs, transmission of digital photographs, sharing of digital photographs, or any combination thereof. In certain embodiments, one or more digital photographs are generated by the online photographic media service based on image data (e.g. image stack, HDR image stack, image package, etc.) transmitted to servers associated with the online photographic media service. In such embodiments, a user may upload one or more source images from the digital photographic system 300 for processing by the online photographic media service.

In one embodiment, the digital photographic system 300 comprises at least one instance of a camera module 330. In another embodiment, the digital photographic system 300 comprises a plurality of camera modules 330. Such an embodiment may also include at least one strobe unit 336 configured to illuminate a photographic scene, sampled as multiple views by the plurality of camera modules 330. The plurality of camera modules 330 may be configured to sample a wide angle view (e.g., greater than forty-five degrees of sweep among cameras) to generate a panoramic photograph. In one embodiment, a plurality of camera modules 330 may be configured to sample two or more narrow angle views (e.g., less than forty-five degrees of sweep among cameras) to generate a stereoscopic photograph. In other embodiments, a plurality of camera modules 330 may be configured to generate a 3-D image or to otherwise display a depth perspective (e.g. a z-component, etc.) as shown on the display unit 312 or any other display device.

In one embodiment, a display unit 312 may be configured to display a two-dimensional array of pixels to form an image for display. The display unit 312 may comprise a liquid-crystal (LCD) display, a light-emitting diode (LED) display, an organic LED display, or any other technically feasible type of display. In certain embodiments, the display unit 312 may be able to display a narrower dynamic range of image intensity values than a complete range of intensity values sampled from a photographic scene, such as within a single HDR image or over a set of two or more images comprising a multiple exposure or HDR image stack. In one embodiment, images comprising an image stack may be merged according to any technically feasible HDR blending technique to generate a synthetic image for display within dynamic range constraints of the display unit 312. In one embodiment, the limited dynamic range may specify an eight-bit per color channel binary representation of corresponding color intensities. In other embodiments, the limited dynamic range may specify more than eight-bits (e.g., 10 bits, 12 bits, or 14 bits, etc.) per color channel binary representation.

Figure 3B:
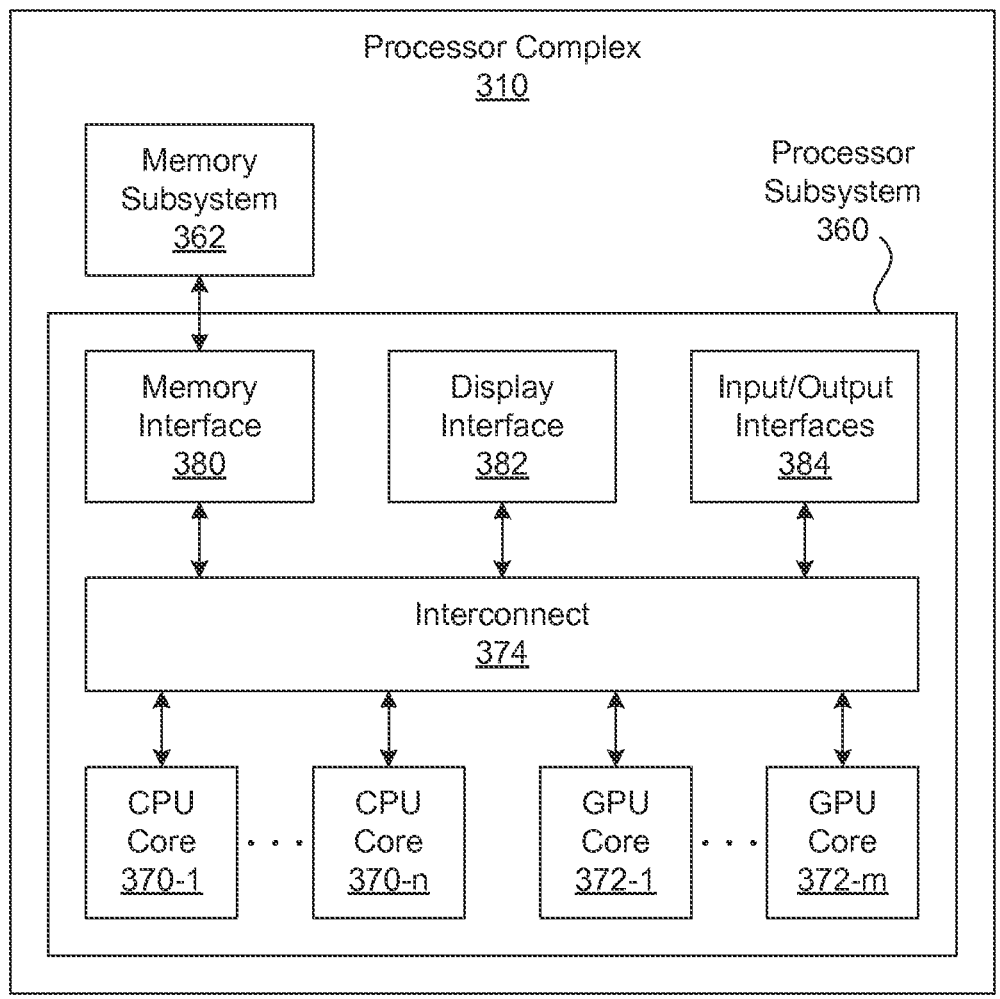
FIG. 3B illustrates a processor complex within a digital photographic system, according to one embodiment.

FIG. 3B illustrates a processor complex 310 within the digital photographic system 300 of FIG. 3A, in accordance with one embodiment. As an option, the processor complex 310 may be implemented in the context of the details of any of the Figures disclosed herein. Of course, however, the processor complex 310 may be implemented in any desired environment. Further, the aforementioned definitions may equally apply to the description below.

As shown, the processor complex 310 includes a processor subsystem 360 and may include a memory subsystem 362. In one embodiment, processor complex 310 may comprise a system on a chip (SoC) device that implements processor subsystem 360, and memory subsystem 362 comprises one or more DRAM devices coupled to the processor subsystem 360. In another embodiment, the processor complex 310 may comprise a multi-chip module (MCM) encapsulating the SoC device and the one or more DRAM devices comprising the memory subsystem 362.

The processor subsystem 360 may include, without limitation, one or more central processing unit (CPU) cores 370, a memory interface 380, input/output interfaces unit 384, and a display interface unit 382, each coupled to an interconnect 374. The one or more CPU cores 370 may be configured to execute instructions residing within the memory subsystem 362, volatile memory 318, NV memory 316, or any combination thereof. Each of the one or more CPU cores 370 may be configured to retrieve and store data through interconnect 374 and the memory interface 380. In one embodiment, each of the one or more CPU cores 370 may include a data cache, and an instruction cache. Additionally, two or more of the CPU cores 370 may share a data cache, an instruction cache, or any combination thereof. In one embodiment, a cache hierarchy is implemented to provide each CPU core 370 with a private cache layer, and a shared cache layer.

In some embodiments, processor subsystem 360 may include one or more graphics processing unit (GPU) cores 372. Each GPU core 372 may comprise a plurality of multi-threaded execution units that may be programmed to implement, without limitation, graphics acceleration functions. In various embodiments, the GPU cores 372 may be configured to execute multiple thread programs according to well-known standards (e.g. OpenGL™, WebGL™, OpenCL™, CUDA™, etc.), and/or any other programmable rendering graphic standard. In certain embodiments, at least one GPU core 372 implements at least a portion of a motion estimation function, such as a well-known Harris detector or a well-known Hessian-Laplace detector. Such a motion estimation function may be used at least in part to align images or portions of images within an image stack. For example, in one embodiment, an HDR image may be compiled based on an image stack, where two or more images are first aligned prior to compiling the HDR image.

As shown, the interconnect 374 is configured to transmit data between and among the memory interface 380, the display interface unit 382, the input/output interfaces unit 384, the CPU cores 370, and the GPU cores 372. In various embodiments, the interconnect 374 may implement one or more buses, one or more rings, a cross-bar, a mesh, or any other technically feasible data transmission structure or technique. The memory interface 380 is configured to couple the memory subsystem 362 to the interconnect 374. The memory interface 380 may also couple NV memory 316, volatile memory 318, or any combination thereof to the interconnect 374. The display interface unit 382 may be configured to couple a display unit 312 to the interconnect 374. The display interface unit 382 may implement certain frame buffer functions (e.g. frame refresh, etc.). Alternatively, in another embodiment, the display unit 312 may implement certain frame buffer functions (e.g. frame refresh, etc.). The input/output interfaces unit 384 may be configured to couple various input/output devices to the interconnect 374.

In certain embodiments, a camera module 330 is configured to store exposure parameters for sampling each image associated with an image stack. For example, in one embodiment, when directed to sample a photographic scene, the camera module 330 may sample a set of images comprising the image stack according to stored exposure parameters. A software module comprising programming instructions executing within a processor complex 310 may generate and store the exposure parameters prior to directing the camera module 330 to sample the image stack. In other embodiments, the camera module 330 may be used to meter an image or an image stack, and the software module comprising programming instructions executing within a processor complex 310 may generate and store metering parameters prior to directing the camera module 330 to capture the image. Of course, the camera module 330 may be used in any manner in combination with the processor complex 310.

In one embodiment, exposure parameters associated with images comprising the image stack may be stored within an exposure parameter data structure that includes exposure parameters for one or more images. In another embodiment, a camera interface unit (not shown in FIG. 3B) within the processor complex 310 may be configured to read exposure parameters from the exposure parameter data structure and to transmit associated exposure parameters to the camera module 330 in preparation of sampling a photographic scene. After the camera module 330 is configured according to the exposure parameters, the camera interface may direct the camera module 330 to sample the photographic scene; the camera module 330 may then generate a corresponding image stack. The exposure parameter data structure may be stored within the camera interface unit, a memory circuit within the processor complex 310, volatile memory 318, NV memory 316, the camera module 330, or within any other technically feasible memory circuit. Further, in another embodiment, a software module executing within processor complex 310 may generate and store the exposure parameter data structure.

Figure 3C:
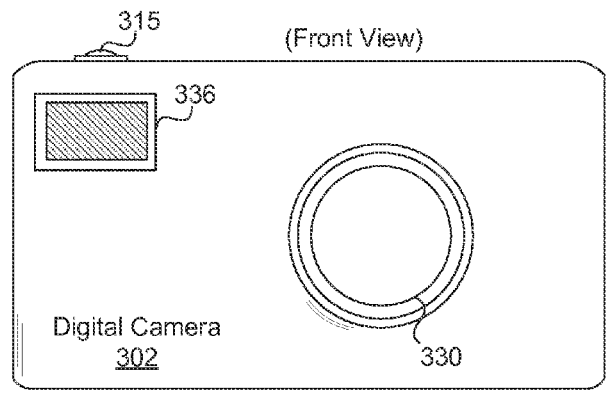
FIG. 3C illustrates a digital camera, in accordance with an embodiment.

FIG. 3C illustrates a digital camera 302, in accordance with one embodiment. As an option, the digital camera 302 may be implemented in the context of the details of any of the Figures disclosed herein. Of course, however, the digital camera 302 may be implemented in any desired environment. Further, the aforementioned definitions may equally apply to the description below.

In one embodiment, the digital camera 302 may be configured to include a digital photographic system, such as digital photographic system 300 of FIG. 3A. As shown, the digital camera 302 includes a camera module 330, which may include optical elements configured to focus optical scene information representing a photographic scene onto an image sensor, which may be configured to convert the optical scene information to an electronic representation of the photographic scene.

Additionally, the digital camera 302 may include a strobe unit 336, and may include a shutter release button 315 for triggering a photographic sample event, whereby digital camera 302 samples one or more images comprising the electronic representation. In other embodiments, any other technically feasible shutter release mechanism may trigger the photographic sample event (e.g. such as a timer trigger or remote control trigger, etc.).

Figure 3D:
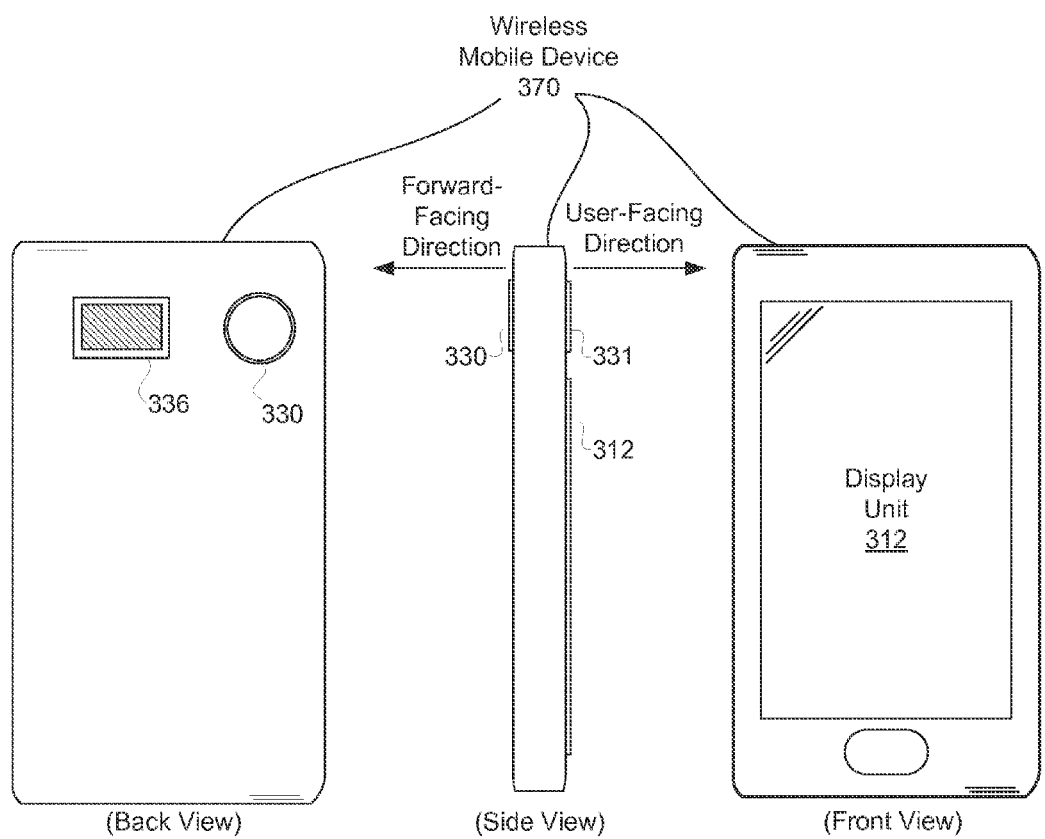
FIG. 3D illustrates a wireless mobile device, in accordance with another embodiment.

FIG. 3D illustrates a wireless mobile device 376, in accordance with one embodiment. As an option, the mobile device 376 may be implemented in the context of the details of any of the Figures disclosed herein. Of course, however, the mobile device 376 may be implemented in any desired environment. Further, the aforementioned definitions may equally apply to the description below.

In one embodiment, the mobile device 376 may be configured to include a digital photographic system (e.g. such as digital photographic system 300 of FIG. 3A), which is configured to sample a photographic scene. In various embodiments, a camera module 330 may include optical elements configured to focus optical scene information representing the photographic scene onto an image sensor, which may be configured to convert the optical scene information to an electronic representation of the photographic scene. Further, a shutter release command may be generated through any technically feasible mechanism, such as a virtual button, which may be activated by a touch gesture on a touch entry display system comprising display unit 312, or a physical button, which may be located on any face or surface of the mobile device 376. Of course, in other embodiments, any number of other buttons, external inputs/outputs, or digital inputs/outputs may be included on the mobile device 376, and which may be used in conjunction with the camera module 330.

As shown, in one embodiment, a touch entry display system comprising display unit 312 is disposed on the opposite side of mobile device 376 from camera module 330. In certain embodiments, the mobile device 376 includes a user-facing camera module 331 and may include a user-facing strobe unit (not shown). Of course, in other embodiments, the mobile device 376 may include any number of user-facing camera modules or rear-facing camera modules, as well as any number of user-facing strobe units or rear-facing strobe units.

In some embodiments, the digital camera 302 and the mobile device 376 may each generate and store a synthetic image based on an image stack sampled by camera module 330. The image stack may include one or more images sampled under ambient lighting conditions, one or more images sampled under strobe illumination from strobe unit 336, or a combination thereof.

Figure 3E:
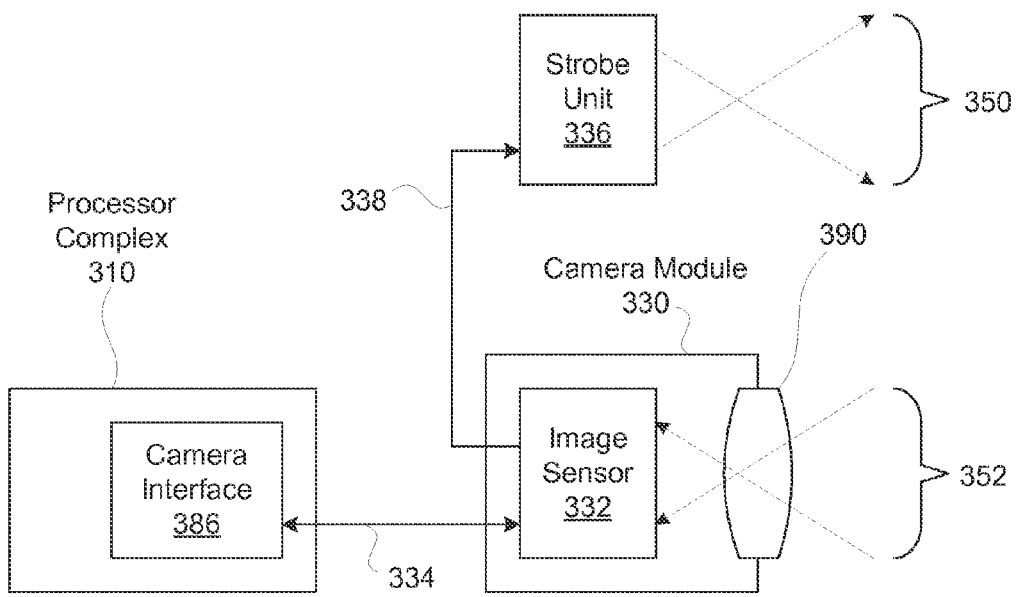
FIG. 3E illustrates a camera module configured to sample an image, according to one embodiment.

FIG. 3E illustrates camera module 330, in accordance with one embodiment. As an option, the camera module 330 may be implemented in the context of the details of any of the Figures disclosed herein. Of course, however, the camera module 330 may be implemented in any desired environment. Further, the aforementioned definitions may equally apply to the description below.

In one embodiment, the camera module 330 may be configured to control strobe unit 336 through strobe control signal 338. As shown, a lens 390 is configured to focus optical scene information 352 onto image sensor 332 to be sampled. In one embodiment, image sensor 332 advantageously controls detailed timing of the strobe unit 336 though the strobe control signal 338 to reduce inter-sample time between an image sampled with the strobe unit 336 enabled, and an image sampled with the strobe unit 336 disabled. For example, the image sensor 332 may enable the strobe unit 336 to emit strobe illumination 350 less than one microsecond (or any desired length) after image sensor 332 completes an exposure time associated with sampling an ambient image and prior to sampling a strobe image.

In other embodiments, the strobe illumination 350 may be configured based on a desired one or more target points. For example, in one embodiment, the strobe illumination 350 may light up an object in the foreground, and depending on the length of exposure time, may also light up an object in the background of the image. In one embodiment, once the strobe unit 336 is enabled, the image sensor 332 may then immediately begin exposing a strobe image. The image sensor 332 may thus be able to directly control sampling operations, including enabling and disabling the strobe unit 336 associated with generating an image stack, which may comprise at least one image sampled with the strobe unit 336 disabled, and at least one image sampled with the strobe unit 336 either enabled or disabled. In one embodiment, data comprising the image stack sampled by the image sensor 332 is transmitted via interconnect 334 to a camera interface unit 386 within processor complex 310. In some embodiments, the camera module 330 may include an image sensor controller, which may be configured to generate the strobe control signal 338 in conjunction with controlling operation of the image sensor 332.

Figure 3F:
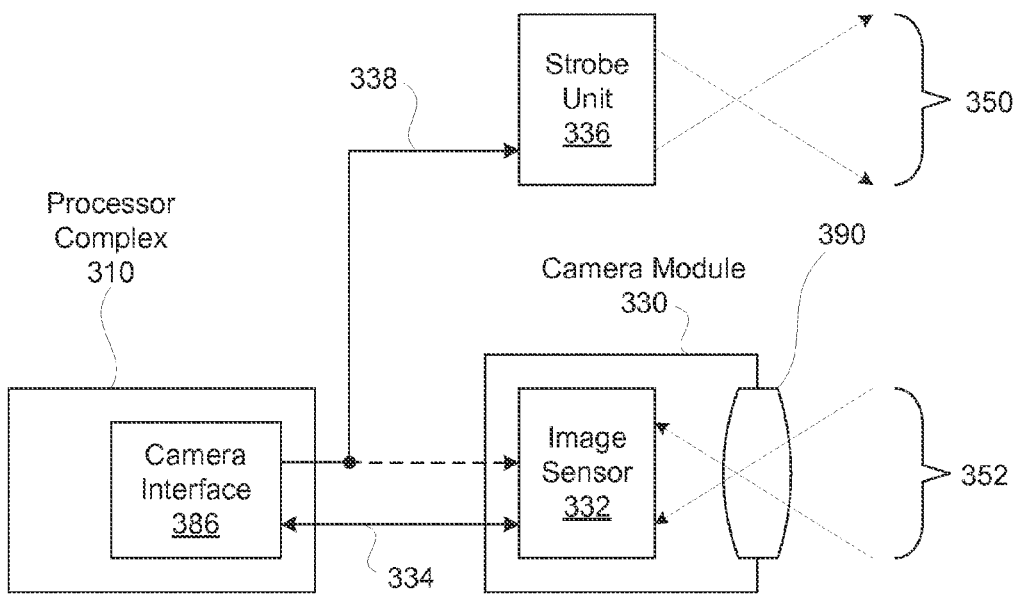
FIG. 3F illustrates a camera module configured to sample an image, according to another embodiment.

FIG. 3F illustrates a camera module 330, in accordance with one embodiment. As an option, the camera module 330 may be implemented in the context of the details of any of the Figures disclosed herein. Of course, however, the camera module 330 may be implemented in any desired environment. Further, the aforementioned definitions may equally apply to the description below.

In one embodiment, the camera module 330 may be configured to sample an image based on state information for strobe unit 336. The state information may include, without limitation, one or more strobe parameters (e.g. strobe intensity, strobe color, strobe time, etc.), for directing the strobe unit 336 to generate a specified intensity and/or color of the strobe illumination 350. In one embodiment, commands for configuring the state information associated with the strobe unit 336 may be transmitted through a strobe control signal 338, which may be monitored by the camera module 330 to detect when the strobe unit 336 is enabled. For example, in one embodiment, the camera module 330 may detect when the strobe unit 336 is enabled or disabled within a microsecond or less of the strobe unit 336 being enabled or disabled by the strobe control signal 338. To sample an image requiring strobe illumination, a camera interface unit 386 may enable the strobe unit 336 by sending an enable command through the strobe control signal 338. In one embodiment, the camera interface unit 386 may be included as an interface of input/output interfaces 384 in a processor subsystem 360 of the processor complex 310 of FIG. 3B. The enable command may comprise a signal level transition, a data packet, a register write, or any other technically feasible transmission of a command. The camera module 330 may sense that the strobe unit 336 is enabled and then cause image sensor 332 to sample one or more images requiring strobe illumination while the strobe unit 336 is enabled. In such an implementation, the image sensor 332 may be configured to wait for an enable signal destined for the strobe unit 336 as a trigger signal to begin sampling a new exposure.

In one embodiment, camera interface unit 386 may transmit exposure parameters and commands to camera module 330 through interconnect 334. In certain embodiments, the camera interface unit 386 may be configured to directly control strobe unit 336 by transmitting control commands to the strobe unit 336 through strobe control signal 338. By directly controlling both the camera module 330 and the strobe unit 336, the camera interface unit 386 may cause the camera module 330 and the strobe unit 336 to perform their respective operations in precise time synchronization. In one embodiment, precise time synchronization may be less than five hundred microseconds of event timing error. Additionally, event timing error may be a difference in time from an intended event occurrence to the time of a corresponding actual event occurrence.

In another embodiment, camera interface unit 386 may be configured to accumulate statistics while receiving image data from camera module 330. In particular, the camera interface unit 386 may accumulate exposure statistics for a given image while receiving image data for the image through interconnect 334. Exposure statistics may include, without limitation, one or more of an intensity histogram, a count of over-exposed pixels, a count of under-exposed pixels, an intensity-weighted sum of pixel intensity, or any combination thereof. The camera interface unit 386 may present the exposure statistics as memory-mapped storage locations within a physical or virtual address space defined by a processor, such as one or more of CPU cores 370, within processor complex 310. In one embodiment, exposure statistics reside in storage circuits that are mapped into a memory-mapped register space, which may be accessed through the interconnect 334. In other embodiments, the exposure statistics are transmitted in conjunction with transmitting pixel data for a captured image. For example, the exposure statistics for a given image may be transmitted as in-line data, following transmission of pixel intensity data for the captured image. Exposure statistics may be calculated, stored, or cached within the camera interface unit 386.

In one embodiment, camera interface unit 386 may accumulate color statistics for estimating scene white-balance. Any technically feasible color statistics may be accumulated for estimating white balance, such as a sum of intensities for different color channels comprising red, green, and blue color channels. The sum of color channel intensities may then be used to perform a white-balance color correction on an associated image, according to a white-balance model such as a gray-world white-balance model. In other embodiments, curve-fitting statistics are accumulated for a linear or a quadratic curve fit used for implementing white-balance correction on an image.

In one embodiment, camera interface unit 386 may accumulate spatial color statistics for performing color-matching between or among images, such as between or among an ambient image and one or more images sampled with strobe illumination. As with the exposure statistics, the color statistics may be presented as memory-mapped storage locations within processor complex 310. In one embodiment, the color statistics are mapped in a memory-mapped register space, which may be accessed through interconnect 334, within processor subsystem 360. In other embodiments, the color statistics may be transmitted in conjunction with transmitting pixel data for a captured image. For example, in one embodiment, the color statistics for a given image may be transmitted as in-line data, following transmission of pixel intensity data for the image. Color statistics may be calculated, stored, or cached within the camera interface 386.

In one embodiment, camera module 330 may transmit strobe control signal 338 to strobe unit 336, enabling the strobe unit 336 to generate illumination while the camera module 330 is sampling an image. In another embodiment, camera module 330 may sample an image illuminated by strobe unit 336 upon receiving an indication signal from camera interface unit 386 that the strobe unit 336 is enabled. In yet another embodiment, camera module 330 may sample an image illuminated by strobe unit 336 upon detecting strobe illumination within a photographic scene via a rapid rise in scene illumination. In one embodiment, a rapid rise in scene illumination may include at least a rate of increasing intensity consistent with that of enabling strobe unit 336. In still yet another embodiment, camera module 330 may enable strobe unit 336 to generate strobe illumination while sampling one image, and disable the strobe unit 336 while sampling a different image.

Figure 3G:
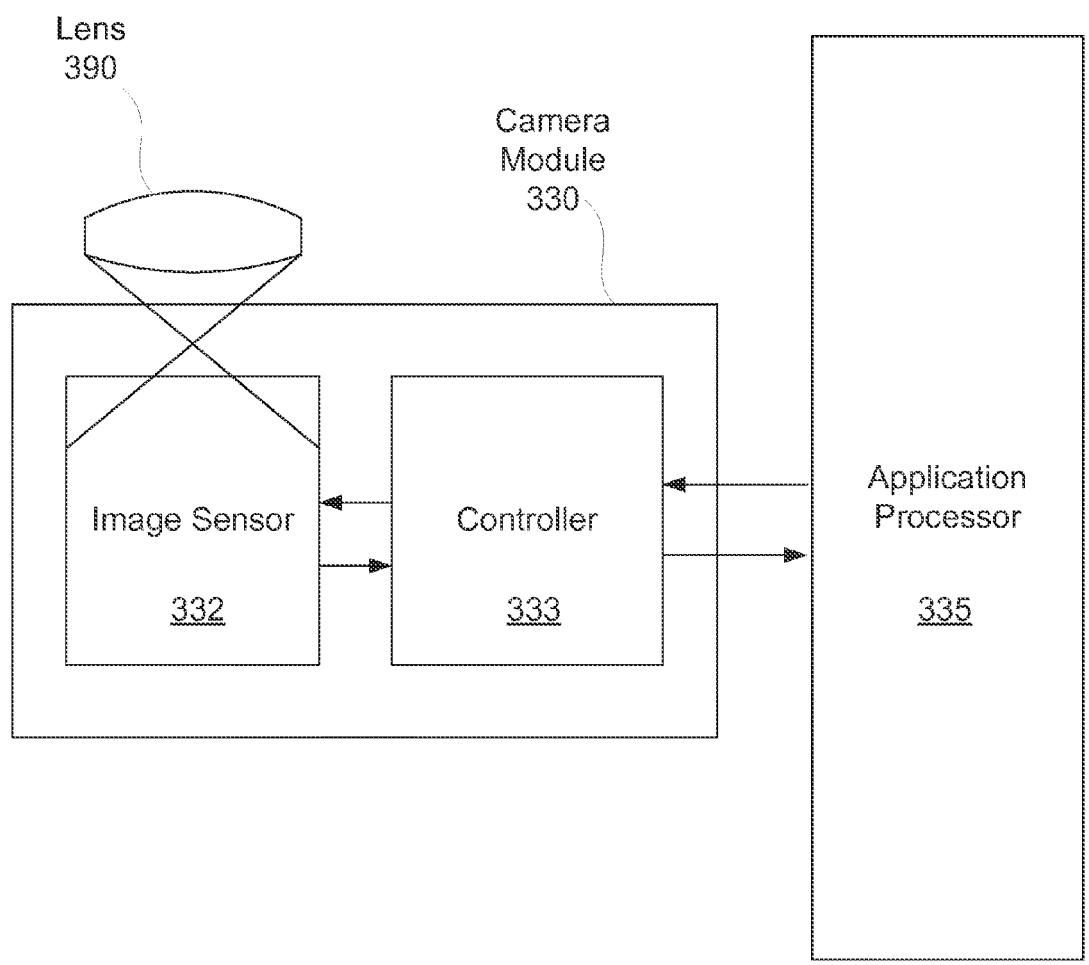
FIG. 3G illustrates a camera module in communication with an application processor, in accordance with an embodiment.

FIG. 3G illustrates camera module 330, in accordance with one embodiment. As an option, the camera module 330 may be implemented in the context of the details of any of the Figures disclosed herein. Of course, however, the camera module 330 may be implemented in any desired environment. Further, the aforementioned definitions may equally apply to the description below.

In one embodiment, the camera module 330 may be in communication with an application processor 335. The camera module 330 is shown to include image sensor 332 in communication with a controller 333. Further, the controller 333 is shown to be in communication with the application processor 335.

In one embodiment, the application processor 335 may reside outside of the camera module 330. As shown, the lens 390 may be configured to focus optical scene information onto image sensor 332 to be sampled. The optical scene information sampled by the image sensor 332 may then be communicated from the image sensor 332 to the controller 333 for at least one of subsequent processing and communication to the application processor 335. In another embodiment, the controller 333 may control storage of the optical scene information sampled by the image sensor 332, or storage of processed optical scene information.

In another embodiment, the controller 333 may enable a strobe unit to emit strobe illumination for a short time duration (e.g. less than one microsecond, etc.) after image sensor 332 completes an exposure time associated with sampling an ambient image. Further, the controller 333 may be configured to generate strobe control signal 338 in conjunction with controlling operation of the image sensor 332.

In one embodiment, the image sensor 332 may be a complementary metal oxide semiconductor (CMOS) sensor or a charge-coupled device (CCD) sensor. In another embodiment, the controller 333 and the image sensor 332 may be packaged together as an integrated system or integrated circuit. In yet another embodiment, the controller 333 and the image sensor 332 may comprise discrete packages. In one embodiment, the controller 333 may provide circuitry for receiving optical scene information from the image sensor 332, processing of the optical scene information, timing of various functionalities, and signaling associated with the application processor 335. Further, in another embodiment, the controller 333 may provide circuitry for control of one or more of exposure, shuttering, white balance, and gain adjustment. Processing of the optical scene information by the circuitry of the controller 333 may include one or more of gain application, amplification, and analog-to-digital conversion. After processing the optical scene information, the controller 333 may transmit corresponding digital pixel data, such as to the application processor 335.

In one embodiment, the application processor 335 may be implemented on processor complex 310 and at least one of volatile memory 318 and NV memory 316, or any other memory device and/or system. The application processor 335 may be previously configured for processing of received optical scene information or digital pixel data communicated from the camera module 330 to the application processor 335.

Figure 4:
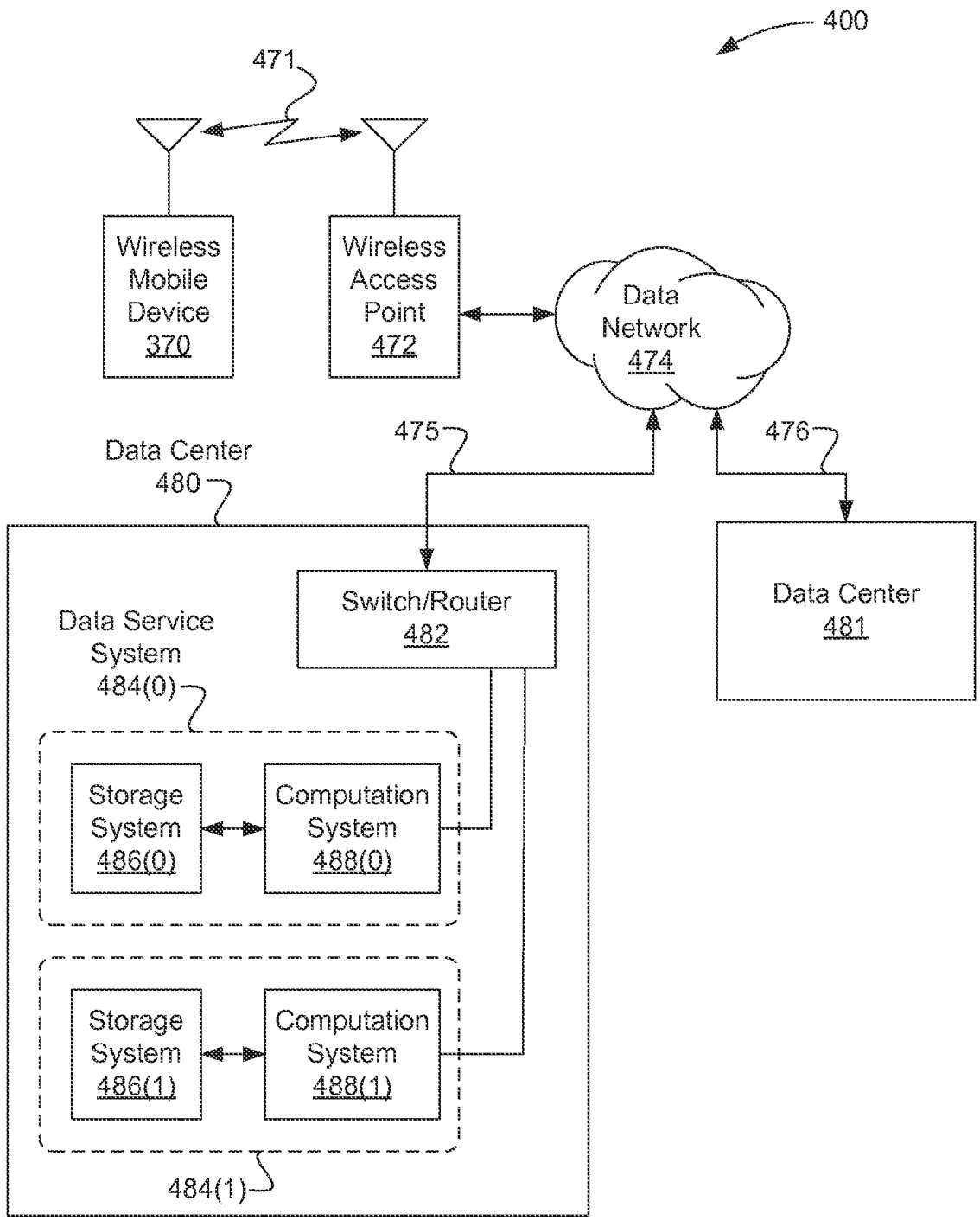
FIG. 4 illustrates a network service system, in accordance with another embodiment.

FIG. 4 illustrates a network service system 400, in accordance with one embodiment. As an option, the network service system 400 may be implemented in the context of the details of any of the Figures disclosed herein. Of course, however, the network service system 400 may be implemented in any desired environment. Further, the aforementioned definitions may equally apply to the description below.

In one embodiment, the network service system 400 may be configured to provide network access to a device implementing a digital photographic system. As shown, network service system 400 includes a wireless mobile device 376, a wireless access point 472, a data network 474, data center 480, and a data center 481. The wireless mobile device 376 may communicate with the wireless access point 472 via a digital radio link 471 to send and receive digital data, including data associated with digital images. The wireless mobile device 376 and the wireless access point 472 may implement any technically feasible transmission techniques for transmitting digital data via digital a radio link 471 without departing the scope and spirit of the present invention. In certain embodiments, one or more of data centers 480, 481 may be implemented using virtual constructs so that each system and subsystem within a given data center 480, 481 may comprise virtual machines configured to perform specified data processing and network tasks. In other implementations, one or more of data centers 480, 481 may be physically distributed over a plurality of physical sites.

The wireless mobile device 376 may comprise a smart phone configured to include a digital camera, a digital camera configured to include wireless network connectivity, a reality augmentation device, a laptop configured to include a digital camera and wireless network connectivity, or any other technically feasible computing device configured to include a digital photographic system and wireless network connectivity.

In various embodiments, the wireless access point 472 may be configured to communicate with wireless mobile device 376 via the digital radio link 471 and to communicate with the data network 474 via any technically feasible transmission media, such as any electrical, optical, or radio transmission media. For example, in one embodiment, wireless access point 472 may communicate with data network 474 through an optical fiber coupled to the wireless access point 472 and to a router system or a switch system within the data network 474. A network link 475, such as a wide area network (WAN) link, may be configured to transmit data between the data network 474 and the data center 480.

In one embodiment, the data network 474 may include routers, switches, long-haul transmission systems, provisioning systems, authorization systems, and any technically feasible combination of communications and operations subsystems configured to convey data between network endpoints, such as between the wireless access point 472 and the data center 480. In one implementation, a wireless the mobile device 376 may comprise one of a plurality of wireless mobile devices configured to communicate with the data center 480 via one or more wireless access points coupled to the data network 474.

Additionally, in various embodiments, the data center 480 may include, without limitation, a switch/router 482 and at least one data service system 484. The switch/router 482 may be configured to forward data traffic between and among a network link 475, and each data service system 484. The switch/router 482 may implement any technically feasible transmission techniques, such as Ethernet media layer transmission, layer 2 switching, layer 3 routing, and the like. The switch/router 482 may comprise one or more individual systems configured to transmit data between the data service systems 484 and the data network 474.

In one embodiment, the switch/router 482 may implement session-level load balancing among a plurality of data service systems 484. Each data service system 484 may include at least one computation system 488 and may also include one or more storage systems 486. Each computation system 488 may comprise one or more processing units, such as a central processing unit, a graphics processing unit, or any combination thereof. A given data service system 484 may be implemented as a physical system comprising one or more physically distinct systems configured to operate together. Alternatively, a given data service system 484 may be implemented as a virtual system comprising one or more virtual systems executing on an arbitrary physical system. In certain scenarios, the data network 474 may be configured to transmit data between the data center 480 and another data center 481, such as through a network link 476.

In another embodiment, the network service system 400 may include any networked mobile devices configured to implement one or more embodiments of the present invention. For example, in some embodiments, a peer-to-peer network, such as an ad-hoc wireless network, may be established between two different wireless mobile devices. In such embodiments, digital image data may be transmitted between the two wireless mobile devices without having to send the digital image data to a data center 480.

Figure 5A:
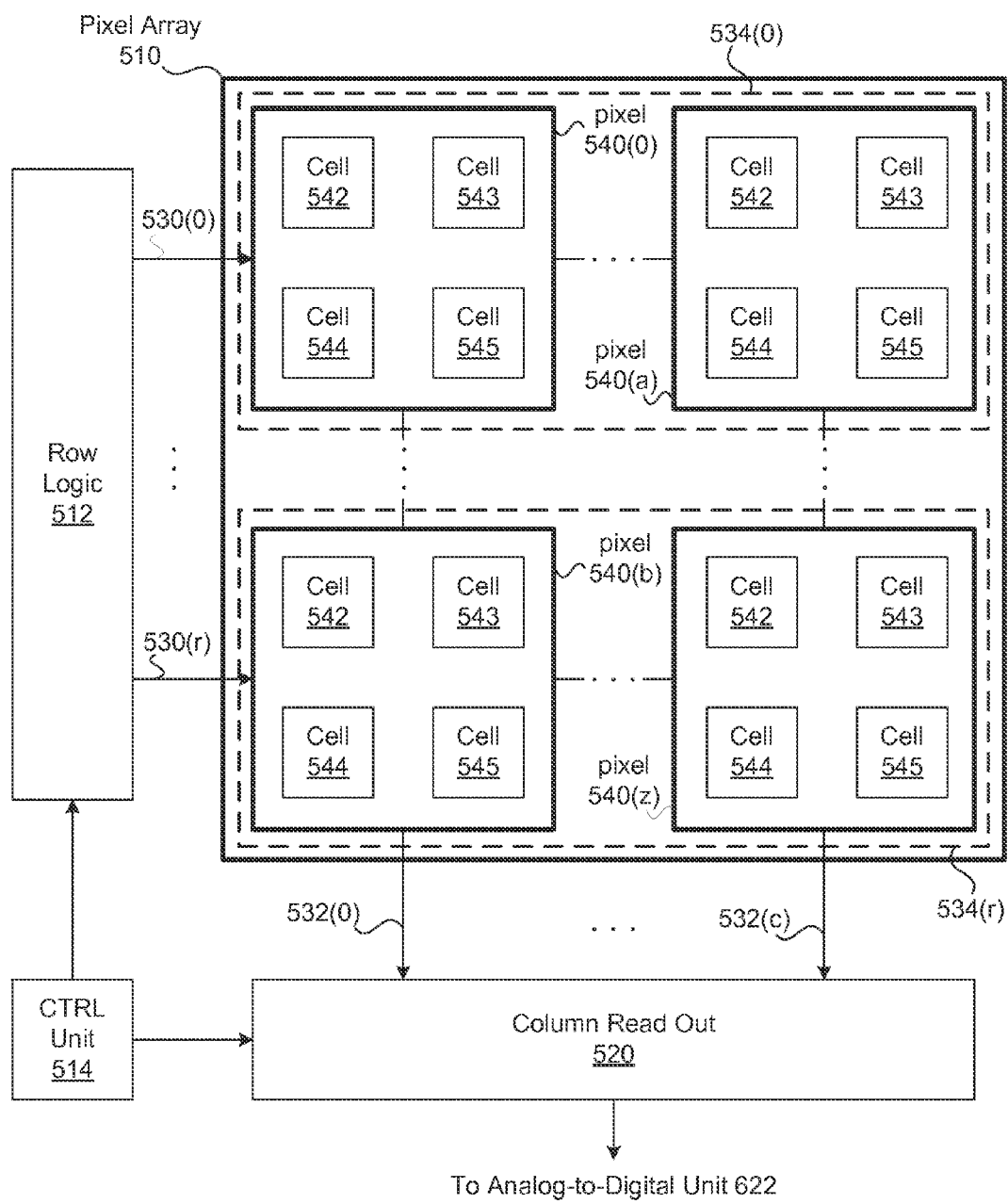

FIG. 5A illustrates a system for capturing optical scene information for conversion to an electronic representation of a photographic scene, in accordance with one embodiment. As an option, the system of FIG. 5A may be implemented in the context of the details of any of the Figures. Of course, however, the system of FIG. 5A may be implemented in any desired environment. Further, the aforementioned definitions may equally apply to the description below.

As shown in FIG. 5A, a pixel array 510 is in communication with row logic 512 and a column read out circuit 520. Further, the row logic 512 and the column read out circuit 520 are both in communication with a control unit 514. Still further, the pixel array 510 is shown to include a plurality of pixels 540, where each pixel 540 may include four cells, cells 542-545. In the context of the present description, the pixel array 510 may be included in an image sensor, such as image sensor 132 or image sensor 332 of camera module 330.

As shown, the pixel array 510 includes a 2-dimensional array of the pixels 540. For example, in one embodiment, the pixel array 510 may be built to comprise 4,000 pixels 540 in a first dimension, and 3,000 pixels 540 in a second dimension, for a total of 12,000,000 pixels 540 in the pixel array 510, which may be referred to as a 12 megapixel pixel array. Further, as noted above, each pixel 540 is shown to include four cells 542-545. In one embodiment, cell 542 may be associated with (e.g. selectively sensitive to, etc.) a first color of light, cell 543 may be associated with a second color of light, cell 544 may be associated with a third color of light, and cell 545 may be associated with a fourth color of light. In one embodiment, each of the first color of light, second color of light, third color of light, and fourth color of light are different colors of light, such that each of the cells 542-545 may be associated with different colors of light. In another embodiment, at least two cells of the cells 542-545 may be associated with a same color of light. For example, the cell 543 and the cell 544 may be associated with the same color of light.

Further, each of the cells 542-545 may be capable of storing an analog value. In one embodiment, each of the cells 542-545 may be associated with a capacitor for storing a charge that corresponds to an accumulated exposure during an exposure time. In such an embodiment, asserting a row select signal to circuitry of a given cell may cause the cell to perform a read operation, which may include, without limitation, generating and transmitting a current that is a function of the stored charge of the capacitor associated with the cell. In one embodiment, prior to a readout operation, current received at the capacitor from an associated photodiode may cause the capacitor, which has been previously charged, to discharge at a rate that is proportional to an incident light intensity detected at the photodiode. The remaining charge of the capacitor of the cell may then be read using the row select signal, where the current transmitted from the cell is an analog value that reflects the remaining charge on the capacitor. To this end, an analog value received from a cell during a readout operation may reflect an accumulated intensity of light detected at a photodiode. The charge stored on a given capacitor, as well as any corresponding representations of the charge, such as the transmitted current, may be referred to herein as analog pixel data. Of course, analog pixel data may include a set of spatially discrete intensity samples, each represented by continuous analog values.

Still further, the row logic 512 and the column read out circuit 520 may work in concert under the control of the control unit 514 to read a plurality of cells 542-545 of a plurality of pixels 540. For example, the control unit 514 may cause the row logic 512 to assert a row select signal comprising row control signals 530 associated with a given row of pixels 540 to enable analog pixel data associated with the row of pixels to be read. As shown in FIG. 5A, this may include the row logic 512 asserting one or more row select signals comprising row control signals 530(0) associated with a row 534(0) that includes pixel 540(0) and pixel 540(a). In response to the row select signal being asserted, each pixel 540 on row 534(0) transmits at least one analog value based on charges stored within the cells 542-545 of the pixel 540. In certain embodiments, cell 542 and cell 543 are configured to transmit corresponding analog values in response to a first row select signal, while cell 544 and cell 545 are configured to transmit corresponding analog values in response to a second row select signal.

In one embodiment, analog values for a complete row of pixels 540 comprising each row 534(0) through 534(r) may be transmitted in sequence to column read out circuit 520 through column signals 532. In one embodiment, analog values for a complete row or pixels or cells within a complete row of pixels may be transmitted simultaneously. For example, in response to row select signals comprising row control signals 530(0) being asserted, the pixel 540(0) may respond by transmitting at least one analog value from the cells 542-545 of the pixel 540(0) to the column read out circuit 520 through one or more signal paths comprising column signals 532(0); and simultaneously, the pixel 540(a) will also transmit at least one analog value from the cells 542-545 of the pixel 540(a) to the column read out circuit 520 through one or more signal paths comprising column signals 532(c). Of course, one or more analog values may be received at the column read out circuit 520 from one or more other pixels 540 concurrently with receiving the at least one analog value from the pixel 540(0) and concurrently with receiving the at least one analog value from the pixel 540(a). Together, a set of analog values received from the pixels 540 comprising row 534(0) may be referred to as an analog signal, and this analog signal may be based on an optical image focused on the pixel array 510.

Further, after reading the pixels 540 comprising row 534(0), the row logic 512 may select a second row of pixels 540 to be read. For example, the row logic 512 may assert one or more row select signals comprising row control signals 530(r) associated with a row of pixels 540 that includes pixel 540(b) and pixel 540(z). As a result, the column read out circuit 520 may receive a corresponding set of analog values associated with pixels 540 comprising row 534(r).

Figure 6A:
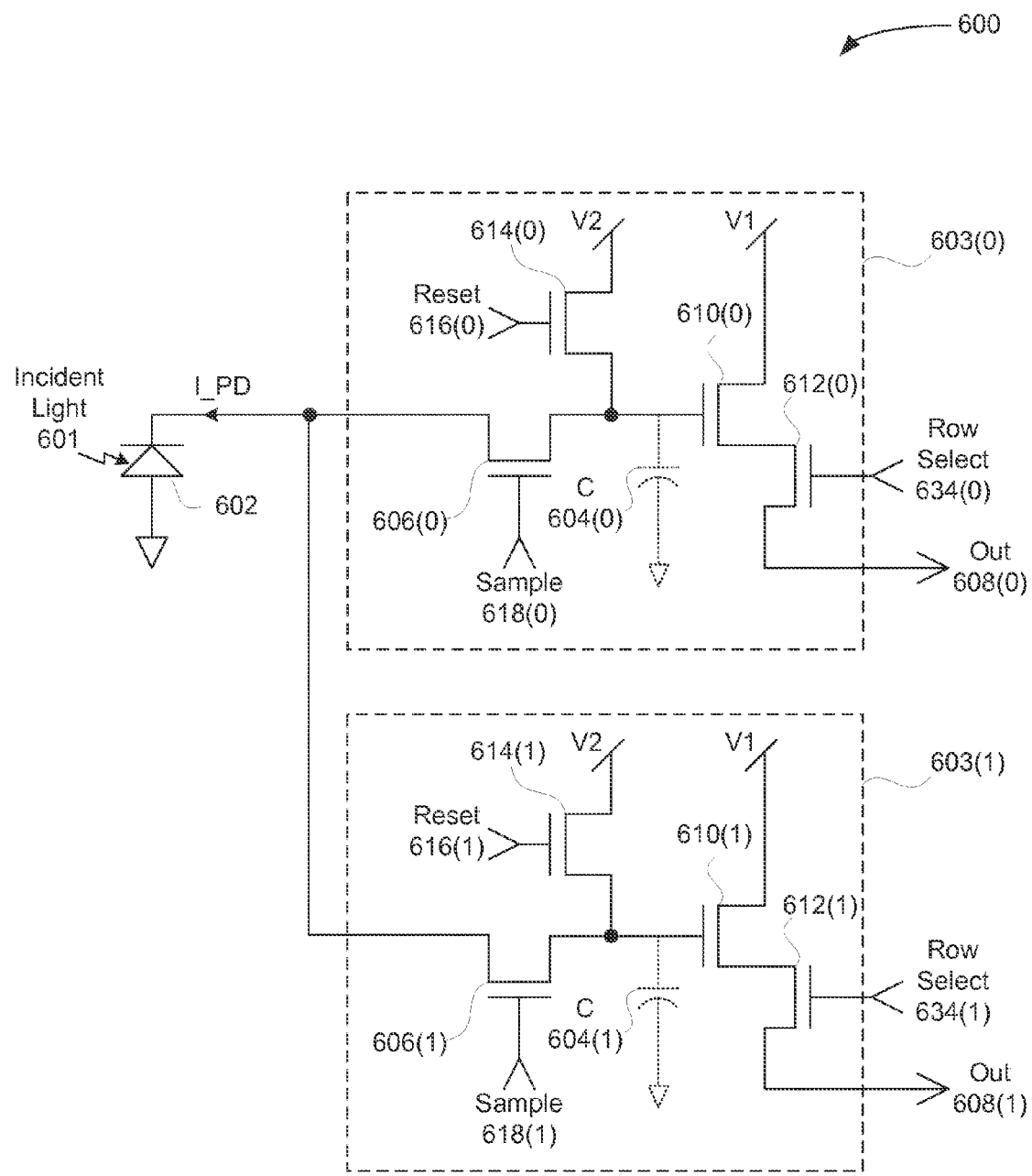
FIG. 6A illustrates a circuit diagram for a photosensitive cell, according to one embodiment.
Figure 6B:
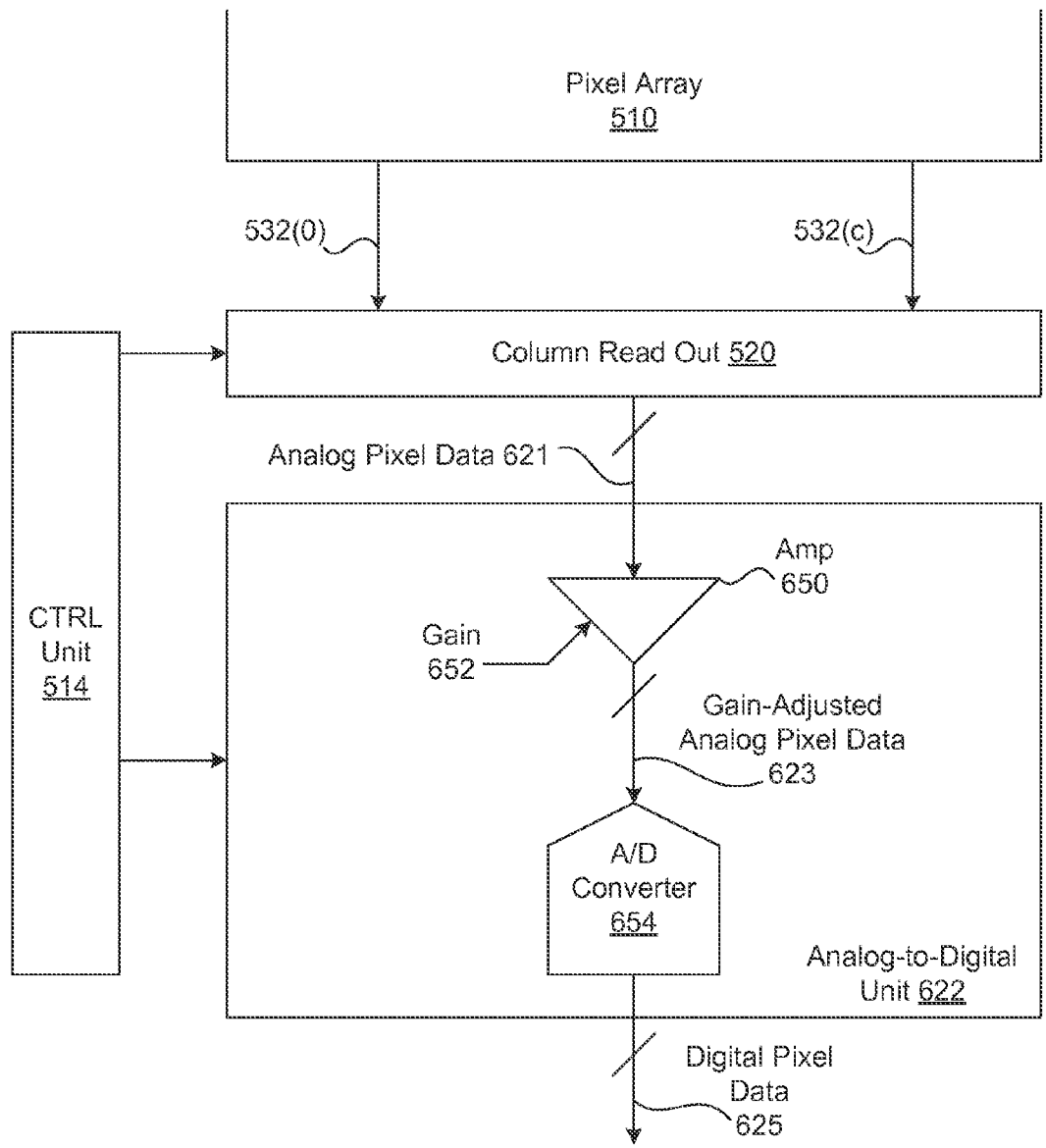
FIG. 6B illustrates a system for converting analog pixel data to digital pixel data, in accordance with an embodiment.

The column read out circuit 520 may serve as a multiplexer to select and forward one or more received analog values to an analog-to-digital converter circuit, such as analog-to-digital unit 622 of FIG. 6B. The column read out circuit 520 may forward the received analog values in a predefined order or sequence. In one embodiment, row logic 512 asserts one or more row selection signals comprising row control signals 530, causing a corresponding row of pixels to transmit analog values through column signals 532. The column read out circuit 520 receives the analog values and sequentially selects and forwards one or more of the analog values at a time to the analog-to-digital unit 622. Selection of rows by row logic 512 and selection of columns by column read out circuit 620 may be directed by control unit 514. In one embodiment, rows 534 are sequentially selected to be read, starting with row 534(0) and ending with row 534(r), and analog values associated with sequential columns are transmitted to the analog-to-digital unit 622. In other embodiments, other selection patterns may be implemented to read analog values stored in pixels 540.

Further, the analog values forwarded by the column read out circuit 520 may comprise analog pixel data, which may later be amplified and then converted to digital pixel data for generating one or more digital images based on an optical image focused on the pixel array 510.

FIGS. 5B-5D illustrate three optional pixel configurations, according to one or more embodiments. As an option, these pixel configurations may be implemented in the context of the details of any of the Figures disclosed herein. Of course, however, these pixel configurations may be implemented in any desired environment. By way of a specific example, any of the pixels 540 of FIGS. 5B-5D may operate as one or more of the pixels 540 of the pixel array 510.

As shown in FIG. 5B, a pixel 540 is illustrated to include a first cell (R) for measuring red light intensity, second and third cells (G) for measuring green light intensity, and a fourth cell (B) for measuring blue light intensity, in accordance with one embodiment. As shown in FIG. 5C, a pixel 540 is illustrated to include a first cell (R) for measuring red light intensity, a second cell (G) for measuring green light intensity, a third cell (B) for measuring blue light intensity, and a fourth cell (W) for measuring white light intensity, in accordance with another embodiment. As shown in FIG. 5D, a pixel 540 is illustrated to include a first cell (C) for measuring cyan light intensity, a second cell (M) for measuring magenta light intensity, a third cell (Y) for measuring yellow light intensity, and a fourth cell (W) for measuring white light intensity, in accordance with yet another embodiment.

Of course, while pixels 540 are each shown to include four cells, a pixel 540 may be configured to include fewer or more cells for measuring light intensity. Still further, in another embodiment, while certain of the cells of pixel 540 are shown to be configured to measure a single peak wavelength of light, or white light, the cells of pixel 540 may be configured to measure any wavelength, range of wavelengths of light, or plurality of wavelengths of light.

Referring now to FIG. 5E, a system is shown for capturing optical scene information focused as an optical image on an image sensor 332, in accordance with one embodiment. As an option, the system of FIG. 5E may be implemented in the context of the details of any of the Figures. Of course, however, the system of FIG. 5E may be carried out in any desired environment. Further, the aforementioned definitions may equally apply to the description below.

As shown in FIG. 5E, an image sensor 332 is shown to include a first cell 544, a second cell 545, and a third cell 548. Further, each of the cells 544-548 is shown to include a photodiode 562. Still further, upon each of the photodiodes 562 is a corresponding filter 564, and upon each of the filters 564 is a corresponding microlens 566. For example, the cell 544 is shown to include photodiode 562(0), upon which is filter 564(0), and upon which is microlens 566(0). Similarly, the cell 545 is shown to include photodiode 562(1), upon which is filter 564(1), and upon which is microlens 566(1). Still yet, as shown in FIG. 5E, pixel 540 is shown to include each of cells 544 and 545, photodiodes 562(0) and 562(1), filters 564(0) and 564(1), and microlenses 566(0) and 566(1).

In one embodiment, each of the microlenses 566 may be any lens with a diameter of less than 50 microns. However, in other embodiments each of the microlenses 566 may have a diameter greater than or equal to 50 microns. In one embodiment, each of the microlenses 566 may include a spherical convex surface for focusing and concentrating received light on a supporting substrate beneath the microlens 566. For example, as shown in FIG. 5E, the microlens 566(0) focuses and concentrates received light on the filter 564(0). In one embodiment, a microlens array 567 may include microlenses 566, each corresponding in placement to photodiodes 562 within cells 544 of image sensor 332.

In the context of the present description, the photodiodes 562 may comprise any semiconductor diode that generates a potential difference, or changes its electrical resistance, in response to photon absorption. Accordingly, the photodiodes 562 may be used to detect or measure light intensity. Further, each of the filters 564 may be optical filters for selectively transmitting light of one or more predetermined wavelengths. For example, the filter 564(0) may be configured to selectively transmit substantially only green light received from the corresponding microlens 566(0), and the filter 564(1) may be configured to selectively transmit substantially only blue light received from the microlens 566(1). Together, the filters 564 and microlenses 566 may be operative to focus selected wavelengths of incident light on a plane. In one embodiment, the plane may be a 2-dimensional grid of photodiodes 562 on a surface of the image sensor 332. Further, each photodiode 562 receives one or more predetermined wavelengths of light, depending on its associated filter. In one embodiment, each photodiode 562 receives only one of red, blue, or green wavelengths of filtered light. As shown with respect to FIGS. 5B-5D, it is contemplated that a photodiode may be configured to detect wavelengths of light other than only red, green, or blue. For example, in the context of FIGS. 5C-5D specifically, a photodiode may be configured to detect white, cyan, magenta, yellow, or non-visible light such as infrared or ultraviolet light.

To this end, each coupling of a cell, photodiode, filter, and microlens may be operative to receive light, focus and filter the received light to isolate one or more predetermined wavelengths of light, and then measure, detect, or otherwise quantify an intensity of light received at the one or more predetermined wavelengths. The measured or detected light may then be represented as one or more analog values stored within a cell. For example, in one embodiment, each analog value may be stored within the cell utilizing a capacitor. Further, each analog value stored within a cell may be output from the cell based on a selection signal, such as a row selection signal, which may be received from row logic 512. Further still, each analog value transmitted from a cell may comprise one analog value in a plurality of analog values of an analog signal, where each of the analog values is output by a different cell. Accordingly, the analog signal may comprise a plurality of analog pixel data values from a plurality of cells. In one embodiment, the analog signal may comprise analog pixel data values for an entire image of a photographic scene. In another embodiment, the analog signal may comprise analog pixel data values for a subset of the entire image of the photographic scene. For example, the analog signal may comprise analog pixel data values for a row of pixels of the image of the photographic scene. In the context of FIGS. 5A-5E, the row 534(0) of the pixels 540 of the pixel array 510 may be one such row of pixels of the image of the photographic scene.

FIG. 6A illustrates a circuit diagram for a photosensitive cell 600, in accordance with one possible embodiment. As an option, the cell 600 may be implemented in the context of any of the Figures disclosed herein. Of course, however, the system 600 may be implemented in any desired environment. Further, the aforementioned definitions may equally apply to the description below.

As shown in FIG. 6A, a photosensitive cell 600 includes a photodiode 602 coupled to a first analog sampling circuit 603(0) and a second analog sampling circuit 603(1). The photodiode 602 may be implemented as the photodiode 101 described within the context of FIG. 1, or any of the photodiodes 562 of FIG. 5E. Further, an analog sampling circuit 603 may be implemented as a sample storage node 133 described within the context of FIG. 1. In one embodiment, a unique instance of photosensitive cell 600 may implemented as each of cells 542-545 comprising a pixel 540 within the context of FIGS. 5A-5E.

As shown, the photosensitive cell 600 comprises two analog sampling circuits 603, and a photodiode 602. The two analog sampling circuits 603 include a first analog sampling circuit 603(0) which is coupled to a second analog sampling circuit 603(1). As shown in FIG. 6A, the first analog sampling circuit 603(0) comprises transistors 606(0). 610(0), 612(0), 614(0), and a capacitor 604(0); and the second analog sampling circuit 603(1) comprises transistors 606(1), 610(1), 612(1), 614(1), and a capacitor 604(1). In one embodiment, each of the transistors 606, 610, 612, and 614 may be a field-effect transistor.

The photodiode 602 may be operable to measure or detect incident light 601 of a photographic scene. In one embodiment, the incident light 601 may include ambient light of the photographic scene. In another embodiment, the incident light 601 may include light from a strobe unit utilized to illuminate the photographic scene. In yet another embodiment, the incident light 601 may include ambient light and/or light from a strobe unit, where the composition of the incident light 601 changes as a function of exposure time. For example, the incident light 601 may include ambient light during a first exposure time, and light from a strobe unit during a second exposure time. Of course, the incident light 601 may include any light received at and measured by the photodiode 602. Further still, and as discussed above, the incident light 601 may be concentrated on the photodiode 602 by a microlens, and the photodiode 602 may be one photodiode of a photodiode array that is configured to include a plurality of photodiodes arranged on a two-dimensional plane.

In one embodiment, the analog sampling circuits 603 may be substantially identical. For example, the first analog sampling circuit 603(0) and the second analog sampling circuit 603(1) may each include corresponding transistors, capacitors, and interconnects configured in a substantially identical manner. Of course, in other embodiments, the first analog sampling circuit 603(0) and the second analog sampling circuit 603(1) may include circuitry, transistors, capacitors, interconnects and/or any other components or component parameters (e.g. capacitance value of each capacitor 604) which may be specific to just one of the analog sampling circuits 603.

In one embodiment, each capacitor 604 may include one node of a capacitor comprising gate capacitance for a transistor 610 and diffusion capacitance for transistors 606 and 614. The capacitor 604 may also be coupled to additional circuit elements (not shown) such as, without limitation, a distinct capacitive structure, such as a metal-oxide stack, a poly capacitor, a trench capacitor, or any other technically feasible capacitor structures.

With respect to analog sampling circuit 603(0), when reset 616(0) is active (low), transistor 614(0) provides a path from voltage source V2 to capacitor 604(0), causing capacitor 604(0) to charge to the potential of V2. When sample signal 618(0) is active, transistor 606(0) provides a path for capacitor 604(0) to discharge in proportion to a photodiode current (I_PD) generated by the photodiode 602 in response to the incident light 601. In this way, photodiode current I_PD is integrated for a first exposure time when the sample signal 618(0) is active, resulting in a corresponding first voltage on the capacitor 604(0). This first voltage on the capacitor 604(0) may also be referred to as a first sample. In embodiments, where the incident light 601 during the first exposure time comprises ambient light, the first sample may be referred to as an ambient sample. When row select 634(0) is active, transistor 612(0) provides a path for a first output current from V1 to output 608(0). The first output current is generated by transistor 610(0) in response to the first voltage on the capacitor 604(0). When the row select 634(0) is active, the output current at the output 608(0) may therefore be proportional to the integrated intensity of the incident light 601 during the first exposure time. In one embodiment, sample signal 618(0) is asserted substantially simultaneously over substantially all photo sensitive cells 600 comprising an image sensor to implement a global shutter for all first samples within the image sensor.

With respect to analog sampling circuit 603(1), when reset 616(1) is active (low), transistor 614(1) provides a path from voltage source V2 to capacitor 604(1), causing capacitor 604(1) to charge to the potential of V2. When sample signal 618(1) is active, transistor 606(1) provides a path for capacitor 604(1) to discharge in proportion to a photodiode current (I_PD) generated by the photodiode 602 in response to the incident light 601. In this way, photodiode current I_PD is integrated for a second exposure time when the sample signal 618(1) is active, resulting in a corresponding second voltage on the capacitor 604(1). This second voltage on the capacitor 604(1) may also be referred to as a second sample. In embodiments, where the incident light 601 during the second exposure time comprises flash or strobe illumination, the first sample may be referred to as a flash sample. When row select 634(1) is active, transistor 612(1) provides a path for a second output current from V1 to output 608(1). The second output current is generated by transistor 610(1) in response to the second voltage on the capacitor 604(1). When the row select 634(1) is active, the output current at the output 608(1) may therefore be proportional to the integrated intensity of the incident light 601 during the second exposure time. In one embodiment, sample signal 618(1) is asserted substantially simultaneously over substantially all photo sensitive cells 600 comprising an image sensor to implement a global shutter for all second samples within the image sensor.

To this end, by controlling storage of a first sample or ambient sample during the first exposure time, and storage of a second sample or flash sample during the second exposure time, the capacitor 604(0) may store a first voltage or sample, and the capacitor 604(1) may store a second voltage or sample different than the first voltage or sample. Each of the ambient sample and the flash sample may be stored in response to a photodiode current I_PD being generated by the photodiode 602, where the photodiode current I_PD varies as a function of the incident light 601 measured at the photodiode 602. In particular, a greater amount of incident light 601 may be measured by the photodiode 602 during the second exposure time including strobe or flash illumination than during the first exposure time including ambient illumination. Of course, characteristics of the photographic scene, as well as adjustment of various exposure settings, such as exposure time and aperture for example, may result in a greater amount of incident light 601 being measured by the photodiode 602 during the first exposure time including the ambient illumination than during the second exposure time including the strobe or flash illumination.

In one embodiment, the first exposure time and the second exposure time do not overlap in time. For example, a controller may be configured to control the second exposure time such that it begins contemporaneously, or near contemporaneously, with a conclusion of the first exposure time. In such an embodiment, the sample signal 618(1) may be activated as the sample signal 618(0) is deactivated. Various timings suitable for simultaneously storing ambient samples and flash samples using the photosensitive cells 600 are presented in greater detail in U.S. patent application Ser. No. 13/999,678, entitled "Systems and methods for a digital image sensor," which is incorporated herein as though set forth in full.

As a benefit of having two different exposure conditions, in situations where a photodiode 602 is exposed to a sufficient threshold of incident light 601, a first capacitor 604(0) may provide a an analog value suitable for generating a digital image, and a second capacitor 604(1) of the same cell 600 may provide a "blown out" or over exposed image portion due to excessive flash illumination. Thus, for each cell 600, a first capacitor 604 may more effectively capture darker image content than another capacitor 604 of the same cell 600. This may be useful, for example, in situations where strobe or flash illumination over-exposes foreground objects in a digital image of a photographic scene, or under-exposes background objects in the digital image of the photographic scene. In such an example, an image captured during another exposure time utilizing ambient illumination may help correct any over-exposed or under-exposed objects. Similarly, in situations where ambient light is unable to sufficiently illuminate particular elements of a photographic scene, and these elements appear dark or difficult to see in an associated digital image, an image captured during another exposure time utilizing strobe or flash illumination may help correct any under-exposed portions of the image.

In other embodiments, it may be desirable to use more than two analog sampling circuits for the purpose of storing more than two voltages or samples. For example, an embodiment with three or more analog sampling circuits could be implemented such that each analog sampling circuit samples for a different exposure time a photodiode current I_PD being generated by a photodiode. In such an embodiment, three or more voltages or samples could be obtained. Consequently, exposure sensitivity may vary as a function of the number of analog sampling circuits 603 that are coupled to the photodiode 602 at any given time, and the amount of capacitance that is associated with each analog sampling circuit 603. Such variation may need to be accounted for in determining an exposure time or sample time for each analog sampling circuit 603.

In various embodiments, capacitor 604(0) may be substantially identical to capacitor 604(1). For example, the capacitors 604(0) and 604(1) may have substantially identical capacitance values. In one embodiment, a sample signal 618 of one of the analog sampling circuits may be activated for a longer or shorter period of time than a sample signal 618 is activated for any other analog sampling circuits 603.

As noted above, the sample signal 618(0) of the first analog sampling circuit 603(0) may be activated for a first exposure time, and a sample signal 618(1) of the second analog sampling circuit 603(1) may be activated for a second exposure time. In one embodiment, the first exposure time and/or the second exposure time may be determined based on an exposure setting selected by a user, by software, or by some combination of user and software. For example, the first exposure time may be selected based on a ¹⁄₆₀ second shutter time selected by a user of a camera. In response, the second exposure time may be selected based on the first exposure time. In one embodiment, the user's selected ¹⁄₆₀ second shutter time may be selected for an ambient image, and a metering algorithm may then evaluate the photographic scene to determine an optimal second exposure time for a flash or strobe capture. The second exposure time for the flash or strobe capture may be selected based on incident light metered during the evaluation of the photographic scene. Of course, in other embodiments, a user selection may be used to select the second exposure time, and then the first exposure time for an ambient capture may be selected according to the selected second exposure time. In yet other embodiments, the first exposure time may be selected independent of the second exposure time.

In other embodiments, the capacitors 604(0) and 604(1) may have different capacitance values. In one embodiment, the capacitors 604(0) and 604(1) may have different capacitance values for the purpose of rendering one of the analog sampling circuits 603 more or less sensitive to the current I_PD from the photodiode 602 than other analog sampling circuits 603 of the same cell 600. For example, a capacitor 604 with a significantly larger capacitance than other capacitors 604 of the same cell 600 may be less likely to fully discharge when capturing photographic scenes having significant amounts of incident light 601. In such embodiments, any difference in stored voltages or samples between the capacitors 604(0) and 604(1) may be a function of the different capacitance values, in conjunction with different activation times of the sample signals 618 and different incident light measurements during the respective exposure times.

In an embodiment, sample signal 618(0) and sample signal 618(1) may be asserted to an active state independently.

In one embodiment, the photosensitive cell 600 may be configured such that the first analog sampling circuit 603(0) and the second analog sampling circuit 603(1) share at least one shared component. In various embodiments, the at least one shared component may include a photodiode 602 of an image sensor. In other embodiments, the at least one shared component may include a reset, such that the first analog sampling circuit 603(0) and the second analog sampling circuit 603(1) may be reset concurrently utilizing the shared reset. In the context of FIG. 6A, the photosensitive cell 600 may include a shared reset between the analog sampling circuits 603(0) and 603(1). For example, reset 616(0) may be coupled to reset 616(1), and both may be asserted together such that the reset 616(0) is the same signal as the reset 616(1), which may be used to simultaneously reset both of the first analog sampling circuit 603(0) and the second analog sampling circuit 603(1). After reset, the first analog sampling circuit 603(0) and the second analog sampling circuit 603(1) may be asserted to sample independently.

In one embodiment, a sample signal 618(0) for the first analog sampling circuit 603(0) may be independent of a sample signal 618(1) for the second analog sampling circuit 603(1). In one embodiment, a row select 634(0) for the first analog sampling circuit 603(0) may be independent of a row select 634(1) for the second analog sampling circuit 603(1). In other embodiments, the row select 634(0) for the first analog sampling circuit 603(0) may include a row select signal that is shared with the row select 634(1) for the second analog sampling circuit 603(1). In yet another embodiment, output signal at output 608(0) of the first analog sampling circuit 603(0) may be independent of output signal at output 608(1) of the second analog sampling circuit 603(1). In another embodiment, the output signal of the first analog sampling circuit 603(0) may utilize an output shared with the output signal of the second analog sampling circuit 603(1). In embodiments sharing an output, it may be necessary for the row select 634(0) of the first analog sampling circuit 603(0) to be independent of the row select 634(1) of the second analog sampling circuit 603(1). In embodiments sharing a row select signal, it may be necessary for a line of the output 608(0) of the first analog sampling circuit 603(0) to be independent of a line of the output 608(1) of the second analog sampling circuit 603(1).

In one embodiment, a column signal 532 of FIG. 5A may comprise one output signal of a plurality of independent output signals of the outputs 608(0) and 608(1). Further, a row control signal 530 of FIG. 5A may comprise one of independent row select signals of the row selects 634(0) and 634(1), which may be shared for a given row of pixels. In embodiments of cell 600 that implement a shared row select signal, the row select 634(0) may be coupled to the row select 634(1), and both may be asserted together simultaneously.

In an embodiment, a given row of pixels may include one or more rows of cells, where each row of cells includes multiple instances of the photosensitive cell 600, such that each row of cells includes multiple pairs of analog sampling circuits 603(0) and 603(1). For example, a given row of cells may include a plurality of first analog sampling circuits 603(0), and may further include a different second analog sampling circuit 603(1) paired to each of the first analog sampling circuits 603(0). In one embodiment, the plurality of first analog sampling circuits 603(0) may be driven independently from the plurality of second analog sampling circuits 603(1). In another embodiment, the plurality of first analog sampling circuits 603(0) may be driven in parallel with the plurality of second analog sampling circuits 603(1). For example, each output 608(0) of each of the first analog sampling circuits 603(0) of the given row of cells may be driven in parallel through one set of column signals 532. Further, each output 608(1) of each of the second analog sampling circuits 603(1) of the given row of cells may be driven in parallel through a second, parallel, set of column signals 532.

To this end, the photosensitive cell 600 may be utilized to simultaneously store both of an ambient sample and a flash sample based on the incident light 601. Specifically, the ambient sample may be captured and stored on a first capacitor during a first exposure time, and the flash sample may be captured and stored on a second capacitor during a second exposure time. Further, during this second exposure time, a strobe may be activated for temporarily increasing illumination of a photographic scene, and increasing the incident light measured at one or more photodiodes of an image sensor during the second exposure time.

Further, an output current signal corresponding to the ambient sample of the two different samples may be coupled to output 608(0) when row select 634(0) is activated, and an output current signal corresponding to the flash sample of the two different samples may be coupled to output 608(1) when row select 634(1) is activated.

In one embodiment, the first value may be included in an ambient analog signal containing first analog pixel data for a plurality of pixels at the first exposure time, and the second value may be included in a flash analog signal containing second analog pixel data for the plurality of pixels at the second exposure time. Further, the ambient analog signal may be utilized to generate a stack of one or more digital images captured using ambient illumination, and the flash analog signal may be utilized to generate a stack of one or more digital images captured using flash illumination. Accordingly, an array of photosensitive cells 600 may be utilized for near-simultaneous capture of ambient and strobe illuminated digital images.

FIG. 6B illustrates a system for converting analog pixel data to digital pixel data, in accordance with an embodiment. As an option, the system of FIG. 6B may be implemented in the context of the details of any of the Figures disclosed herein. Of course, however, the system of FIG. 6B may be implemented in any desired environment. Further, the aforementioned definitions may equally apply to the description below.

As shown in FIG. 6B, analog pixel data 621 is received from column read out circuit 520 at analog-to-digital unit 622 under the control of control unit 514. The analog pixel data 621 may be received within an analog signal, as noted hereinabove. Further, the analog-to-digital unit 622 generates digital pixel data 625 based on the received analog pixel data 621.

In one embodiment, a unique instance of analog pixel data 621 may include, as an ordered set of individual analog values, all analog values output from all corresponding analog sampling circuits or sample storage nodes. For example, in the context of the foregoing figures, each cell of cells 542-545 of a plurality of pixels 540 of a pixel array 510 may include both a first analog sampling circuit 603(0) and a second analog sampling circuit 603(1). Thus, the pixel array 510 may include a plurality of first analog sampling circuits 603(0) and also include a plurality of second analog sampling circuits 603(1). In other words, the pixel array 510 may include a first analog sampling circuit 603(0) for each cell, and also include a second analog sampling circuit 603(1) for each cell. In an embodiment, a first instance of analog pixel data 621 may be received containing a discrete analog value from each analog sampling circuit of a plurality of first analog sampling circuits 603(0), and a second instance of analog pixel data 621 may be received containing a discrete analog value from each analog sampling circuit of a plurality of second analog sampling circuits 603(1). Thus, in embodiments where cells of a pixel array include two or more analog sampling circuits, the pixel array may output two or more discrete analog signals, where each analog signal includes a unique instance of analog pixel data 621.

Further, each of the first analog sampling circuits 603(0) may sample a photodiode current during a first exposure time, during which a photographic scene is illuminated with ambient light; and each of the second sampling circuits 603(1) may sample the photodiode current during a second exposure time, during which the photographic scene is illuminated with a strobe or flash. Accordingly, a first analog signal, or ambient analog signal, may include analog values representative of the photographic scene when illuminated with ambient light; and a second analog signal, or flash analog signal, may include analog values representative of the photographic scene when illuminated with the strobe or flash.

In some embodiments, only a subset of the cells of a pixel array may include two or more analog sampling circuits. For example, not every cell may include both a first analog sampling circuit 603(0) and a second analog sampling circuit 603(1).

With continuing reference to FIG. 6B, the analog-to-digital unit 622 includes an amplifier 650 and an analog-to-digital converter 654. In one embodiment, the amplifier 650 receives an instance of analog pixel data 621 and a gain 652, and applies the gain 652 to the analog pixel data 621 to generate gain-adjusted analog pixel data 623. The gain-adjusted analog pixel data 623 is transmitted from the amplifier 650 to the analog-to-digital converter 654. The analog-to-digital converter 654 receives the gain-adjusted analog pixel data 623, and converts the gain-adjusted analog pixel data 623 to the digital pixel data 625, which is then transmitted from the analog-to-digital converter 654. In other embodiments, the amplifier 650 may be implemented within the column read out circuit 520 instead of within the analog-to-digital unit 622. The analog-to-digital converter 654 may convert the gain-adjusted analog pixel data 623 to the digital pixel data 625 using any technically feasible analog-to-digital conversion technique.

In an embodiment, the gain-adjusted analog pixel data 623 results from the application of the gain 652 to the analog pixel data 621. In one embodiment, the gain 652 may be selected by the analog-to-digital unit 622. In another embodiment, the gain 652 may be selected by the control unit 514, and then supplied from the control unit 514 to the analog-to-digital unit 622 for application to the analog pixel data 621.

It should be noted, in one embodiment, that a consequence of applying the gain 652 to the analog pixel data 621 is that analog noise may appear in the gain-adjusted analog pixel data 623. If the amplifier 650 imparts a significantly large gain to the analog pixel data 621 in order to obtain highly sensitive data from of the pixel array 510, then a significant amount of noise may be expected within the gain-adjusted analog pixel data 623. In one embodiment, the detrimental effects of such noise may be reduced by capturing the optical scene information at a reduced overall exposure. In such an embodiment, the application of the gain 652 to the analog pixel data 621 may result in gain-adjusted analog pixel data with proper exposure and reduced noise.

In one embodiment, the amplifier 650 may be a transimpedance amplifier (TIA). Furthermore, the gain 652 may be specified by a digital value. In one embodiment, the digital value specifying the gain 652 may be set by a user of a digital photographic device, such as by operating the digital photographic device in a "manual" mode. Still yet, the digital value may be set by hardware or software of a digital photographic device. As an option, the digital value may be set by the user working in concert with the software of the digital photographic device.

In one embodiment, a digital value used to specify the gain 652 may be associated with an ISO. In the field of photography, the ISO system is a well-established standard for specifying light sensitivity. In one embodiment, the amplifier 650 receives a digital value specifying the gain 652 to be applied to the analog pixel data 621. In another embodiment, there may be a mapping from conventional ISO values to digital gain values that may be provided as the gain 652 to the amplifier 650. For example, each of ISO 100, ISO 200, ISO 400, ISO 800, ISO 1600, etc. may be uniquely mapped to a different digital gain value, and a selection of a particular ISO results in the mapped digital gain value being provided to the amplifier 650 for application as the gain 652. In one embodiment, one or more ISO values may be mapped to a gain of 1. Of course, in other embodiments, one or more ISO values may be mapped to any other gain value.

Accordingly, in one embodiment, each analog pixel value may be adjusted in brightness given a particular ISO value. Thus, in such an embodiment, the gain-adjusted analog pixel data 623 may include brightness corrected pixel data, where the brightness is corrected based on a specified ISO. In another embodiment, the gain-adjusted analog pixel data 623 for an image may include pixels having a brightness in the image as if the image had been sampled at a certain ISO.

In accordance with an embodiment, the digital pixel data 625 may comprise a plurality of digital values representing pixels of an image captured using the pixel array 510.

In one embodiment, an instance of digital pixel data 625 may be output for each instance of analog pixel data 621 received. Thus, where a pixel array 510 includes a plurality of first analog sampling circuits 603(0) and also includes a plurality of second analog sampling circuits 603(1), then a first instance of analog pixel data 621 may be received containing a discrete analog value from each of the first analog sampling circuits 603(0) and a second instance of analog pixel data 621 may be received containing a discrete analog value from each of the second analog sampling circuits 603(1). In such an embodiment, a first instance of digital pixel data 625 may be output based on the first instance of analog pixel data 621, and a second instance of digital pixel data 625 may be output based on the second instance of analog pixel data 621.

Further, the first instance of digital pixel data 625 may include a plurality of digital values representing pixels of a first image captured during a first exposure time using the plurality of first analog sampling circuits 603(0) of the pixel array 510, and the second instance of digital pixel data 625 may include a plurality of digital values representing pixels of a second image captured during a second exposure time using the plurality of second analog sampling circuits 603(1) of the pixel array 510. Where the first instance of digital pixel data 625 and the second instance of digital pixel data 625 are generated utilizing the same gain 652, then any differences between the instances of digital pixel data may be a function of a difference between the first exposure time and the second exposure time.

In some embodiments, two or more gains 652 may be applied to an instance of analog pixel data 621, such that two or more instances of digital pixel data 625 may be output for each instance of analog pixel data 621. For example, two or more gains may be applied to both of a first instance of analog pixel data 621 and a second instance of analog pixel data 621. In such an embodiment, the first instance of analog pixel data 621 may contain a discrete analog value from each of a plurality of first analog sampling circuits 603(0) of a pixel array 510, and the second instance of analog pixel data 621 may contain a discrete analog value from each of a plurality of second analog sampling circuits 603(1) of the pixel array 510. Thus, four or more instances of digital pixel data 625 associated with four or more corresponding digital images may be generated for a photographic scene by the pixel array 510.

Figure 7:
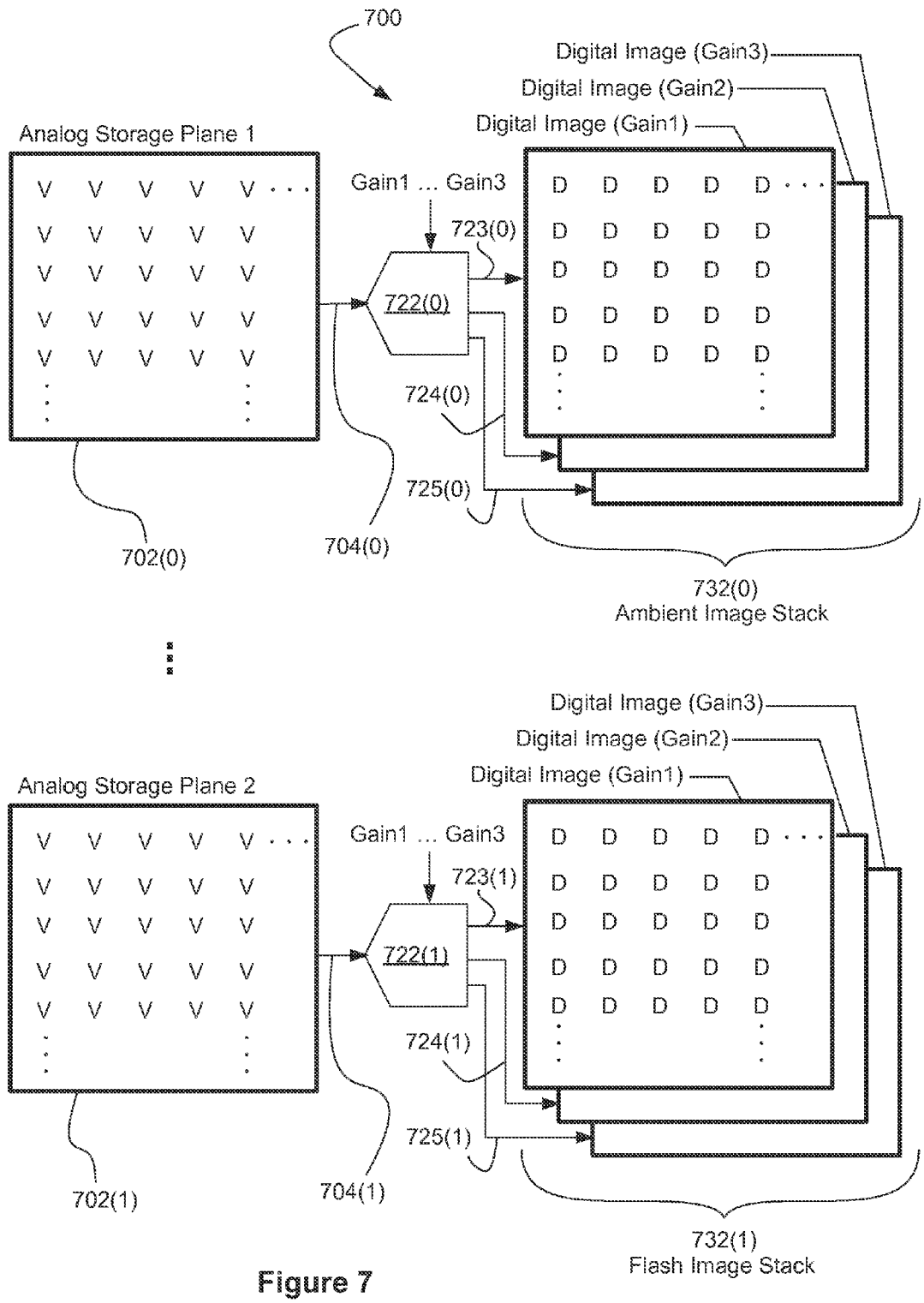
FIG. 7 illustrates a system for converting analog pixel data of more than one analog signal to digital pixel data, in accordance with another embodiment.

FIG. 7 illustrates a system 700 for converting analog pixel data of an analog signal to digital pixel data, in accordance with an embodiment. As an option, the system 700 may be implemented in the context of the details of any of the Figures disclosed herein. Of course, however, the system 700 may be implemented in any desired environment. Further, the aforementioned definitions may equally apply to the description below.

The system 700 is shown in FIG. 7 to include a first analog storage plane 702(0), a first analog-to-digital unit 722(0), and an ambient digital image stack 732(0), and is shown to further include a second analog storage plane 702(1), a second analog-to-digital unit 722(1), and a flash digital image stack 732(1). Accordingly, the system 700 is shown to include at least two analog storage planes 702(0) and 702(1). As illustrated in FIG. 7, a plurality of analog values are each depicted as a "V" within each of the analog storage planes 702, and corresponding digital values are each depicted as a "D" within digital images of each of the image stacks 732. In one embodiment, all of the analog values of the first analog storage plane 702(0) are captured during a first exposure time, during which a photographic scene was illuminated with ambient light; and all of the analog values of the second analog storage plane 702(1) are captured during a second exposure time, during which the photographic scene was illuminated using a strobe or flash.

In the context of certain embodiments, each analog storage plane 702 may comprise any collection of one or more analog values. In some embodiments, each analog storage plane 702 may comprise at least one analog pixel value for each pixel of a row or line of a pixel array. Still yet, in another embodiment, each analog storage plane 702 may comprise at least one analog pixel value for each pixel of an entirety of a pixel array, which may be referred to as a frame. For example, each analog storage plane 702 may comprise an analog pixel value, or more generally, an analog value for each cell of each pixel of every line or row of a pixel array.

Further, the analog values of each analog storage plane 702 are output as analog pixel data 704 to a corresponding analog-to-digital unit 722. For example, the analog values of analog storage plane 702(0) are output as analog pixel data 704(0) to analog-to-digital unit 722(0), and the analog values of analog storage plane 702(1) are output as analog pixel data 704(1) to analog-to-digital unit 722(1). In one embodiment, each analog-to-digital unit 722 may be substantially identical to the analog-to-digital unit 622 described within the context of FIG. 6B. For example, each analog-to-digital unit 722 may comprise at least one amplifier and at least one analog-to-digital converter, where the amplifier is operative to receive a gain value and utilize the gain value to gain-adjust analog pixel data received at the analog-to-digital unit 722. Further, in such an embodiment, the amplifier may transmit gain-adjusted analog pixel data to an analog-to-digital converter, which then generates digital pixel data from the gain-adjusted analog pixel data. To this end, an analog-to-digital conversion may be performed on the contents of each of two or more different analog storage planes 702.

In the context of the system 700 of FIG. 7, each analog-to-digital unit 722 receives corresponding analog pixel data 704, and applies at least two different gains to the received analog pixel data 704 to generate at least a first gain-adjusted analog pixel data and a second gain-adjusted analog pixel data. For example, the analog-to-digital unit 722(0) receives analog pixel data 704(0), and applies at least two different gains to the analog pixel data 704(0) to generate at least a first gain-adjusted analog pixel data and a second gain-adjusted analog pixel data based on the analog pixel data 704(0); and the analog-to-digital unit 722(1) receives analog pixel data 704(1), and applies at least two different gains to the analog pixel data 704(1) to generate at least a first gain-adjusted analog pixel data and a second gain-adjusted analog pixel data based on the analog pixel data 704(1).

Further, each analog-to-digital unit 722 converts each generated gain-adjusted analog pixel data to digital pixel data, and then outputs at least two digital outputs. In one embodiment, each analog-to-digital unit 722 provides a different digital output corresponding to each gain applied to the received analog pixel data 704. With respect to FIG. 7 specifically, the analog-to-digital unit 722(0) is shown to generate a first digital signal comprising first digital pixel data 723(0) corresponding to a first gain (Gain1), a second digital signal comprising second digital pixel data 724(0) corresponding to a second gain (Gain2), and a third digital signal comprising third digital pixel data 725(0) corresponding to a third gain (Gain3). Similarly, the analog-to-digital unit 722(1) is shown to generate a first digital signal comprising first digital pixel data 723(1) corresponding to a first gain (Gain1), a second digital signal comprising second digital pixel data 724(1) corresponding to a second gain (Gain2), and a third digital signal comprising third digital pixel data 725(1) corresponding to a third gain (Gain3). Each instance of each digital pixel data may comprise a digital image, such that each digital signal comprises a digital image.

Accordingly, as a result of the analog-to-digital unit 722(0) applying each of Gain1, Gain2, and Gain3 to the analog pixel data 704(0), and thereby generating first digital pixel data 723(0), second digital pixel data 724(0), and third digital pixel data 725(0), the analog-to-digital unit 722(0) generates a stack of digital images, also referred to as an ambient image stack 732(0). Similarly, as a result of the analog-to-digital unit 722(1) applying each of Gain1, Gain2, and Gain3 to the analog pixel data 704(1), and thereby generating first digital pixel data 723(1), second digital pixel data 724(1), and third digital pixel data 725(1), the analog-to-digital unit 722(1) generates a second stack of digital images, also referred to as a flash image stack 732(1). Each of the digital images of the ambient image stack 732(0) may be a digital image of the photographic scene captured with ambient illumination during a first exposure time. Each of the digital images of the flash image stack 732(1) may be a digital image of the photographic scene captured with strobe or flash illumination during a second exposure time.

In one embodiment, each analog-to-digital unit 722 applies in sequence at least two gains to the analog values. For example, within the context of FIG. 7, the analog-to-digital unit 722(0) first applies Gain1 to the analog pixel data 704(0), then subsequently applies Gain2 to the same analog pixel data 704(0), and then subsequently applies Gain3 to the same analog pixel data 704(0). In other embodiments, each analog-to-digital unit 722 may apply in parallel at least two gains to the analog values. For example, an analog-to-digital unit may apply Gain1 to received analog pixel data in parallel with application of Gain2 and Gain3 to the analog pixel data. To this end, each instance of analog pixel data 704 is amplified utilizing at least two gains.

In one embodiment, the gains applied to the analog pixel data 704(0) at the analog-to-digital unit 722(0) may be the same as the gains applied to the analog pixel data 704(1) at the analog-to-digital unit 722(1). By way of a specific example, the Gain1 applied by both of the analog-to-digital unit 722(0) and the analog-to-digital unit 722(1) may be a gain of 1.0, the Gain2 applied by both of the analog-to-digital unit 722(0) and the analog-to-digital unit 722(1) may be a gain of 2.0, and the Gain3 applied by both of the analog-to-digital unit 722(0) and the analog-to-digital unit 722(1) may be a gain of 4.0. In another embodiment, one or more of the gains applied to the analog pixel data 704(0) at the analog-to-digital unit 722(0) may be different from the gains applied to the analog pixel data 704(1) at the analog-to-digital unit 722(1). For example, the Gain1 applied at the analog-to-digital unit 722(0) may be a gain of 1.0, and the Gain1 applied at the analog-to-digital unit 722(1) may be a gain of 2.0. Accordingly, the gains applied at each analog-to-digital unit 722 may be selected dependently or independently of the gains applied at other analog-to-digital units 722 within system 700.

In accordance with one embodiment, the at least two gains may be determined using any technically feasible technique based on an exposure of a photographic scene, metering data, user input, detected ambient light, a strobe control, or any combination of the foregoing. For example, a first gain of the at least two gains may be determined such that half of the analog values from an analog storage plane 702 are converted to digital values above a specified threshold (e.g., a threshold of 0.5 in a range of 0.0 to 1.0) for the dynamic range associated with digital values comprising a first digital image of an image stack 732, which can be characterized as having an "EV0" exposure. Continuing the example, a second gain of the at least two gains may be determined as being twice that of the first gain to generate a second digital image of the image stack 732 characterized as having an "EV+1" exposure. Further still, a third gain of the at least two gains may be determined as being half that of the first gain to generate a third digital image of the image stack 732 characterized as having an "EV−1" exposure.

In one embodiment, an analog-to-digital unit 722 converts in sequence a first instance of the gain-adjusted analog pixel data to the first digital pixel data 723, a second instance of the gain-adjusted analog pixel data to the second digital pixel data 724, and a third instance of the gain-adjusted analog pixel data to the third digital pixel data 725. For example, an analog-to-digital unit 722 may first convert a first instance of the gain-adjusted analog pixel data to first digital pixel data 723, then subsequently convert a second instance of the gain-adjusted analog pixel data to second digital pixel data 724, and then subsequently convert a third instance of the gain-adjusted analog pixel data to third digital pixel data 725. In other embodiments, an analog-to-digital unit 722 may perform such conversions in parallel, such that one or more of a first digital pixel data 723, a second digital pixel data 724, and a third digital pixel data 725 are generated in parallel.

Still further, as shown in FIG. 7, each first digital pixel data 723 provides a first digital image. Similarly, each second digital pixel data 724 provides a second digital image, and each third digital pixel data 725 provides a third digital image. Together, each set of digital images produced using the analog values of a single analog storage plane 702 comprises an image stack 732. For example, ambient image stack 732(0) comprises digital images produced using analog values of the analog storage plane 702(0), and flash image stack 732(1) comprises the digital images produced using the analog values of the analog storage plane 702(1). As noted previously, each of the digital images of the ambient image stack 732(0) may be a digital image of the photographic scene captured with ambient illumination during a first exposure time. Similarly, each of the digital images of the flash image stack 732(1) may be a digital image of the photographic scene captured with strobe or flash illumination during a second exposure time.

As illustrated in FIG. 7, all digital images of an image stack 732 may be based upon a same analog pixel data 704. However, each digital image of an image stack 732 may differ from other digital images in the image stack 732 as a function of a difference between the gains used to generate the two digital images. Specifically, a digital image generated using the largest gain of at least two gains may be visually perceived as the brightest or more exposed of the digital images of the image stack 732. Conversely, a digital image generated using the smallest gain of the at least two gains may be visually perceived as the darkest and less exposed than other digital images of the image stack 732. To this end, a first light sensitivity value may be associated with first digital pixel data 723, a second light sensitivity value may be associated with second digital pixel data 724, and a third light sensitivity value may be associated with third digital pixel data 725.

Further, because each of the gains may be associated with a different light sensitivity value, a first digital image or first digital signal may be associated with a first light sensitivity value, a second digital image or second digital signal may be associated with a second light sensitivity value, and a third digital image or third digital signal may be associated with a third light sensitivity value. In one embodiment, one or more digital images of an image stack may be blended, resulting in a blended image associated with a blended light sensitivity.

It should be noted that while a controlled application of gain to the analog pixel data may greatly aid in HDR image generation, an application of too great of gain may result in a digital image that is visually perceived as being noisy, overexposed, and/or blown-out. In one embodiment, application of two stops of gain to the analog pixel data may impart visually perceptible noise for darker portions of a photographic scene, and visually imperceptible noise for brighter portions of the photographic scene. In another embodiment, a digital photographic device may be configured to provide an analog storage plane for analog pixel data of a captured photographic scene, and then perform at least two analog-to-digital samplings of the same analog pixel data using an analog-to-digital unit 722. To this end, a digital image may be generated for each sampling of the at least two samplings, where each digital image is obtained at a different exposure despite all the digital images being generated from the same analog sampling of a single optical image focused on an image sensor.

In one embodiment, an initial exposure parameter may be selected by a user or by a metering algorithm of a digital photographic device. The initial exposure parameter may be selected based on user input or software selecting particular capture variables. Such capture variables may include, for example, ISO, aperture, and shutter speed. An image sensor may then capture a photographic scene at the initial exposure parameter during a first exposure time, and populate a first analog storage plane with a first plurality of analog values corresponding to an optical image focused on the image sensor. Next, during a second exposure time, a second analog storage plane may be populated with a second plurality of analog values corresponding to the optical image focused on the image sensor. During the second exposure time, a strobe or flash unit may be utilized to illuminate at least a portion of the photographic scene. In the context of the foregoing Figures, a first analog storage plane 702(0) comprising a plurality of first analog sampling circuits 603(0) may be populated with a plurality of analog values associated with an ambient capture, and a second analog storage plane 702(1) comprising a plurality of second analog sampling circuits 603(1) may be populated with a plurality of analog values associated with a flash or strobe capture.

In other words, in an embodiment where each photosensitive cell includes two analog sampling circuits, then two analog storage planes may be configured such that a first of the analog storage planes stores a first analog value output from one of the analog sampling circuits of a cell, and a second of the analog storage planes stores a second analog value output from the other analog sampling circuit of the same cell.

Further, each of the analog storage planes may receive and store different analog values for a given pixel of the pixel array or image sensor. For example, an analog value received for a given pixel and stored in a first analog storage plane may be output based on an ambient sample captured during a first exposure time, and a corresponding analog value received for the given pixel and stored in a second analog storage plane may be output based on a flash sample captured during a second exposure time that is different than the first exposure time. Accordingly, in one embodiment, substantially all analog values stored in a first analog storage plane may be based on samples obtained during a first exposure time, and substantially all analog values stored in a second analog storage plane may be based on samples obtained during a second exposure time that is different than the first exposure time.

In the context of the present description, a "single exposure" of a photographic scene may include simultaneously, at least in part, storing analog values representative of the photographic scene using two or more sets of analog sampling circuits, where each set of analog sampling circuits may be configured to operate at different exposure times. During capture of the photographic scene using the two or more sets of analog sampling circuits, the photographic scene may be illuminated by ambient light during a first exposure time, and by a flash or strobe unit during a second exposure time. Further, after capturing the photographic scene using the two or more sets of analog sampling circuits, two or more analog storage planes (e.g., one storage plane for each set of analog sampling circuits) may be populated with analog values corresponding to an optical image focused on an image sensor. Next, one or more digital images of an ambient image stack may be obtained by applying one or more gains to the analog values of the first analog storage plane captured during the first exposure time, in accordance with the above systems and methods. Further, one or more digital images of a flash image stack may be obtained by applying one or more gains to the analog values of the second analog storage plane captured during the second exposure time, in accordance with the above systems and methods.

To this end, one or more image stacks 732 may be generated based on a single exposure of a photographic scene.

In one embodiment, a first digital image of an image stack 732 may be obtained utilizing a first gain in accordance with the above systems and methods. For example, if a digital photographic device is configured such that initial exposure parameter includes a selection of ISO 400, the first gain utilized to obtain the first digital image may be mapped to, or otherwise associated with, ISO 400. This first digital image may be referred to as an exposure or image obtained at exposure value 0 (EV0). Further one more digital images may be obtained utilizing a second gain in accordance with the above systems and methods. For example, the same analog pixel data used to generate the first digital image may be processed utilizing a second gain to generate a second digital image. Still further, one or more digital images may be obtained utilizing a second analog storage plane in accordance with the above systems and methods. For example, second analog pixel data may be used to generate a second digital image, where the second analog pixel data is different from the analog pixel data used to generate the first digital image. Specifically, the analog pixel data used to generate the first digital image may have been captured during a first exposure time, and the second analog pixel data may have been captured during a second exposure time different than the first exposure time.

To this end, at least two digital images may be generated utilizing different analog pixel data, and then blended to generate an HDR image. The at least two digital images may be blended by blending a first digital signal and a second digital signal. Where the at least two digital images are generated using different analog pixel data captured during a single exposure of a photographic scene, then there may be approximately, or near, zero interframe time between the at least two digital images. As a result of having zero, or near zero, interframe time between at least two digital images of a same photographic scene, an HDR image may be generated, in one possible embodiment, without motion blur or other artifacts typical of HDR photographs.

In one embodiment, after selecting a first gain for generating a first digital image of an image stack 732, a second gain may be selected based on the first gain. For example, the second gain may be selected on the basis of it being one stop away from the first gain. More specifically, if the first gain is mapped to or associated with ISO 400, then one stop down from ISO 400 provides a gain associated with ISO 200, and one stop up from ISO 400 provides a gain associated with ISO 800. In such an embodiment, a digital image generated utilizing the gain associated with ISO 200 may be referred to as an exposure or image obtained at exposure value −1 (EV−1), and a digital image generated utilizing the gain associated with ISO 800 may be referred to as an exposure or image obtained at exposure value+1 (EV+1).

Still further, if a more significant difference in exposures is desired between digital images generated utilizing the same analog signal, then the second gain may be selected on the basis of it being two stops away from the first gain. For example, if the first gain is mapped to or associated with ISO 400, then two stops down from ISO 400 provides a gain associated with ISO 100, and two stops up from ISO 400 provides a gain associated with ISO 1600. In such an embodiment, a digital image generated utilizing the gain associated with ISO 100 may be referred to as an exposure or image obtained at exposure value −2 (EV−2), and a digital image generated utilizing the gain associated with ISO 1600 may be referred to as an exposure or image obtained at exposure value+2 (EV+2).

In one embodiment, an ISO and exposure of the EV0 image may be selected according to a preference to generate darker digital images. In such an embodiment, the intention may be to avoid blowing out or overexposing what will be the brightest digital image, which is the digital image generated utilizing the greatest gain. In another embodiment, an EV−1 digital image or EV−2 digital image may be a first generated digital image. Subsequent to generating the EV−1 or EV−2 digital image, an increase in gain at an analog-to-digital unit may be utilized to generate an EV0 digital image, and then a second increase in gain at the analog-to-digital unit may be utilized to generate an EV+1 or EV+2 digital image. In one embodiment, the initial exposure parameter corresponds to an EV−N digital image and subsequent gains are used to obtain an EV0 digital image, an EV+M digital image, or any combination thereof, where N and M are values ranging from 0 to −10.

In one embodiment, three digital images having three different exposures (e.g. an EV−2 digital image, an EV0 digital image, and an EV+2 digital image) may be generated in parallel by implementing three analog-to-digital units. Each analog-to-digital unit may be configured to convert one or more analog signal values to corresponding digital signal values. Such an implementation may be also capable of simultaneously generating all of an EV−1 digital image, an EV0 digital image, and an EV+1 digital image. Similarly, in other embodiments, any combination of exposures may be generated in parallel from two or more analog-to-digital units, three or more analog-to-digital units, or an arbitrary number of analog-to-digital units. In other embodiments, a set of analog-to-digital units may be configured to each operate on either of two or more different analog storage planes.

Figure 8:
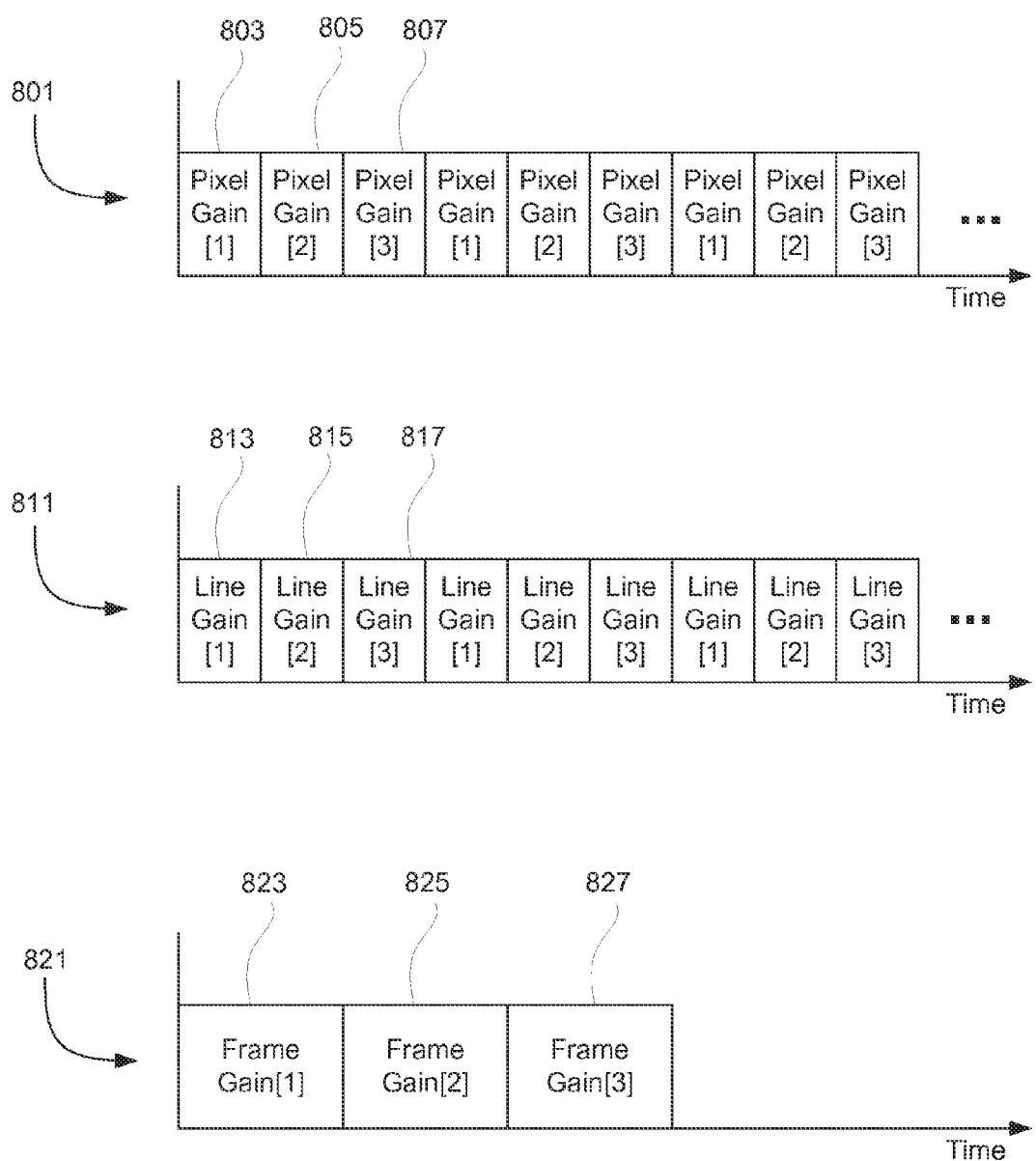
FIG. 8 illustrates various timing configurations for amplifying analog signals, in accordance with other embodiments.

FIG. 8 illustrates various timing configurations for amplifying analog signals, in accordance with various embodiments. As an option, the timing configurations of FIG. 8 may be implemented in the context of the details of any of the Figures disclosed herein. Of course, however, the timing configurations of FIG. 8 may be carried out in any desired environment. Further, the aforementioned definitions may equally apply to the description below.

Specifically, as shown in FIG. 8, per pixel timing configuration 801 is shown to amplify analog signals on a pixel-by-pixel basis. Further, per line timing configuration 811 is shown to amplify analog signals on a line-by-line basis. Finally, per frame timing configuration 821 is shown to amplify analog signals on a frame-by-frame basis. Each amplified analog signal associated with analog pixel data may be converted to a corresponding digital signal value.

In systems that implement per pixel timing configuration 801, an analog signal containing analog pixel data may be received at an analog-to-digital unit. Further, the analog pixel data may include individual analog pixel values. In such an embodiment, a first analog pixel value associated with a first pixel may be identified within the analog signal and selected. Next, each of a first gain 803, a second gain 805, and a third gain 807 may be applied in sequence or concurrently to the same first analog pixel value. In some embodiments less than or more than three different gains may be applied to a selected analog pixel value. For example, in some embodiments applying only two different gains to the same analog pixel value may be sufficient for generating a satisfactory HDR image. In one embodiment, after applying each of the first gain 803, the second gain 805, and the third gain 807, a second analog pixel value associated with a second pixel may be identified within the analog signal and selected. The second pixel may be a neighboring pixel of the first pixel. For example, the second pixel may be in a same row as the first pixel and located adjacent to the first pixel on a pixel array of an image sensor. Next, each of the first gain 803, the second gain 805, and the third gain 807 may be applied in sequence or concurrently to the same second analog pixel value. To this end, in the per pixel timing configuration 801, a plurality of sequential analog pixel values may be identified within an analog signal, and a set of at least two gains are applied to each pixel in the analog signal on a pixel-by-pixel basis.

Further, in systems that implement the per pixel timing configuration 801, a control unit may select a next gain to be applied after each pixel is amplified using a previously selected gain. In another embodiment, a control unit may control an amplifier to cycle through a set of predetermined gains that will be applied to a first analog pixel value, such as a first analog pixel data value comprising analog pixel data 704, associated with a first pixel so that each gain in the set may be used to amplify the first analog pixel data before applying the set of predetermined gains to a second analog pixel data that subsequently arrives at the amplifier. In one embodiment, and as shown in the context of FIG. 8, this may include selecting a first gain, applying the first gain to a received first analog pixel value, selecting a second gain, applying the second gain to the received first analog pixel value, selecting a third gain, applying the third selected gain to the received first analog pixel value, and then receiving a second analog pixel value and applying the three selected gains to the second pixel value in the same order as applied to the first pixel value. In one embodiment, each analog pixel value may be read a plurality of times. In general, an analog storage plane may be utilized to hold the analog pixel values of the pixels for reading.

In systems that implement per line timing configuration 811, an analog signal containing analog pixel data may be received at an analog-to-digital unit. Further, the analog pixel data may include individual analog pixel values. In one embodiment, a first line of analog pixel values associated with a first line of pixels of a pixel array may be identified within the analog signal and selected. Next, each of a first gain 813, a second gain 815, and a third gain 817 may be applied in sequence or concurrently to the same first line of analog pixel values. In some embodiments less than or more than three different gains may be applied to a selected line of analog pixel values. For example, in some embodiments applying only two different gains to the same line of analog pixel values may be sufficient for generating a satisfactory HDR image. In one embodiment, after applying each of the first gain 813, the second gain 815, and the third gain 817, a second line of analog pixel values associated with a second line of pixels may be identified within the analog signal and selected. The second line of pixels may be a neighboring line of the first line of pixels. For example, the second line of pixels may be located immediately above or immediately below the first line of pixels in a pixel array of an image sensor. Next, each of the first gain 813, the second gain 815, and the third gain 817 may be applied in sequence or concurrently to the same second line of analog pixel values. To this end, in the per line timing configuration 811, a plurality of sequential lines of analog pixel values are identified within an analog signal, and a set of at least two gains are applied to each line of analog pixel values in the analog signal on a line-by-line basis.

Further, in systems that implement the per line timing configuration 811, a control unit may select a next gain to be applied after each line is amplified using a previously selected gain. In another embodiment, a control unit may control an amplifier to cycle through a set of predetermined gains that will be applied to a line so that each gain in the set is used to amplify a first line of analog pixel values before applying the set of predetermined gains to a second line of analog pixel values that arrives at the amplifier subsequent to the first line of analog pixel values. In one embodiment, and as shown in the context of FIG. 8, this may include selecting a first gain, applying the first gain to a received first line of analog pixel values, selecting a second gain, applying the second gain to the received first line of analog pixel values, selecting a third gain, applying the third selected gain to the received first line of analog pixel values, and then receiving a second line of analog pixel values and applying the three selected gains to the second line of analog pixel values in the same order as applied to the first line of analog pixel values. In one embodiment, each line of analog pixel values may be read a plurality of times. In another embodiment, an analog storage plane may be utilized to hold the analog pixel data values of one or more lines for reading.

In systems that implement per frame timing configuration 821, an analog signal that contains a plurality of analog pixel data values comprising analog pixel values may be received at an analog-to-digital unit. In such an embodiment, a first frame of analog pixel values associated with a first frame of pixels may be identified within the analog signal and selected. Next, each of a first gain 823, a second gain 825, and a third gain 827 may be applied in sequence or concurrently to the same first frame of analog pixel values. In some embodiments less than or more than three different gains may be applied to a selected frame of analog pixel values. For example, in some embodiments applying only two different gains to the same frame of analog pixel values may be sufficient for generating a satisfactory HDR image.

In one embodiment, after applying each of the first gain 823, the second gain 825, and the third gain 827, a second frame of analog pixel values associated with a second frame of pixels may be identified within the analog signal and selected. The second frame of pixels may be a next frame in a sequence of frames that capture video data associated with a photographic scene. For example, a digital photographic system may be operative to capture 30 frames per second of video data. In such digital photographic systems, the first frame of pixels may be one frame of said thirty frames, and the second frame of pixels may be a second frame of said thirty frames. Further still, each of the first gain 823, the second gain 825, and the third gain 827 may be applied in sequence to the analog pixel values of the second frame. To this end, in the per frame timing configuration 821, a plurality of sequential frames of analog pixel values may be identified within an analog signal, and a set of at least two gains are applied to each frame of analog pixel values on a frame-by-frame basis.

Further, in systems that implement the per frame timing configuration 821, a control unit may select a next gain to be applied after each frame is amplified using a previously selected gain. In another embodiment, a control unit may control an amplifier to cycle through a set of predetermined gains that will be applied to a frame so that each gain is used to amplify a analog pixel values associated with the first frame before applying the set of predetermined gains to analog pixel values associated with a second frame that subsequently arrive at the amplifier. In one embodiment, and as shown in the context of FIG. 8, this may include selecting a first gain, applying the first gain to analog pixel values associated with the first frame, selecting a second gain, applying the second gain to analog pixel values associated with the first frame, selecting a third gain, and applying the third gain to analog pixel values associated with the first frame. In another embodiment, analog pixel values associated with a second frame may be received following the application of all three selected gains to analog pixel values associated with the first frame, and the three selected gains may then be applied to analog pixel values associated with the second frame in the same order as applied to the first frame.

In yet another embodiment, selected gains applied to the first frame may be different than selected gains applied to the second frame, such as may be the case when the second frame includes different content and illumination than the first frame. In general, an analog storage plane may be utilized to hold the analog pixel data values of one or more frames for reading.

In certain embodiments, an analog-to-digital unit is assigned for each different gain and the analog-to-digital units are configured to operate concurrently. Resulting digital values may be interleaved for output or may be output in parallel. For example, analog pixel data for a given row may be amplified according to gain 803 and converted to corresponding digital values by a first analog-to-digital unit, while, concurrently, the analog pixel data for the row may be amplified according to gain 805 and converted to corresponding digital values by a second analog-to-digital unit. Furthermore, and concurrently, the analog pixel data for the row may be amplified according to gain 807 and converted to corresponding digital values by a third analog-to-digital unit. Digital values from the first through third analog-to-digital units may be output as sets of pixels, with each pixel in a set of pixels corresponding to one of the three gains 803, 805, 807. Similarly, output data values may be organized as lines having different gain values, with each line comprising pixels with a gain corresponding to one of the three gains 803, 805, 807.

Figure 9:
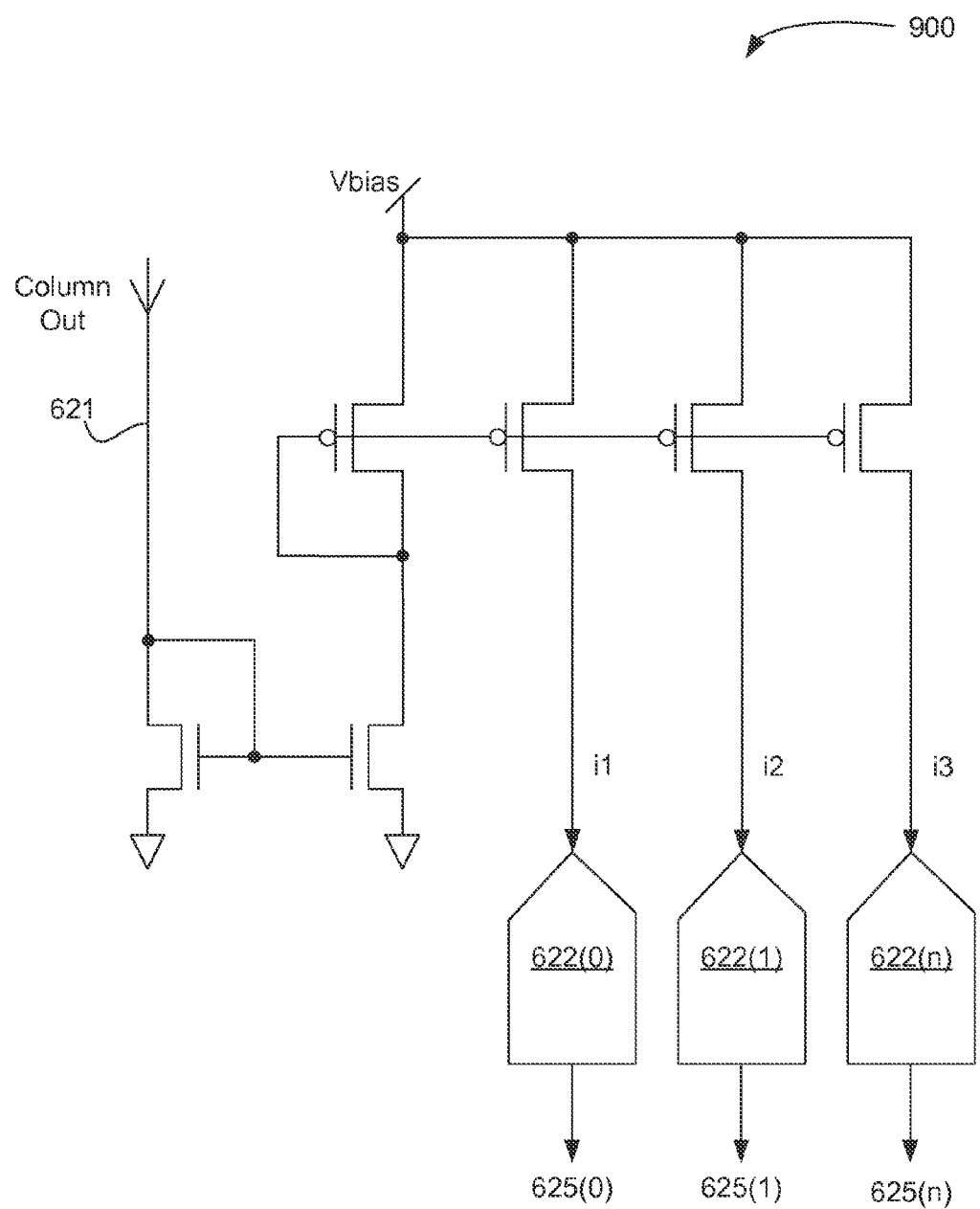
FIG. 9 illustrates a system for converting in parallel analog pixel data to multiple signals of digital pixel data, in accordance with one embodiment.

FIG. 9 illustrates a system 900 for converting in parallel analog pixel data to multiple signals of digital pixel data, in accordance with one embodiment. As an option, the system 900 may be implemented in the context of the details of any of the Figures disclosed herein. Of course, however, the system 900 may be implemented in any desired environment. Further, the aforementioned definitions may equally apply to the description below.

In the context of FIG. 9, the system 900 is shown to receive as input analog pixel data 621. The analog pixel data 621 may be received within an analog signal, as noted hereinabove. Further, the analog-to-digital units 622 may be configured to generate digital pixel data 625 based on the received analog pixel data 621.

As shown in FIG. 9, the system 900 is configured to mirror the current of the analog pixel data 621 such that each of analog-to-digital unit 622(0), analog-to-digital unit 622(1), and analog-to-digital unit 622(n) receive a scaled copy of the analog pixel data 621. In one embodiment, each of the analog-to-digital unit 622(0), the analog-to-digital unit 622(1), and the analog-to-digital unit 622(n) may be configured to apply a unique gain to the analog pixel data 621. Each scaled copy may be scaled according to physical dimensions for the transistors comprising system 900, which comprises a structure known in the art as a current mirror. As shown, each current i1, i2, i3 may be generated in an arbitrary ratio relative to input current Iin, based on the physical dimensions. For example, currents i1, i2, i3 may be generated in a ratio of 1:1:1, 1:2:4, 0.5:1:2, or any other technically feasible ratio relative to Iin.

In an embodiment, the unique gains may be configured at each of the analog-to-digital units 622 by a controller. By way of a specific example, the analog-to-digital unit 622(0) may be configured to apply a gain of 1.0 to the analog pixel data 621, the analog-to-digital unit 622(1) may be configured to apply a gain of 2.0 to the analog pixel data 621, and the analog-to-digital unit 622(n) may be configured to apply a gain of 4.0 to the analog pixel data 621. Accordingly, while the same analog pixel data 621 may be input transmitted to each of the analog-to-digital unit 622(0), the analog-to-digital unit 622(1), and the analog-to-digital unit 622(n), each of digital pixel data 625(0), digital pixel data 625(1), and digital pixel data 625(n) may include different digital values based on the different gains applied within the analog-to-digital units 622, and thereby provide unique exposure representations of the same photographic scene.

In the embodiment described above, where the analog-to-digital unit 622(0) may be configured to apply a gain of 1.0, the analog-to-digital unit 622(1) may be configured to apply a gain of 2.0, and the analog-to-digital unit 622(n) may be configured to apply a gain of 4.0, the digital pixel data 625(0) may provide the least exposed corresponding digital image. Conversely, the digital pixel data 625(n) may provide the most exposed digital image. In another embodiment, the digital pixel data 625(0) may be utilized for generating an EV−1 digital image, the digital pixel data 625(1) may be utilized for generating an EV0 digital image, and the digital pixel data 625(n) may be utilized for generating an EV+2 image. In another embodiment, system 900 is configured to generate currents i1, i2, and i3 in a ratio of 2:1:4, and each analog-to-digital unit 622 may be configured to apply a gain of 1.0, which results in corresponding digital images having exposure values of EV−1, EV0, and EV+1 respectively. In such an embodiment, further differences in exposure value may be achieved by applying non-unit gain within one or more analog-to-digital unit 622.

In some embodiments, a set of gains may be selected for application to the analog pixel data 621 based on whether the analog pixel data is associated with an ambient capture or a flash capture. For example, if the analog pixel data 621 comprises a plurality of values from an analog storage plane associated with ambient sample storage, a first set of gains may be selected for amplifying the values of the analog storage plane associated with the ambient sample storage. Further, a second set of gains may be selected for amplifying values of an analog storage plane associated with the flash sample storage.

A plurality of first analog sampling circuits 603(0) may comprise the analog storage plane used for the ambient sample storage, and a plurality of second analog sampling circuits 603(1) may comprise the analog storage plane used for the flash sample storage. Either set of gains may be preselected based on exposure settings. For example, a first set of gains may be preselected for exposure settings associated with a flash capture, and a second set of gains may be preselected for exposure settings associated with an ambient capture. Each set of gains may be preselected based on any feasible exposure settings, such as, for example, ISO, aperture, shutter speed, white balance, and exposure. One set of gains may include gain values that are greater than each of their counterparts in the other set of gains. For example, a first set of gains selected for application to each ambient sample may include gain values of 0.5, 1.0, and 2.0, and a second set of gains selected for application to each flash sample may include gain values of 1.0, 2.0, and 4.0.

While the system 900 is illustrated to include three analog-to-digital units 622, it is contemplated that multiple digital images may be generated by similar systems with more or less than three analog-to-digital units 622. For example, a system with two analog-to-digital units 622 may be implemented for simultaneously generating two exposures of a photographic scene with zero, or near zero, interframe time in a manner similar to that described above with respect to system 900. In one embodiment, the two analog-to-digital units 622 may be configured to generate two exposures each, for a total of four different exposures relative to one frame of analog pixel data.

Figure 10A:
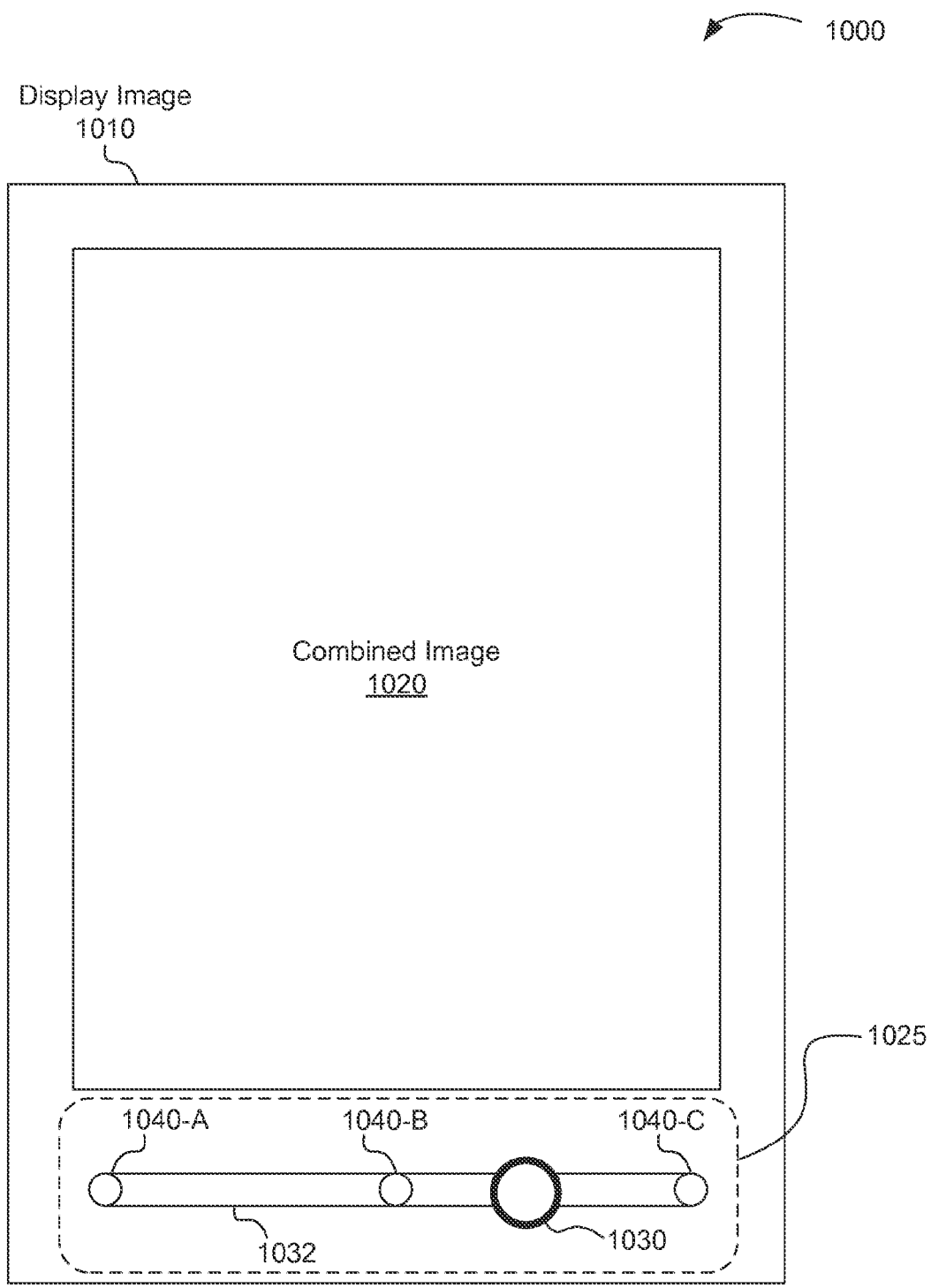
FIG. 10A illustrates a user interface system for generating a combined image, according to an embodiment.

FIG. 10A illustrates a user interface (UI) system 1000 for generating a combined image 1020, according to one embodiment. As an option, the UI system 1000 may be implemented in the context of the details of any of the Figures disclosed herein. Of course, however, the UI system 1000 may be implemented in any desired environment. Further, the aforementioned definitions may equally apply to the description below.

In one embodiment, a combined image 1020 comprises a combination of at least two related digital images. For example the combined image 1020 may comprise, without limitation, a combined rendering of at least two digital images, such as two or more of the digital images of an ambient image stack 732(0) and a flash image stack 732(1) of FIG. 7. In another embodiment, the digital images used to compute the combined image 1020 may be generated by amplifying each of an ambient analog signal and a flash analog signal with at least two different gains, where each analog signal includes optical scene information captured based on an optical image focused on an image sensor. In yet another embodiment, each analog signal may be amplified using the at least two different gains on a pixel-by-pixel, line-by-line, or frame-by-frame basis.

In one embodiment, the UI system 1000 presents a display image 1010 that includes, without limitation, a combined image 1020, and a control region 1025, which in FIG. 10A is shown to include a slider control 1030 configured to move along track 1032, and two or more indication points 1040, which may each include a visual marker displayed within display image 1010.

In one embodiment, the UI system 1000 is generated by an adjustment tool executing within a processor complex 310 of a digital photographic system 300, and the display image 1010 is displayed on display unit 312. In one embodiment, at least two digital images comprise source images for generating the combined image 1020. The at least two digital images may reside within NV memory 316, volatile memory 318, memory subsystem 362, or any combination thereof. In another embodiment, the UI system 1000 is generated by an adjustment tool executing within a computer system, such as a laptop computer or a desktop computer. The at least two digital images may be transmitted to the computer system or may be generated by an attached camera device. In yet another embodiment, the UI system 1000 may be generated by a cloud-based server computer system, which may download the at least two digital images to a client browser, which may execute combining operations described below. In another embodiment, the UI system 1000 is generated by a cloud-based server computer system, which receives the at least two digital images from a digital photographic system in a mobile device, and which may execute the combining operations described below in conjunction with generating combined image 1020.

The slider control 1030 may be configured to move between two end points corresponding to indication points 1040-A and 1040-C. One or more indication points, such as indication point 1040-B may be positioned between the two end points. Of course, in other embodiment, the control region 1025 may include other configurations of indication points 1040 between the two end points. For example, the control region 1025 may include more or less than one indication point.

Each indication point 1040 may be associated with a specific rendering of a combined image 1020, or a specific combination of two or more digital images. For example, the indication point 1040-A may be associated with a first digital image generated from an ambient analog signal captured during a first exposure time, and amplified utilizing a first gain; and the indication point 1040-C may be associated with a second digital image generated from a flash analog signal captured during a second exposure time, and amplified utilizing a second gain. Both the first digital image and the second digital image may be from a single exposure, as described hereinabove. Further, the first digital image may include an ambient capture of the single exposure, and the second digital image may include a flash capture of the single exposure. In one embodiment, the first gain and the second gain may be the same gain. In another embodiment, when the slider control 1030 is positioned directly over the indication point 1040-A, only the first digital image may be displayed as the combined image 1020 in the display image 1010, and similarly when the slider control 1030 is positioned directly over the indication point 1040-C, only the second digital image may be displayed as the combined image 1020 in the display image 1010.

In one embodiment, indication point 1040-B may be associated with a blending of the first digital image and the second digital image. Further, the first digital image may be an ambient digital image, and the second digital image may be a flash digital image. Thus, when the slider control 1030 is positioned at the indication point 1040-B, the combined image 1020 may be a blend of the ambient digital image and the flash digital image. In one embodiment, blending of the ambient digital image and the flash digital image may comprise alpha blending, brightness blending, dynamic range blending, and/or tone mapping or other non-linear blending and mapping operations. In another embodiment, any blending of the first digital image and the second digital image may provide a new image that has a greater dynamic range or other visual characteristics that are different than either of the first image and the second image alone. In one embodiment, a blending of the first digital image and the second digital image may allow for control of a flash contribution within the combined image. Thus, a blending of the first digital image and the second digital image may provide a new computed image that may be displayed as combined image 1020 or used to generate combined image 1020. To this end, a first digital signal and a second digital signal may be combined, resulting in at least a portion of a combined image. Further, one of the first digital signal and the second digital signal may be further combined with at least a portion of another digital image or digital signal. In one embodiment, the other digital image may include another combined image, which may include an HDR image.

In one embodiment, when the slider control 1030 is positioned at the indication point 1040-A, the first digital image is displayed as the combined image 1020, and when the slider control 1030 is positioned at the indication point 1040-C, the second digital image is displayed as the combined image 1020; furthermore, when slider control 1030 is positioned at indication point 1040-B, a blended image is displayed as the combined image 1020. In such an embodiment, when the slider control 1030 is positioned between the indication point 1040-A and the indication point 1040-C, a mix (e.g. blend) weight may be calculated for the first digital image and the second digital image. For the first digital image, the mix weight may be calculated as having a value of 0.0 when the slider control 1030 is at indication point 1040-C and a value of 1.0 when slider control 1030 is at indication point 1040-A, with a range of mix weight values between 0.0 and 1.0 located between the indication points 1040-C and 1040-A, respectively. For the second digital image, the mix weight may be calculated as having a value of 0.0 when the slider control 1030 is at indication point 1040-A and a value of 1.0 when slider control 1030 is at indication point 1040-C, with a range of mix weight values between 0.0 and 1.0 located between the indication points 1040-A and 1040-C, respectively.

In another embodiment, the indication point 1040-A may be associated with a first combination of images, and the indication point 1040-C may be associated with a second combination of images. Each combination of images may include an independent blend of images. For example, the indication point 1040-A may be associated with a blending of the digital images of ambient image stack 732(0) of FIG. 7, and the indication point 1040-C may be associated with a blending of the digital images of flash image stack 732(1). In other words, the indication point 1040-A may be associated with a blended ambient digital image or blended ambient digital signal, and the indication point 1040-C may be associated with a blended flash digital image or blended flash digital signal. In such an embodiment, when the slider control 1030 is positioned at the indication point 1040-A, the blended ambient digital image is displayed as the combined image 1020, and when the slider control 1030 is positioned at the indication point 1040-C, the blended flash digital image is displayed as the combined image 1020. Each of the blended ambient digital image and the blended flash digital image may be associated with unique light sensitivities.

Further, when slider control 1030 is positioned at indication point 1040-B, the blended ambient digital image may be blended with the blended flash digital image to generate a new blended image. The new blended image may be associated with yet another unique light sensitivity, and may offer a balance of proper background exposure due to the blending of ambient images, with a properly lit foreground subject due to the blending of flash images. In such an embodiment, when the slider control 1030 is positioned between the indication point 1040-A and the indication point 1040-C, a mix (e.g. blend) weight may be calculated for the blended ambient digital image and the blended flash digital image. For the blended ambient digital image, the mix weight may be calculated as having a value of 0.0 when the slider control 1030 is at indication point 1040-C and a value of 1.0 when slider control 1030 is at indication point 1040-A, with a range of mix weight values between 0.0 and 1.0 located between the indication points 1040-C and 1040-A, respectively. For the blended flash digital image, the mix weight may be calculated as having a value of 0.0 when the slider control 1030 is at indication point 1040-A and a value of 1.0 when slider control 1030 is at indication point 1040-C, with a range of mix weight values between 0.0 and 1.0 located between the indication points 1040-A and 1040-C, respectively.

Figure 10B:
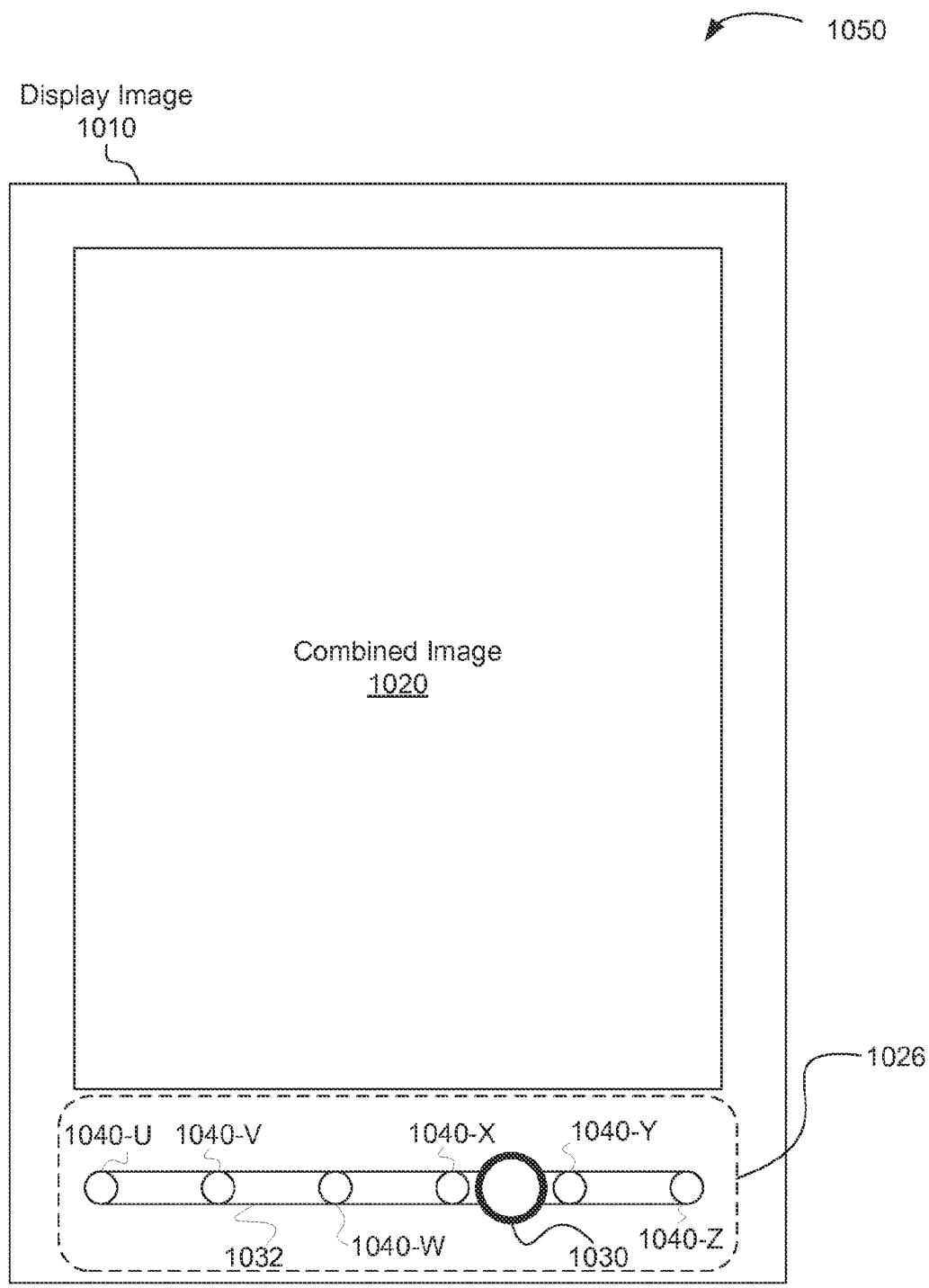
FIG. 10B illustrates another user interface system for generating a combined image, according to one embodiment.

FIG. 10B illustrates a user interface (UI) system 1050 for generating a combined image 1020, according to one embodiment. As an option, the UI system 1050 may be implemented in the context of the details of any of the Figures disclosed herein. Of course, however, the UI system 1050 may be implemented in any desired environment. Further, the aforementioned definitions may equally apply to the description below.

As shown in FIG. 10B, the UI system 1050 may be substantially identical to the UI system 1000 of FIG. 10A, with exception of the control region 1025 of UI system 1000 and control region 1026 of UI system 1050. The control region 1026 of UI system 1050 is shown to include six indication points 1040-U, 1040-V, 1040-W, 1040-X, 1040-Y, and 1040-Z. The indication points 1040-U and 1040-Z may be representative of end points, similar to the indication points 1040-A and 1040-C, respectively, of UI system 1000. Further, the control region 1026 of UI system 1050 is shown to include a plurality of indication points 1040—such as indication points 1040-V, 1040-W, 1040-X, and 1040-Y—disposed between the two end points along track 1032. Each of the indication points may be associated with one or more digital images of image stacks 732.

For example, an ambient image stack 732 may be generated to include each of an ambient digital image at EV−1 exposure, an ambient digital image at EV0 exposure, and an ambient digital image at EV+1 exposure. Said ambient image stack 732 may be associated with a first analog storage plane captured at a first exposure time, such as the ambient image stack 732(0) of FIG. 7. Thus, an ambient image stack may include a plurality of digital images all associated with a first exposure time during an ambient capture, where each digital image is associated with a different ISO or light sensitivity. Further, a flash image stack 732 may also be generated to include each of a flash digital image at EV−1 exposure, a flash digital image at EV0 exposure, and a flash digital image at EV+1 exposure. However, the flash image stack 732 may be associated with a second analog storage plane captured at a second exposure time during which a strobe or flash was activated, such as the flash image stack 732(1) of FIG. 7. Thus, a flash image stack may include a second plurality of digital images all associated with a second exposure time during which a strobe or flash was activated, where each flash digital image is associated with a different ISO or light sensitivity.

After analog-to-digital units 722(0) and 722(1) generate the respective image stacks 732, the digital pixel data output by the analog-to-digital units 722(0) and 722(1) may be arranged together into a single sequence of digital images of increasing or decreasing exposure. In one embodiment, no two digital signals of the two image stacks may be associated with a same ISO+ exposure time combination, such that each digital image or instance of digital pixel data may be considered as having a unique effective exposure.

In one embodiment, and in the context of the foregoing figures, each of the indication points 1040-U, 1040-V, and 1040-W may be associated with digital images of an image stack 732, and each of the indication points 1040-X, 1040-Y, and 1040-Z may be associated with digital images of another image stack 732. For example, each the indication points 1040-U, 1040-V, and 1040-W may be associated with a different ambient digital image or ambient digital signal. Similarly, each of the indication points 1040-X, 1040-Y, and 1040-Z may be associated with a different flash digital image or flash digital signal. In such an embodiment, as the slider 1030 is moved from left to right along the track 1032, exposure and flash contribution of the combined image 1020 may appear to be adjusted or changed. Of course, when the slider 1030 is between two indication points along the track 1032, the combined image 1032 may be a combination of any two or more images of the two image stacks 732.

In another embodiment, the digital images or instances of digital pixel data output by the analog-to-digital units 722(0) and 722(1) may be arranged into a single sequence of digital images of increasing or decreasing exposure. In such an embodiment, the sequence may alternate between ambient and flash digital images. For example, for each of the digital images, gain and exposure time may be combined to determine an effective exposure of the digital image. The digital pixel data may be rapidly organized to obtain a single sequence of digital images of increasing effective exposure, such as, for example: 723(0), 723(1), 724(0), 724(1), 725(0), and 725(1). In such an organization, the sequence of digital images may alternate between flash digital images and ambient digital images. Of course, any sorting of the digital images or digital pixel data based on effective exposure level will depend on an order of application of the gains and generation of the digital signals 723-725.

In one embodiment, exposure times and gains may be selected or predetermined for generating a number of adequately different effective exposures. For example, where three gains are to be applied, then each gain may be selected to be two exposure stops away from a nearest selected gain. Further, a first exposure time may be selected to be one exposure stop away from a second exposure time. In such an embodiment, selection of three gains separated by two exposure stops, and two exposure times separated by one exposure stop, may ensure generation of six digital images, each having a unique effective exposure.

In another embodiment, exposure times and gains may be selected or predetermined for generating corresponding images of similar exposures between the ambient image stack and the flash image stack. For example, a first digital image of an ambient image stack may be generated utilizing an exposure time and gain combination that corresponds to an exposure time and gain combination utilized to generate a first digital image of a flash image stack. This may be done so that the first digital image of the ambient image stack has a similar effective exposure to that of the first digital image of the flash image stack, which may assist in adjusting a flash contribution in a combined image generated by blending the two digital images.

With continuing reference to the digital images of multiple image stacks sorted in a sequence of increasing exposure, each of the digital images may then be associated with indication points along the track 1032 of the UI system 1050. For example, the digital images may be sorted or sequenced along the track 1032 in the order of increasing effective exposure noted previously (723(0), 723(1), 724(0), 724(1), 725(0), and 725(1)) at indication points 1040-U, 1040-V, 1040-W, 1040-X, 1040-Y, and 1040-Z, respectively.

In such an embodiment, the slider control 1030 may then be positioned at any point along the track 1032 that is between two digital images generated based on two different analog storage planes, where each analog storage plane is associated with a different scene illumination. As a result, a digital image generated based on an analog storage plane associated with ambient illumination may then be blended with a digital image generated based on an analog storage plane associated with flash illumination to generate a combined image 1020. In this way, one or more images captured with ambient illumination may be blended with one or more images captured with flash illumination.

For example, the slider control 1030 may be positioned at an indication point that may be equally associated with digital pixel data 724(0) and digital pixel data 724(1). As a result, the digital pixel data 724(0), which may include a first digital image generated from an ambient analog signal captured during a first exposure time with ambient illumination and amplified utilizing a gain, may be blended with the digital pixel data 724(1), which may include a second digital image generated from a flash analog signal captured during a second exposure time with flash illumination and amplified utilizing the same gain, to generate a combined image 1020.

Still further, as another example, the slider control 1030 may be positioned at an indication point that may be equally associated with digital pixel data 724(1) and digital pixel data 725(0). As a result, the digital pixel data 724(1), which may include a first digital image generated from an ambient analog signal captured during a first exposure time with ambient illumination and amplified utilizing a first gain, may be blended with the digital pixel data 725(0), which may include a second digital image generated from a flash analog signal captured during a second exposure time with flash illumination and amplified utilizing a different gain, to generate a combined image 1020.

Thus, as a result of the slider control 1030 positioning, two or more digital signals may be blended, and the blended digital signals may be generated utilizing analog values from different analog storage planes. As a further benefit of sorting effective exposures along a slider, and then allowing blend operations based on slider control position, each pair of neighboring digital images may include a higher noise digital image and a lower noise digital image. For example, where two neighboring digital signals are amplified utilizing a same gain, the digital signal generated from an analog signal captured with a lower exposure time may have less noise. Similarly, where two neighboring digital signals are amplified utilizing different gains, the digital signal generated from an analog signal amplified with a lower gain value may have less noise. Thus, when digital signals are sorted based on effective exposure along a slider, a blend operation of two or more digital signals may serve to reduce the noise apparent in at least one of the digital signals.

Of course, any two or more effective exposures may be blended based on the indication point of the slider control 1030 to generate a combined image 1020 in the UI system 1050. Still further, any two or more effective exposures may be blended utilizing the systems and methods disclose within application Ser. No. 14/534,068, filed Nov. 5, 2014, entitled "SYSTEMS AND METHODS FOR HIGH-DYNAMIC RANGE IMAGES," the contents of which are incorporated by reference herein.

In one embodiment, a mix operation may be applied to a first digital image and a second digital image based upon at least one mix weight value associated with at least one of the first digital image and the second digital image. In one embodiment, a mix weight of 1.0 gives complete mix weight to a digital image associated with the 1.0 mix weight. In this way, a user may blend between the first digital image and the second digital image. To this end, a first digital signal and a second digital signal may be blended in response to user input. For example, sliding indicia may be displayed, and a first digital signal and a second digital signal may be blended in response to the sliding indicia being manipulated by a user.

A system of mix weights and mix operations provides a UI tool for viewing a first digital image, a second digital image, and a blended image as a gradual progression from the first digital image to the second digital image. In one embodiment, a user may save a combined image 1020 corresponding to an arbitrary position of the slider control 1030. The adjustment tool implementing the UI system 1000 may receive a command to save the combined image 1020 via any technically feasible gesture or technique. For example, the adjustment tool may be configured to save the combined image 1020 when a user gestures within the area occupied by combined image 1020. Alternatively, the adjustment tool may save the combined image 1020 when a user presses, but does not otherwise move the slider control 1030. In another implementation, the adjustment tool may save the combined image 1020 when a user gestures, such as by pressing a UI element (not shown), such as a save button, dedicated to receive a save command.

To this end, a slider control may be used to determine a contribution of two or more digital images to generate a final computed image, such as combined image 1020. Persons skilled in the art will recognize that the above system of mix weights and mix operations may be generalized to include two or more indication points, associated with two or more related images. Such related images may comprise, without limitation, any number of digital images that have been generated from two or more analog storage planes, and which may have zero, or near zero, interframe time.

Furthermore, a different continuous position UI control, such as a rotating knob, may be implemented rather than the slider 1030.

Figure 10C:
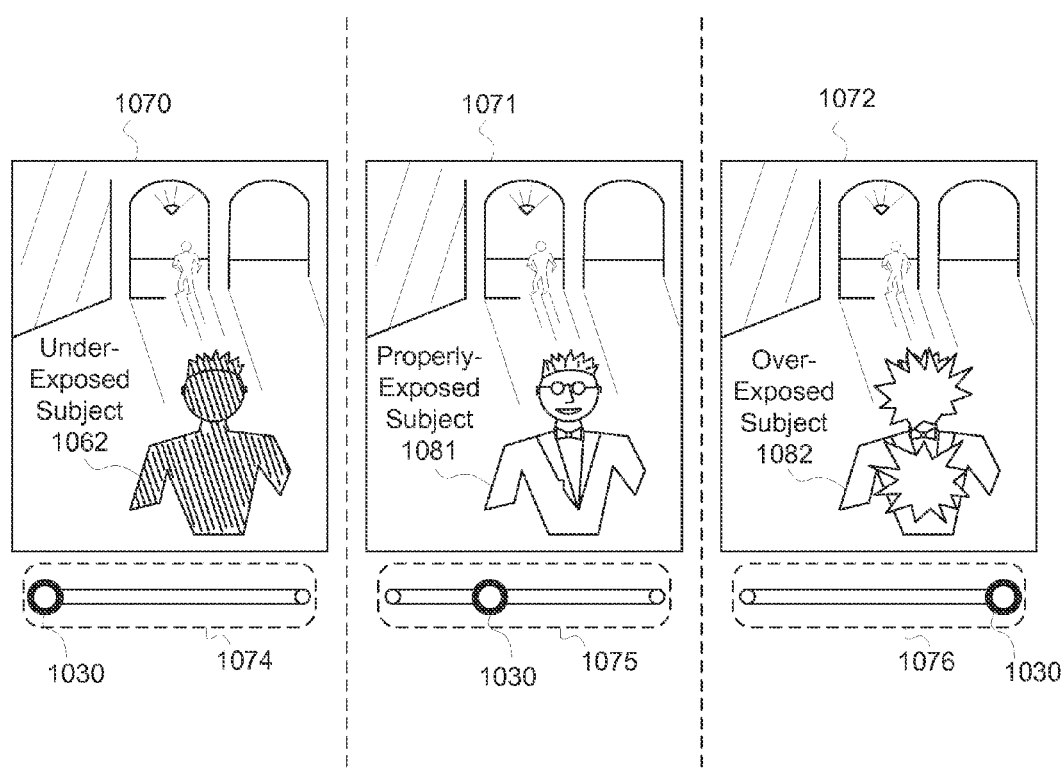
FIG. 10C illustrates user interface (UI) systems displaying combined images with differing levels of strobe exposure, according to an embodiment.

FIG. 10C illustrates user interface (UI) systems displaying combined images 1070-1072 with differing levels of strobe exposure, according to one embodiment. As an option, the UI systems of FIG. 10C may be implemented in the context of the details of any of the Figures disclosed herein. Of course, however, the UI systems be implemented in any desired environment. Further, the aforementioned definitions may equally apply to the description below.

As shown in FIG. 10C, a blended image may be blended from two or more images based on a position of slider control 1030. As shown, the slider control 1030 is configured to select one or more source images for input to a blending operation, where the source images are associated with increasing strobe intensity as the slider control 1030 moves from left to right.

For example, based on the position of slider control 1030 in control region 1074, first blended image 1070 may be generated utilizing one or more source images captured without strobe or flash illumination. As a specific example, the first blended image 1070 may be generated utilizing one or more images captured using only ambient illumination. The one or more images captured using only ambient illumination may comprise an image stack 732, such as the ambient image stack 732(0). As shown, the first blended image 1070 includes an under-exposed subject 1062. Further, based on the position of slider control 1030 in control region 1076, third blended image 1072 may be generated utilizing one or more source images captured using strobe or flash illumination. The one or more source images associated with the position of slider control 1030 in the control region 1076 may comprise an image stack 732, such as the flash image stack 732(1). As shown, the third blended image 1072 includes an over-exposed subject 1082

By manipulating the slider control 1030, a user may be able to adjust the contribution of the source images used to generate the blended image. Or, in other words, the user may be able to adjust the blending of one or more images. For example, the user may be able to adjust or increase a flash contribution from the one or more source images captured using strobe or flash illumination. As illustrated in FIG. 10C, when a user positions the slider control 1030 along a track away from track end points, as shown in control region 1075, a flash contribution from the one or more source images captured using strobe or flash illumination may be blended with the one or more source images captured using ambient illumination. This may result in the generation of second blended image 1071, which includes a properly exposed subject 1081. To this end, by blending digital images captured in ambient lighting conditions with digital images of the same photographic scene captured with strobe or flash illumination, novel digital images may be generated. Further, a flash contribution of the digital images captured with strobe or flash illumination may be adjustable by a user to ensure that both foreground subjects and background objects are properly exposed.

A determination of appropriate strobe intensity may be subjective, and embodiments disclosed herein advantageously enable a user to subjectively select a final combined image having a desired strobe intensity after a digital image has been captured. In practice, a user is able to capture what is apparently a single photograph by asserting a single shutter-release. The single shutter-release may cause capture of a set of ambient samples to a first analog storage plane during a first exposure time, and capture of a set of flash samples to a second analog storage plane during a second exposure time that immediately follows the first exposure time. The ambient samples may comprise an ambient analog signal that is then used to generate multiple digital images of an ambient image stack. Further, the flash samples may comprise a flash analog signal that is then used to generate multiple digital images of a flash image stack. By blending two or more images of the ambient image stack and the flash image stack, the user may thereby identify a final combined image with desired strobe intensity. Further, both the ambient image stack and the flash image stack may be stored, such that the user can select the final combined image at a later time.

In other embodiments, two or more slider controls may be presented in a UI system. For example, in one embodiment, a first slider control may be associated with digital images of an ambient image stack, and a second slider control may be associated with digital images of a flash image stack. By manipulating the slider controls independently, a user may control a blending of ambient digital images independently from blending of flash digital images. Such an embodiment may allow a user to first select a blending of images from the ambient image stack that provides a preferred exposure of background objects. Next, the user may then select a flash contribution. For example, the user may select a blending of images from the flash image stack that provides a preferred exposure of foreground objects. Thus, by allowing for independent selection of ambient contribution and flash contribution, a final blended or combined image may include properly exposed foreground objects as well as properly exposed background objects.

In another embodiment, a desired exposure for one or more given regions of a blended image may be identified by a user selecting another region of the blended image. For example, the other region selected by the user may be currently displayed at a proper exposure within a UI system while the one or more given regions are currently under-exposed or over-exposed. In response to the user's selection of the other region, a blending of source images from an ambient image stack and a flash image stack may be identified to provide the proper exposure at the one or more given regions of the blended image. The blended image may then be updated to reflect the identified blending of source images that provides the proper exposure at the one or more given regions.

In another embodiment, images of a given image stack may be blended before performing any blending operations with images of a different image stack. For example, two or more ambient digital images or ambient digital signals, each with a unique light sensitivity, may be blended to generate a blended ambient digital image with a blended ambient light sensitivity. Further, the blended ambient digital image may then be subsequently blended with one or more flash digital images or flash digital signals. The blending with the one or more flash digital images may be in response to user input. In another embodiment, two or more flash digital images may be blended to generate a blended flash digital image with a blended flash light sensitivity, and the blended flash digital image may then be blended with the blended ambient digital image.

As another example, two or more flash digital images or flash digital signals, each with a unique light sensitivity, may be blended to generate a blended flash digital image with a blended flash light sensitivity. Further, the blended flash digital image may then be subsequently blended with one or more ambient digital images or ambient digital signals. The blending with the one or more ambient digital images may be in response to user input. In another embodiment, two or more ambient digital images may be blended to generate a blended ambient digital image with a blended ambient light sensitivity, and the blended ambient digital image may then be blended with the blended flash digital image.

In one embodiment, the ambient image stack may include digital images at different effective exposures than the digital images of the flash image stack. This may be due to application of different gain values for generating each of the ambient image stack and the flash image stack. For example, a particular gain value may be selected for application to an ambient analog signal, but not for application to a corresponding flash analog signal.

Figure 11:
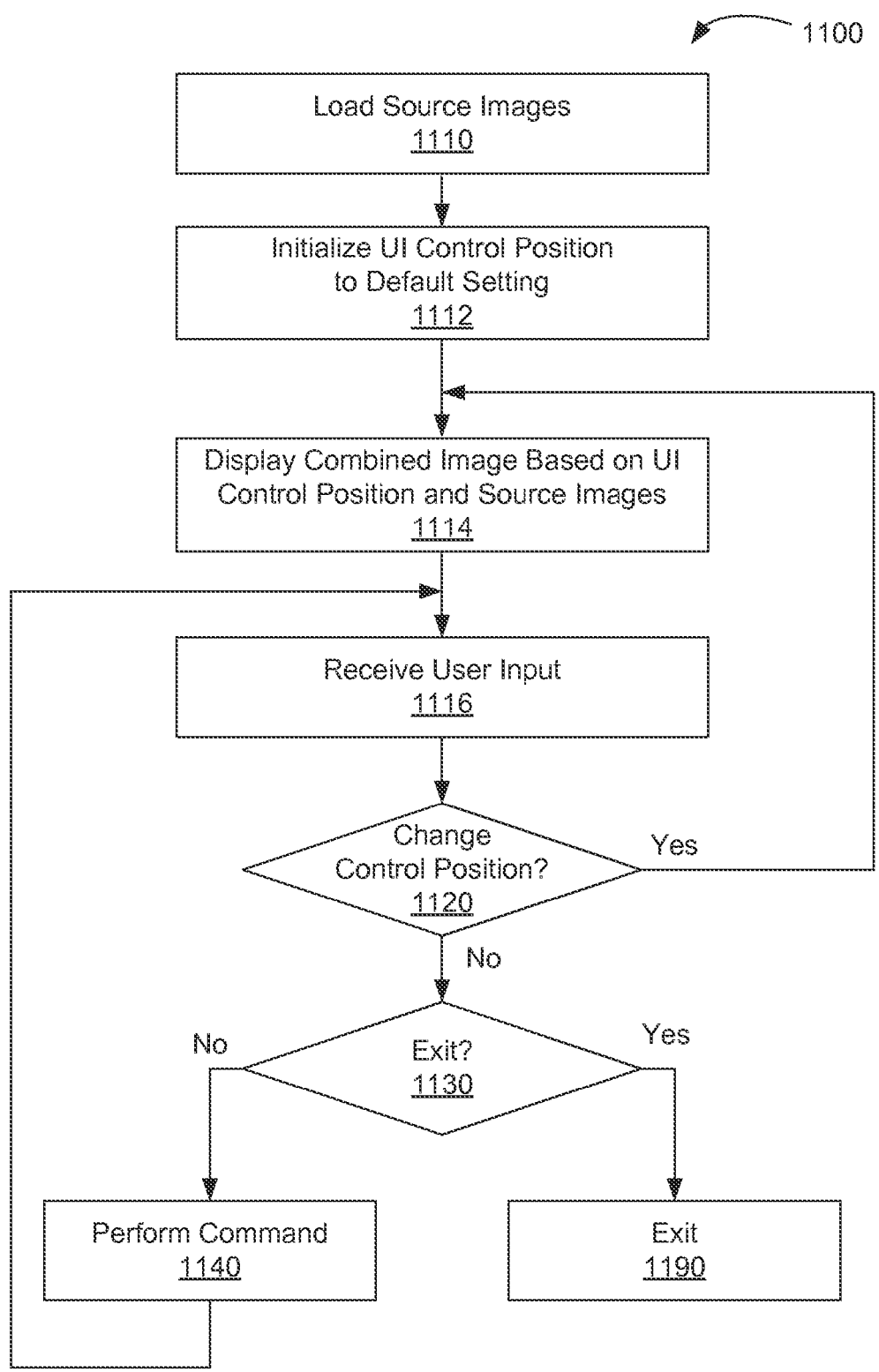
FIG. 11 is a flow diagram of method steps for generating a combined image, according to one embodiment.

FIG. 11 is a flow diagram of method 1100 for generating a combined image, according to one embodiment. As an option, the method 1100 may be implemented in the context of the details of any of the Figures disclosed herein. Of course, however, the method 1100 may be carried out in any desired environment. Further, the aforementioned definitions may equally apply to the description below.

The method 1100 begins in step 1110, where an adjustment tool executing within a processor complex, such as processor complex 310, loads at least two related source images, such as a first digital image and a second digital image described in the context of FIG. 10. In step 1112, the adjustment tool initializes a position for a UI control, such as slider control 1030 of FIG. 10A, to a default setting. In one embodiment, the default setting comprises an end point, such as indication point 1040-A of FIG. 10A, for a range of values for the UI control. In another embodiment, the default setting comprises a calculated value based on one or more of the at least two related source images. In certain embodiments, the default setting is initialized to a value previously selected by a user in association with an image object comprising at least the first digital image and the second digital image.

In step 1114, the adjustment tool generates and displays a combined image, such as combined image 1020 of FIG. 10A, based on a position of the UI control and the at least two related source images. In one embodiment, generating the combined image comprises mixing the at least two related source images as described previously in FIGS. 10A-10C. In step 1116, the adjustment tool receives user input. The user input may include, without limitation, a UI gesture such as a selection gesture or click gesture within display image 1010. If, in step 1120, the user input should change the position of the UI control, then the adjustment tool changes the position of the UI control and the method proceeds back to step 1114. Otherwise, the method proceeds to step 1130.

If, in step 1130, the user input does not comprise a command to exit, then the method proceeds to step 1140, where the adjustment tool performs a command associated with the user input. In one embodiment, the command comprises a save command and the adjustment tool then saves the combined image, which is generated according to a position of the UI control. The method then proceeds back to step 1116.

Returning to step 1130, if the user input comprises a command to exit, then the method terminates in step 1190, where the adjustment tool exits, thereby terminating execution.

In summary, a technique is disclosed for generating a new digital photograph that beneficially blends one or more ambient digital images and one or more flash digital images, where the one or more ambient digital images and the one or more flash digital images are based on different analog signals received from two different analog storage planes, but from a single image sensor during a single exposure. The one or more ambient digital images may be blended with the one or more flash digital images based on a function that implements any technically feasible blend technique. An adjustment tool may implement a user interface technique that enables a user to select and save the new digital photograph from a gradation of parameters for combining related images.

One advantage of the embodiments disclosed herein is that a digital photograph may be selectively generated based on user input using two or more different samples of a single exposure of a photographic scene. Accordingly, the digital photograph generated based on the user input may have a greater dynamic range than any of the individual samples. Further, the generation of an HDR image using two or more different samples with zero, or near zero, interframe time allows for the rapid generation of HDR images without motion artifacts. Still further, the embodiments disclosed herein may allow for the generation of a blended image with an ideal amount of flash contribution by blending one or more ambient digital images with one or more flash digital images of a same photographic scene.

Figure 12:
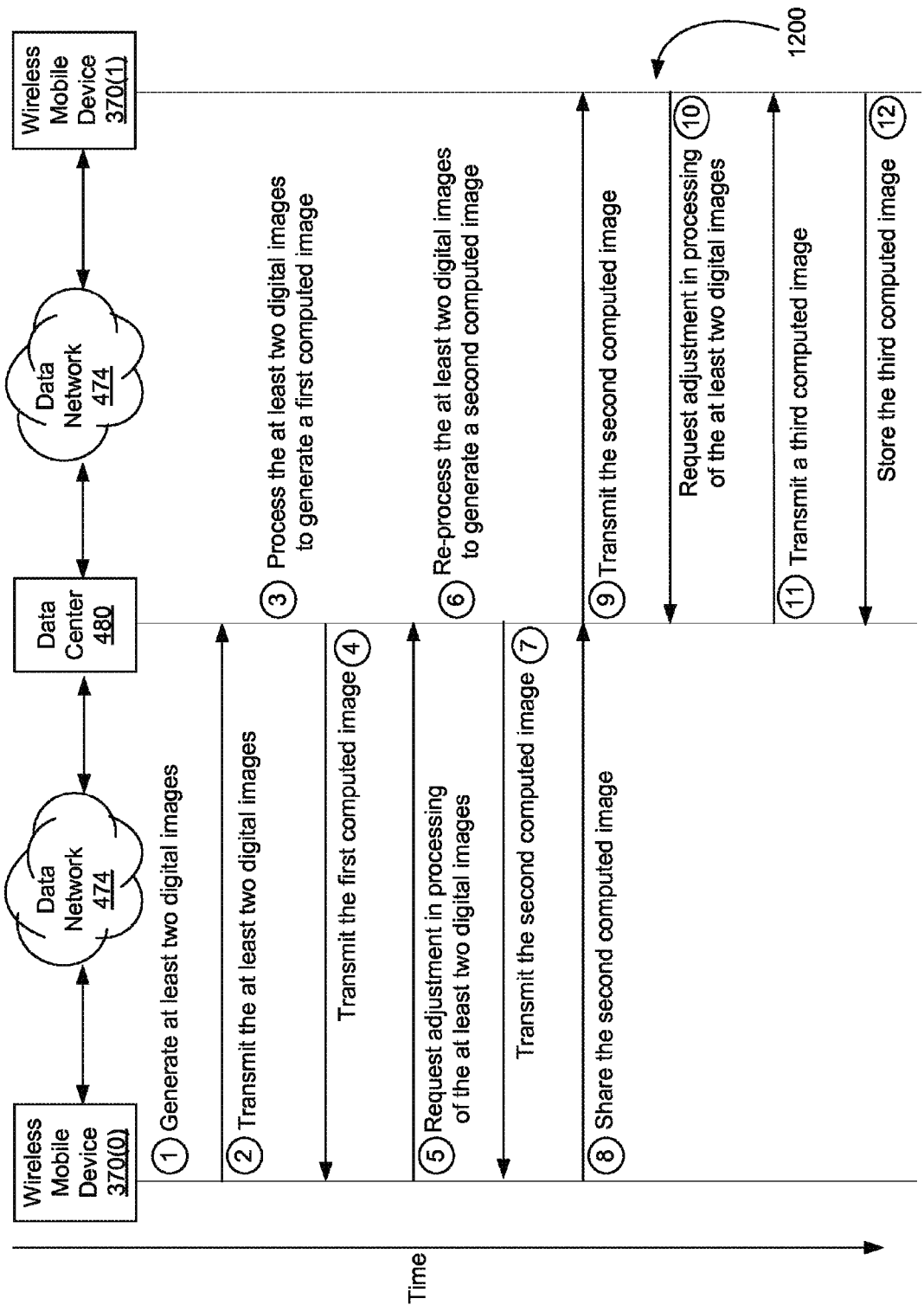
FIG. 12 illustrates a message sequence for generating a combined image utilizing a network, according to another embodiment.

FIG. 12 illustrates a message sequence 1200 for generating a combined image utilizing a network, according to one embodiment. As an option, the message sequence 1200 may be implemented in the context of the details of any of the Figures disclosed herein. Of course, however, the message sequence 1200 may be carried out in any desired environment. Further, the aforementioned definitions may equally apply to the description below.

As shown in FIG. 12, a wireless mobile device 376(0) generates at least two digital images. In one embodiment, the at least two digital images may be generated by amplifying analog values of two or more analog storage planes, where each generated digital image may correspond to digital output of an applied gain. In one embodiment, a first digital image may include an EV−1 exposure of a photographic scene, and a second digital image may include an EV+1 exposure of the photographic scene. In another embodiment, the at least two digital images may include an EV−2 exposure of a photographic scene, an EV0 exposure of the photographic scene, and an EV+2 exposure of the photographic scene. In yet another embodiment, the at least two digital images may comprise one or more image stacks. For example, the at least two digital images may comprise an ambient image stack and/or a flash image stack.

Referring again to FIG. 12, the at least two digital images are transmitted from the wireless mobile device 376(0) to a data center 480 by way of a data network 474. The at least two digital images may be transmitted by the wireless mobile device 376(0) to the data center 480 using any technically feasible network communication method.

Further, in one embodiment, the data center 480 may then process the at least two digital images to generate a first computed image. The processing of the at least two digital images may include any processing of the at least two digital images that blends or merges at least a portion of each of the at least two digital images to generate the first computed image. To this end, the first digital image and the second digital image may be combined remotely from the wireless mobile device 376(0). For example, the processing of the at least two digital images may include an any type of blending operation, including but not limited to, an HDR image combining operation. In one embodiment, the processing of the at least two digital images may include any computations that produce a first computed image having a greater dynamic range than any one of the digital images received at the data center 480. Accordingly, in one embodiment, the first computed image generated by the data center 480 may be an HDR image. In other embodiments, the first computed image generated by the data center 480 may be at least a portion of an HDR image.

After generating the first computed image, the data center 480 may then transmit the first computed image to the wireless mobile device 376(0). In one embodiment, the transmission of the at least two digital images from the wireless mobile device 376(0), and the receipt of the first computed image at the wireless mobile device 376(0), may occur without any intervention or instruction being received from a user of the wireless mobile device 376(0). For example, in one embodiment, the wireless mobile device 376(0) may transmit the at least two digital images to the data center 480 immediately after capturing a photographic scene and generating the at least two digital images utilizing an analog signal representative of the photographic scene. The photographic scene may be captured based on a user input or selection of an electronic shutter control, or pressing of a manual shutter button, on the wireless mobile device 376(0). Further, in response to receiving the at least two digital images, the data center 480 may generate an HDR image based on the at least two digital images, and transmit the HDR image to the wireless mobile device 376(0). The wireless mobile device 376(0) may then display the received HDR image. Accordingly, a user of the wireless mobile device 376(0) may view on the display of the wireless mobile device 376(0) an HDR image computed by the data center 480. Thus, even though the wireless mobile device 376(0) does not perform any HDR image processing, the user may view on the wireless mobile device 376(0) the newly computed HDR image substantially instantaneously after capturing the photographic scene and generating the at least two digital images on which the HDR image is based.

As shown in FIG. 12, the wireless mobile device 376(0) requests adjustment in processing of the at least two digital images. In one embodiment, upon receiving the first computed image from the data center 480, the wireless mobile device 376(0) may display the first computed image in a UI system, such as the UI system 1000 of FIG. 10. In such an embodiment, the user may control a slider control, such as the slider control 1030, to adjust the processing of the at least two digital images transmitted to the data center 480. For example, user manipulation of a slider control may result in commands being transmitted to the data center 480. In one embodiment, the commands transmitted to the data center 480 may include mix weights for use in adjusting the processing of the at least two digital images. In other embodiments, the request to adjust processing of the at least two digital images includes any instructions from the wireless mobile device 376(0) that the data center 480 may use to again process the at least two digital images and generate a second computed image. User manipulation of the slider control may adjust a flash contribution of one or more source images captured with strobe or flash illumination.

As shown in FIG. 12, upon receiving the request to adjust processing, the data center 480 re-processes the at least two digital images to generate a second computed image. In one embodiment, the data center 480 may re-process the at least two digital images using parameters received from the wireless mobile device 376(0). In such an embodiment, the parameters may be provided as input with the at least two digital images to an HDR processing algorithm that executes at the data center 480. After generating the second computed image, the second computed image may be then transmitted from the data center 480 to the wireless mobile device 376(0) for display to the user.

Referring again to FIG. 12, the wireless mobile device 376(0) shares the second computed image with another wireless mobile device 376(1). In one embodiment, the wireless mobile device 376(0) may share any computed image received from the data center 480 with the other wireless mobile device 376(1). For example, the wireless mobile device 376(0) may share the first computed image received from the data center 480. As shown in FIG. 12, the data center 480 communicates with the wireless mobile device 376(0) and the wireless mobile device 376(1) over the same data network 474. Of course, in other embodiments the wireless mobile device 376(0) may communicate with the data center 480 via a network different than a network utilized by the data center 480 and the wireless mobile device 376(1) for communication.

In another embodiment, the wireless mobile device 376(0) may share a computed image with the other wireless mobile device 376(1) by transmitting a sharing request to data center 480. For example, the wireless mobile device 376(0) may request that the data center 480 forward the second computed to the other wireless mobile device 376(1). In response to receiving the sharing request, the data center 480 may then transmit the second computed image to the wireless mobile device 376(1). In an embodiment, transmitting the second computed image to the other wireless mobile device 376(1) may include sending a URL at which the other wireless mobile device 376(1) may access the second computed image.

Still further, as shown in FIG. 12, after receiving the second computed image, the other wireless mobile device 376(1) may send to the data center 480 a request to adjust processing of the at least two digital images. For example, the other wireless mobile device 376(1) may display the second computed image in a UI system, such as the UI system 1000 of FIG. 10. A user of the other wireless mobile device 376(1) may manipulate UI controls to adjust the processing of the at least two digital images transmitted to the data center 480 by the wireless mobile device 376(0). For example, user manipulation of a slider control at the other wireless mobile device 376(1) may result in commands being generated and transmitted to data center 480 for processing. In an embodiment, the request to adjust the processing of the at least two digital images sent from the other wireless mobile device 376(1) includes the commands generated based on the user manipulation of the slider control at the other wireless mobile device 376(1). In other embodiments, the request to adjust processing of the at least two digital images includes any instructions from the wireless mobile device 376(1) that the data center 480 may use to again process the at least two digital images and generate a third computed image.

As shown in FIG. 12, upon receiving the request to adjust processing, the data center 480 re-processes the at least two digital images to generate a third computed image. In one embodiment, the data center 480 may re-process the at least two digital images using mix weights received from the wireless mobile device 376(1). In such an embodiment, the mix weights received from the wireless mobile device 376(1) may be provided as input with the at least two digital images to an HDR processing algorithm that executes at the data center 480. After generating the third computed image, the third computed image is then transmitted from the data center 480 to the wireless mobile device 376(1) for display. Still further, after receiving the third computed image, the wireless mobile device 376(1) may send to the data center 480 a request to store the third computed image. In another embodiment, other wireless mobile devices 376 in communication with the data center 480 may request storage of a computed image. For example, in the context of FIG. 12, the wireless mobile device 376(0) may at any time request storage of the first computed image or the second computed image.

In response to receiving a request to store a computed image, the data center 480 may store the computed image for later retrieval. For example, the stored computed image may be stored such that the computed image may be later retrieved without re-applying the processing that was applied to generate the computed image. In one embodiment, the data center 480 may store computed images within a storage system 486 local to the data center 480. In other embodiments, the data center 480 may store computed images within hardware devices not local to the data center 480, such as a data center 481. In such embodiments, the data center 480 may transmit the computed images over the data network 474 for storage.

Still further, in some embodiments, a computed image may be stored with a reference to the at least two digital images utilized to generate the computed image. For example, the computed image may be associated with the at least two digital images utilized to generate the computed image, such as through a URL served by data center 480 or 481. By linking the stored computed image to the at least two digital images, any user or device with access to the computed image may also be given the opportunity to subsequently adjust the processing applied to the at least two digital images, and thereby generate a new computed image.

To this end, users of wireless mobile devices 376 may leverage processing capabilities of a data center 480 accessible via a data network 474 to generate an HDR image utilizing digital images that other wireless mobile devices 376 have captured and subsequently provided access to. For example, digital signals comprising digital images may be transferred over a network for being combined remotely, and the combined digital signals may result in at least a portion of a HDR image. Still further, a user may be able to adjust a blending or flash contribution of two or more digital images to generate a new HDR photograph without relying on their wireless mobile device 376 to perform the processing or computation necessary to generate the new HDR photograph. Subsequently, the user's device may receive at least a portion of a HDR image resulting from a combination of two or more digital signals. Accordingly, the user's wireless mobile device 376 may conserve power by offloading HDR processing to a data center. Further, the user may be able to effectively capture HDR photographs despite not having a wireless mobile device 376 capable of performing high-power processing tasks associated with HDR image generation. Finally, the user may be able to obtain an HDR photograph generated using an algorithm determined to be best for a photographic scene without having to select the HDR algorithm himself or herself and without having installed software that implements such an HDR algorithm on their wireless mobile device 376. For example, the user may rely on the data center 480 to identify and to select a best HDR algorithm for a particular photographic scene.

One advantage of the present invention is that a digital photograph may be selectively generated based on user input using two or more different images generated from a single exposure of a photographic scene. Accordingly, the digital photograph generated based on the user input may have a greater dynamic range than any of the individual images. Additionally, a user may selectively adjust a flash contribution of the different images to the generated digital photograph. Further, the generation of an HDR image using two or more different images with zero, or near zero, interframe time allows for the rapid generation of HDR images without motion artifacts.

Additionally, when there is any motion within a photographic scene, or a capturing device experiences any jitter during capture, any interframe time between exposures may result in a motion blur within a final merged HDR photograph. Such blur can be significantly exaggerated as interframe time increases. This problem renders current HDR photography an ineffective solution for capturing clear images in any circumstance other than a highly static scene. Further, traditional techniques for generating a HDR photograph involve significant computational resources, as well as produce artifacts which reduce the image quality of the resulting image. Accordingly, strictly as an option, one or more of the above issues may or may not be addressed utilizing one or more of the techniques disclosed herein.

Still yet, in various embodiments, one or more of the techniques disclosed herein may be applied to a variety of markets and/or products. For example, although the techniques have been disclosed in reference to a photo capture, they may be applied to televisions, web conferencing (or live streaming capabilities, etc.), security cameras (e.g. increase contrast to determine characteristic, etc.), automobiles (e.g. driver assist systems, in-car infotainment systems, etc.), and/or any other product which includes a camera input.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

The invention claimed is:

1. An apparatus, comprising:
   circuitry for:
   storing an ambient sample based on an electrical signal from a photodiode of an image sensor, wherein the electrical signal includes a photodiode current received from the photodiode of the image sensor;

storing a flash sample based on the electrical signal from the photodiode of the image sensor;

outputting a first value based on the ambient sample, and a second value based on the flash sample, for generating at least one image, wherein the first value is output in an ambient analog signal, and the second value is output in a flash analog signal; and amplifying at least one of the first value and the second value utilizing two or more gains, wherein the amplification of the at least one of the first value and the second value utilizing the two or more gains includes amplifying at least one of the ambient analog signal and flash analog signal utilizing the two or more gains;

wherein the apparatus is operable such that the ambient analog signal is amplified utilizing the two or more gains to generate a first amplified ambient analog signal and a second amplified ambient analog signal;

wherein the apparatus is operable such that the first amplified ambient analog signal is converted to a first ambient digital signal with a first light sensitivity, and the second amplified ambient analog signal is converted to a second ambient digital signal with a second light sensitivity;

wherein the apparatus is operable such that:
the first ambient digital signal is blended with the second ambient digital signal, resulting in a blended ambient digital signal with a blended ambient light sensitivity;
the flash analog signal is amplified utilizing at least one gain to generate at least one amplified flash analog signal;
the at least one amplified flash analog signal is converted to at least one flash digital signal; and
the blended ambient digital signal is blended with the at least one flash digital signal, in response to user input.

2. The apparatus of claim 1, wherein the apparatus is operable such that the first ambient digital signal is blended with the second ambient digital signal, in response to user input.

3. The apparatus of claim 2, wherein the apparatus is operable such that sliding indicia is displayed and the user input includes manipulation of the sliding indicia.

4. The apparatus of claim 1, wherein the apparatus is operable such that:
the flash analog signal is amplified utilizing another two or more gains to generate two or more amplified flash analog signals;
the two or more amplified flash analog signals are converted to two or more flash digital signals; and
the two or more flash digital signals are blended to generated a blended flash digital signal with a blended flash light sensitivity; and
the blended flash digital signal is blended with the blended ambient digital signal.

5. The apparatus of claim 1, wherein the apparatus is operable such that the flash analog signal is amplified utilizing the another two or more gains to generate a first amplified flash analog signal and a second amplified flash analog signal.

6. The apparatus of claim 5, wherein the apparatus is operable such that the first amplified flash analog signal is converted to a first flash digital signal with a first light sensitivity, and the second amplified flash analog signal is converted to a second flash digital signal with a second light sensitivity.

7. The apparatus of claim 6, wherein the apparatus is operable such that the first flash digital signal is blended with the second flash digital signal, in response to user input.

8. The apparatus of claim 7, wherein the apparatus is operable such that sliding indicia is displayed and the user input includes manipulation of the sliding indicia.

9. The apparatus of claim 6, wherein the apparatus is operable such that:
the first flash digital signal is blended with the second flash digital signal, resulting in a blended flash digital signal with a blended flash light sensitivity, and
the blended ambient digital signal is blended with the blended flash digital signal.

10. The apparatus of claim 9, wherein the two or more gains comprises same gains as the other two or more gains, and each gain of the two or more gains and the other two or more gains is associated with a different light sensitivity value.

11. An apparatus, comprising:
circuitry for:
storing an ambient sample based on an electrical signal from a photodiode of an image sensor, wherein the electrical signal includes a photodiode current received from the photodiode of the image sensor;
storing a flash sample based on the electrical signal from the photodiode of the image sensor;
outputting a first value based on the ambient sample, and a second value based on the flash sample, for generating at least one image, wherein the first value is output in an ambient analog signal, and the second value is output in a flash analog signal; and
amplifying at least one of the first value and the second value utilizing two or more gains, wherein the amplification of the at least one of the first value and the second value utilizing the two or more gains includes amplifying at least one of the ambient analog signal and flash analog signal utilizing the two or more gains;
wherein the apparatus is operable such that the ambient analog signal is amplified utilizing the two or more gains to generate a first amplified ambient analog signal and a second amplified ambient analog signal;
wherein the apparatus is operable such that the first amplified ambient analog signal is converted to a first ambient digital signal with a first light sensitivity, and the second amplified ambient analog signal is converted to a second ambient digital signal with a second light sensitivity;
wherein the apparatus is operable such that:
the first ambient digital signal and the second ambient digital signal are transferred over a network for being combined remotely, resulting in at least a portion of a high dynamic range (HDR) image;
the flash analog signal is amplified utilizing at least one gain to generate at least one amplified flash analog signal;
the at least one amplified flash analog signal is converted to at least one flash digital signal; and
the remotely combined ambient digital signal is blended with the at least one flash digital signal, in response to user input.

12. A computer program product embodied on a non-transitory computer readable medium, comprising:
code for storing an ambient sample based on an electrical signal from a photodiode of an image sensor, wherein the electrical signal includes a photodiode current received from the photodiode of the image sensor;

code for storing a flash sample based on the electrical signal from the photodiode of the image sensor, and code for outputting a first value based on the ambient sample, and a second value based on the flash sample, for generating at least one image, wherein the first value is output in an ambient analog signal, and the second value is output in a flash analog signal;

code for amplifying at least one of the first value and the second value utilizing two or more gains, wherein the amplification of the at least one of the first value and the second value utilizing the two or more gains includes amplifying at least one of the ambient analog signal and the flash analog signal utilizing the two or more gains;

wherein the computer program product is operable such that the ambient analog signal is amplified utilizing the two or more gains to generate a first amplified ambient analog signal and a second amplified ambient analog signal;

wherein the computer program product is operable such that the first amplified ambient analog signal is converted to a first ambient digital signal with a first light sensitivity, and the second amplified ambient analog signal is converted to a second ambient digital signal with a second light sensitivity;

wherein the computer program product is operable such that:
the first ambient digital signal is blended with the second ambient digital signal, resulting in a blended ambient digital signal with a blended ambient light sensitivity;
the flash analog signal is amplified utilizing at least one gain to generate at least one amplified flash analog signal;
the at least one amplified flash analog signal is converted to at least one flash digital signal; and
the blended ambient digital signal is blended with the at least one flash digital signal, in response to user input.

13. A method, comprising:

storing an ambient sample based on an electrical signal from a photodiode of an image sensor, wherein the electrical signal includes a photodiode current received from the photodiode of the image sensor;

storing a flash sample based on the electrical signal from the photodiode of the image sensor;

outputting a first value based on the ambient sample, and a second value based on the flash sample, for generating at least one image, wherein the first value is output in an ambient analog signal, and the second value is output in a flash analog signal; and amplifying at least one of the first value and the second value utilizing two or more gains, wherein the amplification of the at least one of the first value and the second value utilizing the two or more gains includes amplifying at least one of the ambient analog signal and the flash analog signal utilizing the two or more gains;

wherein the ambient analog signal is amplified utilizing the two or more gains to generate a first amplified ambient analog signal and a second amplified ambient analog signal;

wherein the first amplified ambient analog signal is converted to a first ambient digital signal with a first light sensitivity, and the second amplified ambient analog signal is converted to a second ambient digital signal with a second light sensitivity;

wherein:
the first ambient digital signal is blended with the second ambient digital signal, resulting in a blended ambient digital signal with a blended ambient light sensitivity;
the flash analog signal is amplified utilizing at least one gain to generate at least one amplified flash analog signal;
the at least one amplified flash analog signal is converted to at least one flash digital signal; and
the blended ambient digital signal is blended with the at least one flash digital signal, in response to user input.

14. The apparatus of claim 1, wherein the apparatus is operable such that the blended ambient digital signal with a blended ambient light sensitivity is a HDR image.

* * * * *